United States Patent
Yasukawa

(10) Patent No.: US 6,818,921 B2
(45) Date of Patent: Nov. 16, 2004

(54) SOI SUBSTRATE, ELEMENT SUBSTRATE, SEMICONDUCTOR DEVICE, ELECTRO-OPTICAL APPARATUS AND ELECTRONIC EQUIPMENT

(75) Inventor: Masahiro Yasukawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/431,401

(22) Filed: May 8, 2003

(65) Prior Publication Data

US 2003/0201508 A1 Oct. 30, 2003

Related U.S. Application Data

(62) Division of application No. 09/988,332, filed on Nov. 19, 2001, now Pat. No. 6,583,440.

(30) Foreign Application Priority Data

| Nov. 30, 2000 | (JP) | ......................................... 2000-365714 |
| Jun. 22, 2001 | (JP) | ......................................... 2001-190521 |
| Sep. 25, 2001 | (JP) | ......................................... 2001-292645 |

(51) Int. Cl.[7] .......................................... H01L 31/036
(52) U.S. Cl. .......................... 257/59; 257/347; 257/353
(58) Field of Search .......................... 257/59, 347, 353

(56) References Cited

U.S. PATENT DOCUMENTS

| 5,567,967 A | 10/1996 | Kusumoto |
| 5,572,045 A | 11/1996 | Takahashi et al. |
| 5,854,494 A | 12/1998 | Yamazaki et al. |
| 5,905,553 A * | 5/1999 | Matsukawa et al. ........ 349/110 |
| 6,025,218 A * | 2/2000 | Brotherton ................... 438/166 |
| 6,326,642 B1 | 12/2001 | Yamazaki et al. |
| 6,614,479 B1 * | 9/2003 | Fukusho et al. ............ 348/340 |

* cited by examiner

Primary Examiner—Allan R. Wilson
(74) Attorney, Agent, or Firm—Oliff & Berridge, PLC

(57) ABSTRACT

An SOI (Silicon On Insulator) substrate is provided with: a support substrate (201); a single crystal silicon layer (202) disposed above one surface of the support substrate; an insulation portion (205) disposed between the support substrate and the single crystal silicon layer, the insulation portion comprising a single layer of an insulation film or a lamination structure of a plurality of insulation films, and including a silicon nitride film or a silicon nitride oxide film (204).

10 Claims, 24 Drawing Sheets

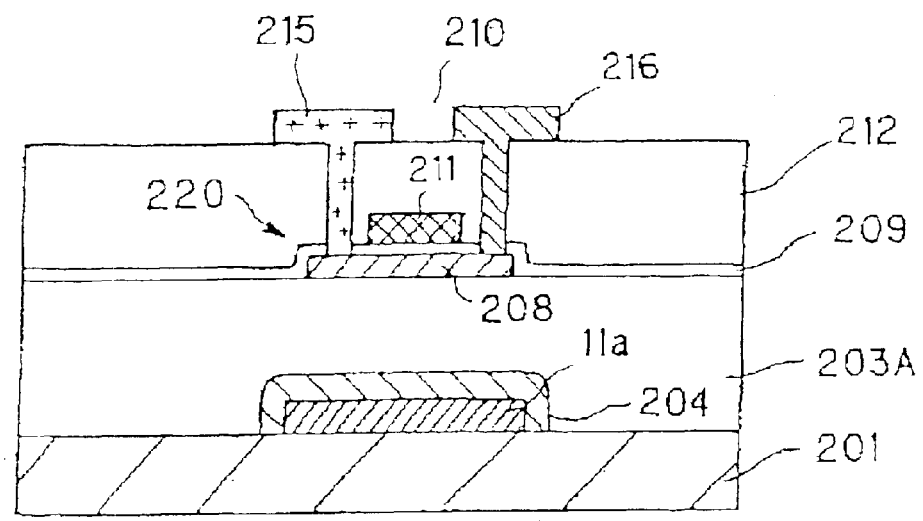
FIG. 20(a)
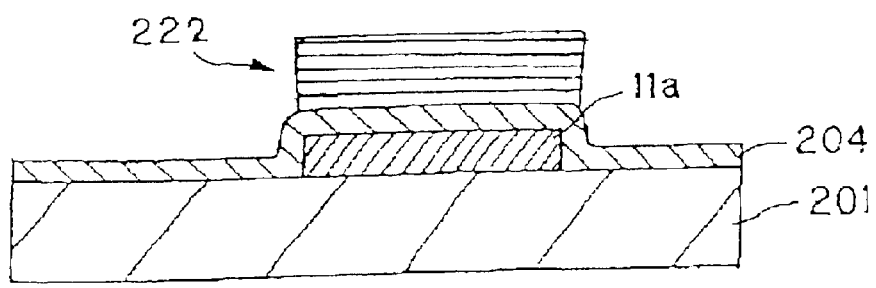
FIG. 20(b)

FIG. 28 (a) (PRIOR ART)
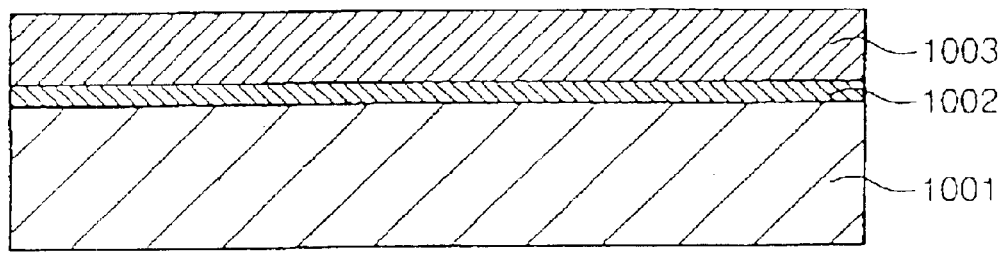
FIG. 28 (b) (PRIOR ART)
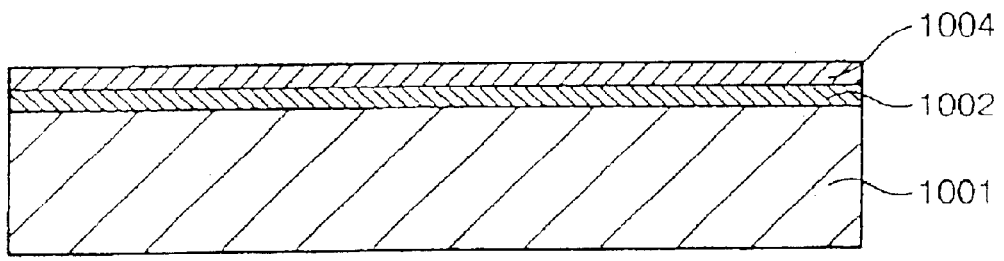

SOI SUBSTRATE, ELEMENT SUBSTRATE, SEMICONDUCTOR DEVICE, ELECTRO-OPTICAL APPARATUS AND ELECTRONIC EQUIPMENT

This is a Division of application Ser. No. 09/988,332 filed Nov. 19, 2001 now U.S. Pat. No. 6,583,440. The entire disclosure of the prior application is hereby incorporated by reference herein in its entirety.

BACKGROUND OF THE INVENTION

1. Field of the Invention

The present invention relates to an SOI (Silicon On Insulator) substrate having a single crystal silicon layer on one surface of a support substrate, an element substrate having the SOI substrate, a semiconductor device having the SOI substrate, an electro-optical apparatus having the element substrate, an electronic equipment, a method of manufacturing the SOI substrate, a method of manufacturing the element substrate, and a method of manufacturing the electro-optical apparatus.

2. Description of the Related Art

At first, a semiconductor technique for forming a single crystal silicon thin film on an insulation substrate and, by using the single crystal silicon thin film, forming a semiconductor device is referred to as an "SOI technique". This technique is widely used since it has the merits of a higher speed of an element, a lower consumptive electric power, a higher integration and the like.

As one of the SOI techniques, there is a technique for manufacturing the SOI substrate by laminating the single crystal silicon substrate. The method of manufacturing the SOI substrate and the structure thereof are briefly explained here with reference to FIG. 28(a) and FIG. 28(b).

At first, as shown in FIG. 28(a), a single crystal silicon substrate 1003, whose surface is oxidized to be a silicon oxide film 1002 at a lamination side thereof, is laminated on a surface of a support substrate 1001 by using a hydrogen coupling force. Then, their lamination strength is increased by a heat treatment. After that, as shown in FIG. 28(b), the thickness of the single crystal silicon substrate 1003 is reduced by grinding, polishing, etching or the like to thereby form a single crystal silicon layer 1004. Accordingly, the SOI substrate is manufactured in which the silicon oxide film 1002 and the single crystal silicon thin film 1004 are laminated in this order on the surface of the support substrate 1001.

According to the above-mentioned method of manufacturing the SOI substrate, the single crystal silicon thin film 1004 that is excellent in the crystal property can be formed as the thickness of the single crystal silicon substrate 1003 is reduced. Thus, it is possible to produce a device having a high performance.

The SOI substrate manufactured by such a laminating method is used to produce various devices, similarly to a bulk semiconductor substrate (i.e., a semiconductor integrated circuit). However, as the feature different from the bulk substrate, the SOI substrate has a feature that the substrate made of various materials can be used as the support substrate.

That is, the typical silicon substrate can be naturally used as the support substrate. Moreover, it is possible to use a transparent quartz substrate (having an optically transparent property), a glass substrate or the like. For this reason, for example, by forming the single crystal silicon thin film on the substrate having the optically transparent property, a transistor element, such as MOSFET or the like for driving a liquid crystal of a high performance can be formed by using the single crystal silicon thin film which is excellent in the crystal property, even in an apparatus requiring the optically transparent property, for example, a transparent type of a liquid crystal display device.

However, if the SOI substrate is manufactured by using the quartz substrate or the glass substrate as the support substrate, and the transistor element is formed on the surface thereof, impurities contained in the support substrate may be permeated through the silicon oxide film and diffused into the side of the transistor element. This results in the fear of the deterioration in the element property.

Also, there may be a case that the impurities such as $Na^+$, $K^+$, $Cl^-$ and the like are absorbed from the atmosphere onto the lamination plane, when the support substrate and the single crystal silicon substrate are laminated together in the process for manufacturing the SOI substrate, irrespectively of the kind of the support substrate. In this case, in the manufactured SOI substrate, the above-mentioned impurities are sandwiched between the support substrate and the silicon oxide film.

If the SOI substrate having the above-mentioned structure is used to form the transistor element on the surface, the impurities sandwiched between the support substrate and the silicon oxide film are permeated through the silicon oxide film and diffused into the transistor element side. This results in the fear of the deterioration in the element property.

When the support substrate and the single crystal silicon substrate are laminated together, a dust-proof filter or the like may be used in order to prevent the atmospheric impurities from being absorbed onto the support substrate. Actually, even if the dust-proof filter is used, it is difficult or impossible to perfectly prevent the atmospheric impurities from being absorbed onto the lamination surface.

Secondly, for example, in a case of an electro-optical apparatus of a TFT active matrix driving type, if an input light is irradiated onto a channel region of a thin film transistor (hereafter, which is referred to as a TFT (Thin Film Transistor) as the occasion demands) for a pixel switching operation, which is disposed at each pixel, an optical excitation causes an optical leak current to be generated, which changes the TFT property. In particular, in a case of an electro-optical apparatus for a light valve in a projector, since the strength of the input light is high, it is important to perform a light shield for the input light with respect to the channel region of the TFT as well as the peripheral region thereof. So, the light shield is performed with respect to the channel region as well as the peripheral region thereof by using a light shield film, which is originally designed to define an open region of each pixel and is disposed on an opposite substrate, and/or by using a data line, which is passed over the TFT on the TFT array substrate and is made of a metallic film such as Al (Aluminum) or the like.

In particular, there may be a case that the light shield film made of, for example, metal of high melting point is disposed even at a lower side of the TFT on the TFT array substrate. By disposing the light shield film at the lower side of the TFT in this manner, it is possible to prevent (i) a rear reflection light from the side of the TFT array substrate and (ii) a return light, such as a projection light which has passed through a prism or the like from another electro-optical apparatus in case of combining a plurality of electro-optical apparatuses through prisms and the like to thereby configure one optical system, from being inputted to the TFT of the electro-optical apparatus.

However, according to the research of the inventor of this application, the light shield film, which is formed at the lower side of the TFT and is made of the metal of the high melting point and the like, exhibits the tendency of the increase in aging oxidation during the manufacture of a product or the usage after the completion of the product. Then, if such oxidation is increased in the light shield film, it is confirmed that a light transmission rate is increased depending on the degree of the oxidation. This results in a problem that the increase in the oxidation causes the original function of the light shield film to be not sufficiently provided. For example, if a normal pressure oxidation at an oxygen content of 15% and a water content of 85% is performed with respect to the TFT array substrate in which the light shield film made of such high melting point metal is formed at the lower side of the TFT, the example is confirmed in which the light shield film having a film thickness of about 200 nm is perfectly oxidized even if it is covered by the protective insulation film made of silicon oxide film having a film thickness of about 800 nm.

Moreover, according to the research of the inventor of this application, the above-mentioned arrangement of the light shield film made of the high melting point metal and the like at the lower side of the channel region of the semiconductor layer constituting the TFT results in a problem of the contamination caused by the light shield film in this semiconductor layer (e.g., the contamination caused by the diffusion of the impurities and the like). That is, as compared with the case in which such a light shield film is not disposed, the example of the increase in the impurities permeated into the semiconductor layer is also confirmed, which results in a problem of the deterioration in the transistor property of the TFT.

SUMMARY OF THE INVENTION

The present invention is proposed in view of the above-mentioned circumstances. Firstly, it is therefore an object of the present invention to provide an SOI substrate, which can almost perfectly prevent impurities contained in a support substrate or impurities absorbed on a lamination plane between the support substrate and a single crystal silicon substrate from being diffused into a side of a single crystal silicon layer, and a method of manufacturing the same.

Another object of the present invention is to provide an element substrate and a semiconductor device, which can almost perfectly prevent impurities contained in a support substrate or impurities absorbed on a lamination plane between the support substrate and a single crystal silicon substrate from have an influence on a transistor element, and a method of manufacturing the same.

Still another object of the present invention is to provide an electro-optical apparatus and an electronic equipment each provided with this element substrate, which can prevent a deterioration in a property of a transistor element.

Secondly, it is therefore an object of the present invention to provide: an electro-optical apparatus, in which a light shield film is used to make a light-proof property excellent, and it is possible to reduce a drop in a light shield performance cause by an oxidization of this light shield film, and it is possible to suppress a bad influence on a semiconductor layer or the like that results from a contamination of this light shield film, and it is possible to exhibit a bright picture display at a high quality; a method of manufacturing the same; and an electronic equipment having the electro-optical apparatus.

At first, the inventor carried out the various considerations in order to solve the above-mentioned problems. As a result, it is found out that the impurities contained in the support substrate and the impurities absorbed on the lamination plane between the support substrate and the single crystal silicon substrate are not permeated through the silicon nitride film or silicon nitride oxide film, and the present invention is completed by noticing this fact.

The above object of the present invention can be achieved by an SOI substrate provided with: a support substrate; a single crystal silicon layer disposed above one surface of the support substrate; an insulation portion disposed between the support substrate and the single crystal silicon layer, the insulation portion comprising a single layer of an insulation film or a lamination structure of a plurality of insulation films, and including a silicon nitride film or a silicon nitride oxide film.

According to the SOI substrate of the present invention, by employing such a structure that the insulation portion including the silicon nitride film or silicon nitride oxide film is disposed between the support substrate and the single crystal silicon substrate, the impurities contained in the support substrate cannot be permeated through this the silicon nitride film or silicon nitride oxide film. Therefore, it is possible to almost perfectly prevent the impurities contained in the support substrate from being diffused toward the single crystal silicon layer.

In one aspect of the SOI substrate of the present invention, the insulation portion comprises the lamination structure including (i) the silicon nitride film or silicon nitride oxide film and (ii) a silicon oxide film formed on a top surface or a bottom surface of the silicon nitride film or silicon nitride oxide film.

According to this aspect, by virtue of the lamination structure including (i) the silicon nitride film or silicon nitride oxide film and (ii) the silicon oxide film, it is possible to almost perfectly prevent the impurities contained in the support substrate from being diffused toward the single crystal silicon layer.

In another aspect of the SOI substrate of the present invention, the support substrate has an optically transparent property.

According to this aspect, by constituting the support substrate from a light transparent substrate such as a quartz substrate, a glass substrate or the like, it is possible to apply the SOI substrate of the present invention to a device for transmitting a light such as a liquid crystal device of a transparent type.

In another aspect of the SOI substrate of the present invention, a film thickness of the silicon nitride film or silicon nitride oxide film is 100 nm or less.

According to this aspect, it is possible to prevent the light transmission rate from being dropped due to the existence of the silicon nitride film or silicon nitride oxide film.

The above object of the present invention can be also achieved by an element substrate including a transistor element and the above described SOI substrate of the present invention, the transistor element including a semiconductor layer comprising the single crystal silicon layer.

According to the element substrate of the present invention, since it is possible to almost perfectly prevent the impurities contained in the support substrate and the impurities absorbed on the lamination plane between the support substrate and the single crystal silicon substrate from being diffused toward the single crystal silicon layer. Therefore, it is possible to prevent the performance of the transistor element form being degraded.

The above object of the present invention can be also achieved by a first electro-optical apparatus provided with (A) the above described element substrate of the present invention, (B) another substrate opposed to a plane, on which the transistor element is formed, of the element substrate, and (C) an electro-optical material layer disposed between the element substrate and the another substrate.

According to the first electro-optical apparatus of the present invention, since it is provided with the above described element substrate of the present invention, it is possible to prevent the property of the transistor element from being deteriorated, and the performance thereof can be improved.

In one aspect of the first electro-optical apparatus of the present invention, a light shield film is formed on a bottom surface of the silicon nitride film or silicon nitride oxide film through an insulation film comprising a silicon oxide film.

According to this aspect, it is possible to effectively prevent the diffusion of the impurities toward the transistor element from the light shield film, which is disposed to reduce the light leak current in the transistor element, by virtue of the silicon nitride film or silicon nitride oxide film and the silicon oxide film.

The above object of the present invention can be also achieved by a first electronic equipment having the above described electro-optical apparatus of the present invention.

According to the first electronic equipment of the present invention, since it is provided with the above mentioned first electro-optical apparatus of the present invention, it is possible to prevent the property of the transistor element from being deteriorated, and the performance thereof can be improved.

The above object of the present invention can be also achieved by a first method of manufacturing an SOI substrate, provided with the processes of: forming a silicon nitride film or silicon nitride oxide film on a surface of either one of a single crystal silicon substrate and a support substrate; forming a silicon oxide film on a surface of the formed silicon nitride film or silicon nitride oxide film; laminating the single crystal silicon substrate and the support substrate onto each other by using a surface of the silicon oxide film as a lamination plane; and reducing a film thickness of the single crystal silicon substrate laminated on the support substrate.

According to the first method of manufacturing the SOI substrate, it is possible to manufacture the above described SOI substrate of the present invention. In particular, it is possible to form the silicon nitride film or silicon nitride oxide film on the surface of either one of the single crystal silicon substrate and the support substrate, and it is further possible, after forming the silicon oxide film on the surface thereof, by laminating the single crystal silicon substrate and the support substrate with the surface of the silicon oxide film as the lamination plane, to improve the laminating or bonding property between the single crystal silicon substrate and the support substrate. Therefore, the lamination or bonding strength between the support substrate and the single crystal silicon substrate becomes high and the reliability thereof can be improved. Further, the impurities contained in the support substrate and the impurities absorbed on the lamination plane between the support substrate and the single crystal silicon substrate can be prevented from being diffused toward the single crystal silicon layer.

In addition, in the first method of manufacturing the SOI substrate, it is desirable to form the silicon nitride film or silicon nitride oxide film on the surface of the single crystal silicon substrate. By manufacturing in this manner, since it is possible to position the silicon nitride film or silicon nitride oxide film at a side closer to the single crystal silicon layer than the lamination plane between the support substrate and the single crystal silicon substrate after the lamination, it is possible to prevent not only the impurities contained in the support substrate but also the impurities absorbed on the lamination plane from being diffused toward the single crystal silicon layer.

The above object of the present invention can be also achieved by a second method of manufacturing an SOI substrate, provided with the processes of: forming a silicon oxide film on a surface of a single crystal silicon substrate; forming a silicon nitride film or silicon nitride oxide film below the silicon oxide film at a side thereof facing to the single crystal silicon substrate; laminating the single crystal silicon substrate and a support substrate onto each other by using a surface of the silicon oxide film as a lamination plane; and reducing a film thickness of the single crystal silicon substrate laminated on the support substrate.

According to the second method of manufacturing the SOI substrate, it is possible to manufacture the above described SOI substrate of the present invention. In particular, after forming the oxide film on the single crystal silicon substrate, by forming the silicon nitride film or silicon nitride oxide film on the surface of the single crystal silicon substrate through this oxide film, and then by laminating the single crystal silicon substrate and the support substrate with the surface of the silicon oxide film as the lamination plane, it is possible to improve the lamination or bonding property between the single crystal silicon substrate and the support substrate. Therefore, the lamination or bonding strength between the support substrate and the single crystal silicon substrate can be improved, and the reliability thereof can be improved. Further, it is possible to prevent the impurities included in the support substrate and the impurities absorbed on the lamination plane between the support substrate and the single crystal silicon substrate from being diffused toward the single crystal silicon layer.

In addition, in the second method of manufacturing the SOI substrate, because the silicon nitride film or silicon nitride oxide film is formed on the surface of the single crystal silicon substrate, since it is possible to position the silicon nitride film or silicon nitride oxide film at a side closer to the single crystal silicon layer than the lamination plane between the support substrate and the single crystal silicon substrate after the lamination, it is possible to prevent not only the impurities contained in the support substrate but also the impurities absorbed on the lamination plane from being diffused toward the single crystal silicon layer.

In one aspect of the second method of the present invention, in the process of forming the silicon oxide film, the oxide silicon film is formed by thermally oxidizing the surface of the single crystal silicon substrate, and in the process of forming the silicon nitride film or silicon nitride oxide film, the silicon nitride film or silicon nitride oxide film is formed between the silicon oxide film and the single crystal silicon substrate by nitriding or oxynitriding the surface of the single crystal silicon substrate formed with the silicon oxide film under dinitrogen monoxide or nitric monoxide atmosphere.

According to this aspect, although the silicon nitride film or silicon nitride oxide film and the silicon oxide film may be formed by using the CVD method on the surface of the single crystal silicon substrate or the support substrate, the manufacturing processes can be simplified by using the thermal oxidizing method on the surface of the single crystal silicon substrate. Further, the silicon nitride film or silicon nitride oxide film and the silicon oxide film having the uniform thickness and being smoothed can be formed. Furthermore, it is possible to improve the adherence between the single crystal silicon substrate and the silicon nitride film or silicon nitride oxide film.

The above object of the present invention can be also achieved by a third method of manufacturing an SOI substrate, provided with the processes of: forming a first silicon oxide film on a surface of either one of a single crystal silicon substrate and a support substrate; forming a silicon nitride film or silicon nitride oxide film on a surface of the first silicon oxide film; forming a second silicon oxide film on a surface of the silicon nitride film or silicon nitride oxide film; laminating the single crystal silicon substrate and the support substrate onto each other by using a surface of the second silicon oxide film as a lamination plane; and reducing a film thickness of the single crystal silicon substrate laminated on the support substrate.

According to the third method of manufacturing the SOI substrate, it is possible to manufacture the above described SOI substrate of the present invention. In particular, the first silicon oxide film, the silicon nitride film or silicon nitride oxide film and the second silicon oxide film are sequentially formed on the surface of either one of the single crystal silicon substrate and the support substrate, and then the single crystal silicon substrate and the support substrate are laminated onto each other with the surface of the second silicon oxide film as the lamination plane, to thereby improve the adherence between the single crystal silicon substrate and the support substrate. Therefore, the lamination or bonding strength between the support substrate and the single crystal silicon substrate becomes high and the reliability thereof can be improved. Further, the impurities contained in the support substrate and the impurities absorbed on the lamination plane between the support substrate and the single crystal silicon substrate can be prevented from being diffused toward the single crystal silicon layer.

In addition, in the third method of manufacturing the SOI substrate, it is desirable to form the silicon nitride film or silicon nitride oxide film on the surface of the single crystal silicon substrate. By manufacturing in this manner, since it is possible to position the silicon nitride film or silicon nitride oxide film at a side closer to the single crystal silicon layer than the lamination plane between the support substrate and the single crystal silicon substrate after the lamination, it is possible to prevent not only the impurities contained in the support substrate but also the impurities absorbed on the lamination plane from being diffused toward the single crystal silicon layer.

The above object of the present invention can be also achieved by a forth method of manufacturing an SOI substrate, provided with the processes of: forming a first silicon oxide film on a surface of a single crystal silicon substrate; forming a silicon nitride film or silicon nitride oxide film below the first silicon oxide film at a side thereof facing to the single crystal silicon substrate; forming a second silicon oxide film below the silicon nitride film or silicon nitride oxide film at a side thereof facing to the single crystal silicon substrate; laminating the single crystal silicon substrate and a support substrate onto each other by using a surface of the first silicon oxide film as a lamination plane; and reducing a film thickness of the single crystal silicon substrate laminated on the support substrate.

According to the forth method of manufacturing the SOI substrate, it is possible to manufacture the above described SOI substrate of the present invention. In particular, after forming the first oxide film on the surface of the single crystal silicon substrate, by forming the silicon nitride film or silicon nitride oxide film on the surface of the single crystal silicon substrate through this first oxide film, by forming the second silicon oxide film through this, and then by laminating the single crystal silicon substrate and the support substrate with the surface of the first silicon oxide film as the lamination plane, it is possible to improve the lamination or bonding property between the single crystal silicon substrate and the support substrate. Therefore, the lamination or bonding strength between the support substrate and the single crystal silicon substrate can be improved, and the reliability thereof can be improved. Further, it is possible to prevent the impurities included in the support substrate and the impurities absorbed on the lamination plane between the support substrate and the single crystal silicon substrate from being diffused toward the single crystal silicon layer.

In addition, in the forth method of manufacturing the SOI substrate, because the silicon nitride film or silicon nitride oxide film is formed on the surface of the single crystal silicon substrate, since it is possible to position the silicon nitride film or silicon nitride oxide film at a side closer to the single crystal silicon layer than the lamination plane between the support substrate and the single crystal silicon substrate after the lamination, it is possible to prevent not only the impurities contained in the support substrate but also the impurities absorbed on the lamination plane from being diffused toward the single crystal silicon layer.

In one aspect of the forth method of the present invention, in the process of forming the first silicon oxide film, the first oxide silicon film is formed by thermally oxidizing the surface of the single crystal silicon substrate, in the process of forming the silicon nitride film or silicon nitride oxide film, the silicon nitride film or silicon nitride oxide film is formed by nitriding or oxynitriding the surface of the single crystal silicon substrate formed with the first silicon oxide film under dinitrogen monoxide or nitric monoxide atmosphere, and in the process of forming the second silicon oxide film, the second oxide silicon film is formed by thermally oxidizing the surface of the single crystal silicon substrate formed with the silicon nitride film or silicon nitride oxide film.

According to this aspect, the manufacturing processes can be simplified, and also the silicon nitride film or silicon nitride oxide film and the silicon oxide film having the uniform thickness and being smoothed can be formed. Furthermore, it is possible to improve the adherence between the single crystal silicon substrate and the silicon nitride film or silicon nitride oxide film.

In another aspect of the second method of the present invention, the method is further provided with the processes of: forming a light shield film on a surface of the support substrate; forming a second silicon oxide film on the surface of the support substrate including the light shield film; and smoothing a surface of the second silicon oxide film.

According to this aspect, it is possible to manufacture the above described SOI substrate of the present invention in its aspect that the light shield film is disposed.

In another aspect of the forth method of the present invention, the method is further provided with the processes of: forming a light shield film on a surface of the support substrate; forming a third silicon oxide film on the surface of the support substrate including the light shield film; and smoothing a surface of the third silicon oxide film.

According to this aspect, by smoothing the surface of the third silicon oxide film, it is possible to prevent the voids from being generated at the lamination plane between the support substrate and the single crystal silicon substrate. Accordingly, it is possible to improve the lamination strength. Further, since the silicon nitride film or silicon nitride oxide film has an effect to releases the stress at the lamination, it is possible to prevent the stripping off of the film or the like from being generated in case of forming the transistor element by using the SOI substrate, to thereby improve the yield of the product.

The above object of the present invention can be also achieved by a method of manufacturing an element substrate provided with the process of forming a semiconductor layer constituting a transistor element by using the single crystal silicon layer, by using the SOI substrate manufacture by any one of the above described first to forth methods of manufacturing the SOI substrate.

According to the method of manufacturing the element substrate, it is possible to manufacture the above described element substrate of the present invention.

The above object of the present invention can be also achieved by a second electro-optical apparatus provided with: a support substrate; a pixel electrode disposed above the support substrate; a transistor element disposed above the support substrate, connected to the pixel electrode and comprising a semiconductor layer including a channel region; a wiring disposed on the support substrate and connected to the transistor element; a light shield film disposed on the support substrate for covering at least the channel region from a side of the support substrate; and an insulation portion disposed at at least one of an interlayer space between the light shield film and the semiconductor layer and an interlayer space between the support substrate and the light shield film, and including a silicon nitride film or silicon nitride oxide film.

According to the second electro-optical apparatus of the present invention, by supplying a scanning signal, a video signal or the like to the wiring, it is possible for the transistor element to switch-control the pixel electrode, to thereby execute the active matrix driving operation. During such an operation, if the aforementioned return light is inputted to the channel region of the semiconductor, layer constituting the transistor element, the transistor characteristic is changed due to the generation of the light leak current. In fact, according to the present invention, since the light shield film is disposed at the bottom side of the channel region at least in the image display region or the light input region of the semiconductor layer (i.e., the region where the input light related to the image display is reflected or transmitted, other than the peripheral region or the like on the support substrate), it is possible to effectively prevent the generation of the light leak current due to the return light.

Further, according to the present invention, the insulation portion is disposed at at least one of the interlayer space between the light shield film and the semiconductor layer and the interlayer space between the support substrate and the light shield film, which includes the silicon nitride film or silicon nitride oxide film. This silicon nitride film or silicon nitride oxide film can be formed as a dense or compact film, as compared with the silicon oxide film which is the typical example of the inter-layer insulation film formed in the lamination structure on the support substrate and other various insulation films, various conductive films, various semiconductor films and so forth constituting the lamination structure on the support substrate. Thus, it is possible to drastically decrease the transmission rate of the oxidizers such as oxygen, moisture and the like. Namely, since the oxidizers such as oxygen, moisture and the like can hardly pass through the dense silicon nitride film or silicon nitride oxide film, it can hardly reach the light shield film. Accordingly, even if the oxidizers such as oxygen, moisture and the like enter during the operation or the production of the second electro-optical apparatus, from the boundary face in the lamination structure which is constructed on the support substrate, or from the side of the surface on which the transistor element or the like is formed on the support substrate, or even if the oxidizers are taken into various conductive films, various insulation films, various semiconductor films and so forth formed on the support substrate, during the production thereof, it is possible to reduce the amount of the oxidizers, which are reachable to the light shield film during the operation or the production of the second electro-optical apparatus, among the total oxidizers, by virtue of the dense silicon nitride film or silicon nitride oxide film. Thus, during the operation or the production of the second electro-optical apparatus, it is possible to effectively prevent the light shield film from being oxidized. Therefore, it is possible to prevent the increase in the light transmission rate of the light shield film caused by the oxidization thereof, namely, it is possible to effectively prevent the drop in the light shield function thereof. Consequently, it is possible to maintain the high performance of the transistor element.

Especially, in case of employing such a structure that the insulation portion including the dense silicon nitride film or silicon nitride oxide film is disposed between the light shield film and the semiconductor layer, it is also possible to effectively avoid the contamination that the impurities are diffused into the semiconductor layer from the light shield film comprising the high melting point, or the like. Namely, the impurities from the light shield film can hardly pass through the dense silicon nitride film or silicon nitride oxide film of the insulation portion, they can hardly reach the semiconductor layer. Therefore, it is possible to avoid the degradation in the performance of the transistor element due to the contamination of the semiconductor layer from the light shield layer.

As a result, according to the second electro-optical apparatus of the present invention, finally, it is possible to perform a high quality image display for a long period of time.

In addition, in case of constituting the second electro-optical apparatus as the light transparent type, a light transparent substrate may be used as the support substrate.

In one aspect of the second electro-optical apparatus of the present invention, the insulation portion has a multiple-layered structure.

According to this aspect, as the insulation portion including the dense silicon nitride film or silicon nitride oxide film is formed to have the multiple-layered structure, the capability of shielding the oxidizers such as oxygen, moisture and the like at the insulation portion can be improved. Therefore, it is possible to more effectively avoid the oxidizing of the light shield film and the contamination due to the light shield film.

In this aspect, the multiple-layered structure may include: the silicon nitride film or silicon nitride oxide film; and a silicon oxide film formed on an upper surface or bottom surface of the silicon nitride film or silicon nitride oxide film.

By constructing in this manner, it is possible to even more improve the capability of shielding the oxidizers at the insulation portion by virtue of the lamination structure of the silicon nitride film or silicon nitride oxide film and the silicon oxide film formed on this. Further, for example, it is possible to employ a lamination structure by using three or more films, e.g., such a lamination structure that two of the silicon nitride film or silicon nitride oxide film sandwich the silicon oxide film, such a lamination structure that two silicon oxide films sandwich the silicon nitride film or silicon nitride oxide film, and so on.

Incidentally, it is possible to employ a single layer structure, e.g. such a structure that the insulation portion consists of only the silicon nitride film or only the silicon nitride oxide.

In another aspect of the second electro-optical apparatus of the present invention, the insulation portion is adhered to the light shield film.

According to this aspect, since the insulation portion including the dense silicon nitride film or silicon nitride oxide film is adhered to the upper surface, the bottom surface, the both surfaces, the end, or the edge of the light shield film, it is possible to reduce the possibility that the oxidizers such as oxygen, moisture and the like included in the other inter-layer insulation films etc., reach the light shield film.

In another aspect of the second electro-optical apparatus of the present invention, the insulation portion is opposed to the light shield film through an inter-layer insulation film.

According to this aspect, the insulation portion including the dense silicon nitride film or silicon nitride oxide film is opposed to the light shield film through the inter-layer insulation film such as a silicon oxide film or the like, it is possible to shield the oxidizers in some degrees at a position apart from the light shield film.

In another aspect of the second electro-optical apparatus of the present invention, the light shield film has a plane pattern in a predetermined shape, and the insulation portion has a plane pattern in such a shape that the insulation portion completely covers the light shield film and an edge of the insulation portion is apart from an edge of the light shield film.

According to this aspect, it is possible to shield the light for at least the channel region of the semiconductor layer from the bottom side thereof, by the light shield layer having the plane pattern in the predetermined shape such as a lattice or grid like shape, a stripe shape, an island-like shape or the like. The insulation portion has the plane pattern in the shape for completely covering the light shield film such as a lattice or grid like shape, a stripe shape, an island-like shape or the like, which is slightly or by one round larger than the light shield film, and the edge of the insulation portion is apart from the edge of the light shield film when viewing it on the plane of the support substrate. Therefore, it is possible for the insulation portion to cover the light shield film three-dimensionally from the upper side, the bottom side or the both sides, on the support substrate, so that it is possible to further reduce the possibility that the oxidizers such as oxygen, moisture and the like reach the light shield film.

Incidentally, the insulation portion may be formed substantially all over the surface of the support substrate, regardless of the plane pattern of the light shield film. Also, even if the light shield is not completely covered, the similar effect can be obtained to some extents.

In another aspect of the second electro-optical apparatus of the present invention, the semiconductor layer has an SOI structure comprising a single crystal silicon film.

According to this aspect, by virtue of the SOI technique, it is possible to construct the transistor element such as a MOSFET for high-performance-driving, a TFT for pixel-switching or the like which is superior in the transistor characteristic such as a high speed, a low electric-power-consumption, a higher integration and the like, on the support substrate, by using the single crystal silicon film superior in the crystallization.

In another aspect of the second electro-optical apparatus of the present invention, the semiconductor comprises a poly-silicon film or amorphous silicon film.

According to this aspect, by virtue of the semiconductor layer comprising the poly-silicon film or the amorphous silicon film on the support substrate such as the glass substrate, the quartz substrate or the like, the transistor element can be manufactured at a relatively low cost.

In another aspect of the second electro-optical apparatus of the present invention, the light shield film comprises a metal of high melting point.

According to this aspect, the light shield film comprises a film including a metal of high temperature point, such as a simple substance of a metal, an alloy, a metallic silicide, a poly-silicide, a lamination body in which some of them are laminated or the like, which includes at least one of high melting point metals, for example, such as Ti (Titanium), Cr (chromium), W (Tungsten), Ta (Tantlum), Mo (Molybdenum), Pd (palladium) and the like. Accordingly, it is possible to obtain the high light-shielding capability by the light shield film.

In addition, the light shield film may comprise a silicon film, which performs light-shielding by partially absorbing the light.

In another aspect of the second electro-optical apparatus of the present invention, a total layer thickness of the silicon nitride film or silicon nitride oxide film of the insulation portion is not greater than 100 nm.

According to this aspect, since the total thickness of the silicon nitride film or silicon nitride oxide film having a light absorption property dependent on the frequency of the light is not greater than 100 nm, even if such a structure is adopted that the display light passes through the insulation portion, still it is possible to reduce the coloring of the display light due to the light absorption at the insulation portion. For example, if the display light passes through the silicon nitride film or silicon nitride oxide film whose film thickness is greater than 100 nm, it is observed that the display light becomes more or less yellowish. However, by limiting the total thickness of the silicon nitride film or silicon nitride oxide film to be not greater than 100 nm, the phenomena that the display light becomes yellowish can be certainly reduced.

In another aspect of the second electro-optical apparatus of the present invention, the second electro-optical apparatus is further provided with: an opposite substrate opposed to the support substrate; and an electro-optical material layer interposed between the support substrate and the opposite substrate.

According to this aspect, the electro-optical apparatus such as a liquid crystal device or the like, in which the electro-optical material layer e.g., a liquid crystal layer is disposed between the pair of the support substrate and the opposite substrate, can be constructed. In particular, since the apparatus is provided with the above described light shield film and the insulation portion, the excellent light shielding property can be maintained, and the high quality image display can be performed for a long period of time.

In another aspect of the second electro-optical apparatus of the present invention, an edge of the insulation portion includes an area within 2 μm from an edge of the light shield film.

According to this aspect, it is possible to reduce the possibility that the oxidizers such as oxygen, moisture and the like reach the light shield film from the edge of the insulation portion and at the same time possible to drastically reduce the decrease rate of the display light at the insulation portion.

In another aspect of the second electro-optical apparatus of the present invention, an edge of the insulation portion is self-aligned with an edge of the light shield film.

According to this aspect, it is possible to reduce the decrease rate of the display light at the insulation portion to almost its limit.

The above object of the present invention can be achieved by a second electronic equipment provided with the above described second electro-optical apparatus (including various aspects thereof).

According to the second electronic equipment of the present invention, since it is provided with the above described second electro-optical apparatus of the present invention, it is possible to realize various electronic equipments capable of performing the bright and high quality image display for a long period of time, such as a projection type display apparatus, an liquid crystal television set, a portable telephone, an electronic memo, a word processor, a view finder type or a monitor direct view type of a video tape recorder, a work station, a television telephone, a POS terminal, a touch panel, and so on.

The above object of the present invention can be also achieved by a first method of manufacturing an electro-optical apparatus provided with the processes of: forming a light shield film in a predetermined area on a support substrate; forming an insulation portion including a silicon nitride film or silicon nitride oxide film on the slight shield film directly or through an inter-layer insulation film; forming a semiconductor layer on the insulation portion directly or thorough an inter-layer insulation film; forming a transistor element, whose channel region is disposed in an area covered by the light shield film from a bottom side thereof with using the semiconductor layer as a constitutional element; and forming a wiring and a pixel electrode connected to the transistor element.

According to the first method of manufacturing the electro-optical apparatus of the present invention, at first, the light shield film is formed in the predetermined area (e.g., a grid-like shaped, stripe-shaped or island-like-shaped area) on the support substrate such as a glass substrate, a silicon substrate, a quartz substrate or the like. Here, for example, such a light shield film is formed as a light shield film is firstly formed all over one surface by sputtering a metal of high melting point and is then patterned by the photo-lithography and etching processes. Then, on this light shield film directly or through the inter-layer insulation film such as a silicon oxide film, the insulation portion including the silicon nitride film or silicon nitride oxide film is formed. Here, for example, by firstly forming the silicon oxide film and then nitriding or oxynitriding its surface under dinitrogen monoxide or nitric monoxide atmosphere, or by the CVD method, the silicon nitride film or the silicon nitride oxide film may be formed. Further on this, the semiconductor layer such as a poly-silicon film, an amorphous silicon film, a single crystal silicon film or the like is formed directly or thorough an inter-layer insulation film. Then, the transistor element such as a TFT is formed, whose channel region constituted by the semiconductor layer is disposed in the area covered by the light shield film from the bottom side thereof as the semiconductor layer, at least in the light input region or the image display region. Then, the wiring connected with this transistor element is formed from a conductive metal film or poly-silicon film or the like, while the pixel electrode is formed from the ITO (Indium Tin Oxide) film or the like. Therefore, the second electro-optical apparatus of the present invention in the aspect having at least the above described insulation portion on the upper side of the light shield film can be manufactured relatively easily In one aspect of the first method of manufacturing the electro-optical apparatus of the present invention, the method is further provided with the process of forming another insulation portion including a silicon nitride film or silicon nitride oxide film above the support substrate, before the process of forming the light shield film.

According to this aspect, before the formation of the light shield film, another insulation portion including the silicon nitride film or silicon nitride oxide film is formed on the support substrate. Thus, it is possible to relatively easily manufacture the above described second electro-optical apparatus of the present invention in the aspect having the structure that the two insulation portions sandwich the light shield film.

The above object of the present invention can be also achieved by a second method of manufacturing an electro-optical apparatus provided with the processes of: forming an insulation portion including a silicon nitride film or silicon nitride oxide film on a support substrate; forming a light shield film in a predetermined area on a support substrate directly or through an inter-layer insulation film; forming a semiconductor layer on the light shield film directly or thorough an inter-layer insulation; forming a transistor element, whose channel region is disposed in an area covered by the light shield film from a bottom side thereof with using the semiconductor layer as a constitutional element; and forming a wiring and a pixel electrode connected to the transistor element.

According to the second method of manufacturing the electro-optical apparatus of the present invention, at first, the insulation portion including the silicon nitride film or silicon nitride oxide film is formed on a support substrate such as a glass substrate, a silicon substrate, a quartz substrate or the like. Here, for example, by firstly forming the silicon oxide film and then nitriding or oxynitriding its surface under dinitrogen monoxide or nitric monoxide atmosphere, or by the CVD method, the silicon nitride film or the silicon nitride oxide film may be formed. Then, the light shield film is formed in the predetermined area (e.g., a grid-like shaped, stripe-shaped or island-like-shaped area) on this insulation portion. Here, for example, such a light shield film is formed as a light shield film is firstly formed all over one surface by sputtering a metal of high melting point and is then patterned by the photo-lithography and etching processes. Then, on this light shield film directly or through the inter-layer insulation film, the semiconductor layer such as a poly-silicon film, an amorphous silicon film, a single crystal silicon film or the like is formed directly or thorough an inter-layer insulation film. Then, the transistor element such as a TFT is formed, whose channel region constituted by the semiconductor layer is disposed in the area covered by the light shield film from the bottom side thereof as the semiconductor layer, at least in the light input region or the image display region. Then, the wiring connected with this transistor element is formed from a conductive metal film or poly-silicon film or the like, while the pixel electrode is formed from the ITO (Indium Tin Oxide) film or the like. Therefore, the second electro-optical apparatus of the present invention in the aspect having the insulation portion is disposed below the light shield film can be manufactured relatively easily In one aspect of the first or second method of manufacturing the electro-optical apparatus of the present invention, the process of forming the semiconductor layer is provided with the processes of: laminating (i) a single crystal silicon substrate on which the semiconductor layer is formed and (ii) the support substrate on which the light shield layer and the insulation portion are formed, onto each other, and reducing a film thickness of the single crystal silicon substrate after being laminated onto the support substrate.

According to this aspect, at first, the semiconductor layer is formed on the single crystal silicon substrate. Then, this single crystal silicon substrate and the support substrate, on which the light shield film and the insulation film have been already formed, are laminated onto each other. Here, for example, after the silicon oxide film is formed on the lamination plane and this lamination plane is smoothed, both of the substrates are adhered to each other by using the hydrogen coupling force, so that both of the substrates are laminated. Further, by the heating process, the lamination strength is upgraded. Successively, the thickness of the single crystal silicon substrate is reduced. Here, by leaving the semiconductor layer on the support substrate and stripping off the single crystal silicon substrate from the support substrate, the thickness of the single crystal silicon substrate may be reduced. Alternatively, the thickness of the single crystal silicon substrate may be reduced by etching, polishing, cutting or the like with respect to the single crystal silicon substrate. Therefore, the second electro-optical apparatus in the aspect having the extremely high performance transistor element with the single crystal silicon film on the SOI substrate as the semiconductor element can be relatively easily manufactured.

The above object of the present invention can be also achieved by a semiconductor device including a transistor element and the above described SOI substrate of the present invention, the transistor element including (i) a semiconductor layer comprising the single crystal silicon layer and (ii) an electrically conductive member disposed at one side of the insulation portion facing to the support substrate.

According to the semiconductor device of the present invention, it is possible to almost perfectly prevent the impurities contained in the support substrate and the impurities absorbed on the lamination plane between the support substrate and the single crystal silicon substrate from being diffused toward the transistor element, by virtue of the insulation portion. Thus, it is possible to effectively prevent the performance of the transistor element from being deteriorated. Further, it is possible to utilize the electrically conductive member formed on one side of the insulation portion facing to the support substrate, as a light shielding film, a gate electrode or gate line or the like for example, while the diffusion of the impurities from this electrically conductive member toward the transistor element can be effectively prevented by the insulation portion.

In one aspect of the semiconductor device of the present invention, one portion of the electrically conductive member functions as a gate electrode or gate line of the transistor element.

According to this aspect, such a transistor element that the gate electrode or gate line is formed on the support substrate and that, further above it, the semiconductor layer is disposed through the insulation portion, which functions as the gate insulation film, can be obtained. Incidentally, by forming the gate electrode or gate line from a light shielding film, the gate electrode or gate line may additionally have the function of the light shielding film.

The above object of the present invention can be also achieved by a third electronic equipment having the above described semiconductor device of the present invention (including various aspects thereof).

According to the third electronic equipment of the present invention, since it has the above described semiconductor device of the present invention, various electronic equipments including the high performance transistor elements can be realized.

The nature, utility, and further features of this invention will be more clearly apparent from the following detailed description with respect to preferred embodiments of the invention when read in conjunction with the accompanying drawings briefly described below.

BRIEF DESCRIPTION OF THE DRAWINGS

FIG. 20(a) to FIG. 20(b) are sectional views showing various actual examples of a structure in which a light shield film is formed at a lower side of TFT in the electro-optical apparatus of the embodiment;

FIG. 28(a) and FIG. 28(b) are process views showing a method of manufacturing an SOI substrate in a related art.

DETAILED DESCRIPTION OF THE PREFERRED EMBODIMENTS

Preferred embodiments of the present invention will be explained below with reference to the accompanying drawings. In the following embodiments, an electro-optical apparatus of the present invention is applied to a liquid crystal display device of a TFT active matrix driving type.
(SOI Substrate)

First of all, an embodiment of an SOI substrate of the present invention is described.

Figure 1:
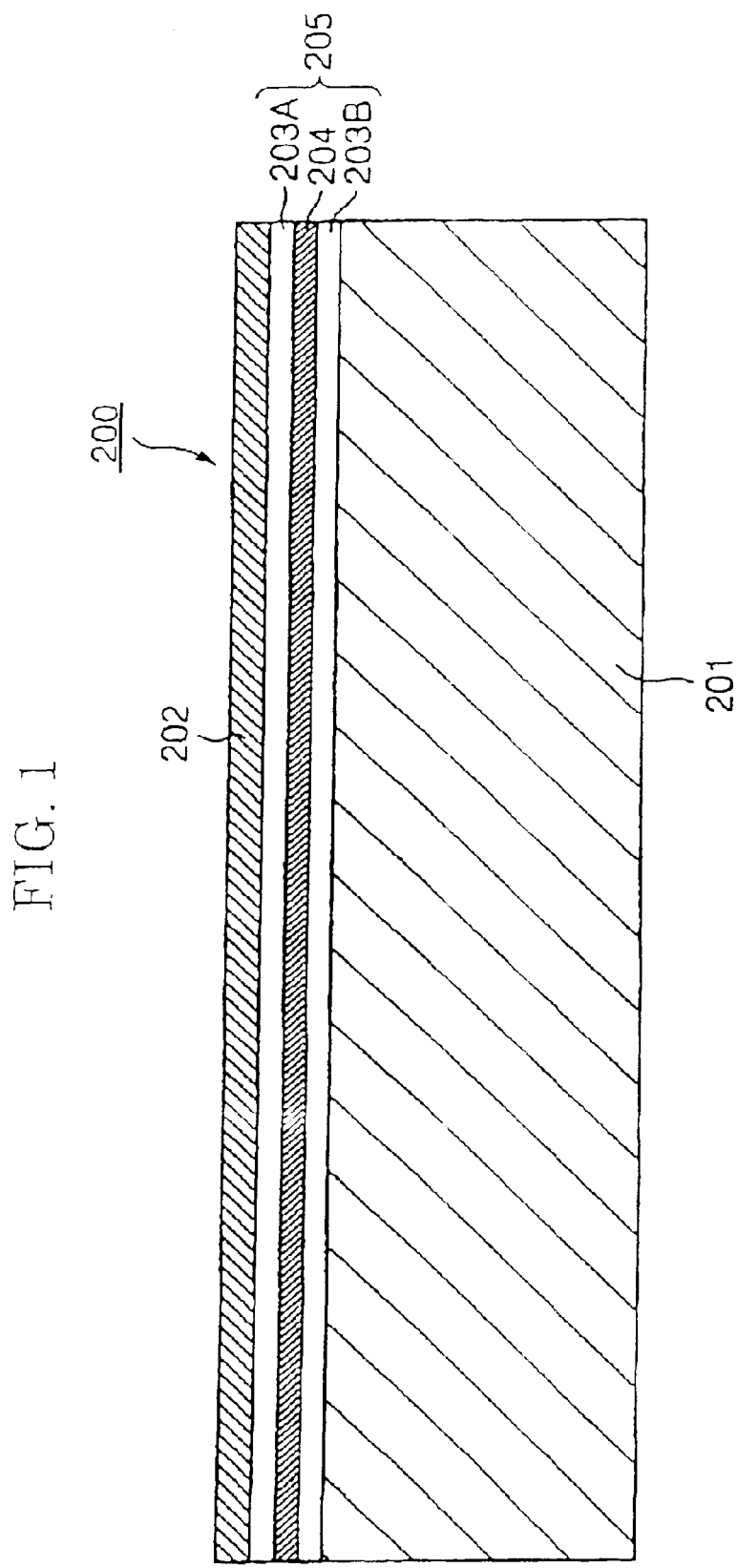
FIG. 1 is a sectional view showing a structure of an SOI substrate of an embodiment according to the present invention.
Figure 2:
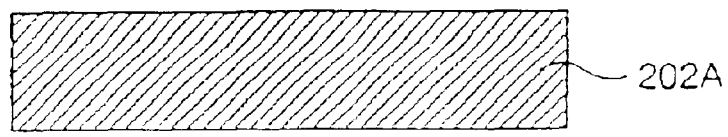
FIG. 2(a) to FIG. 2(e) are process views showing a method of manufacturing the SOI substrate of the embodiment according to the present invention.
Figure 2:
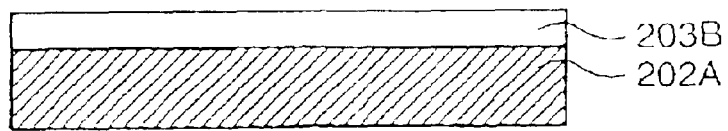
Figure 2:
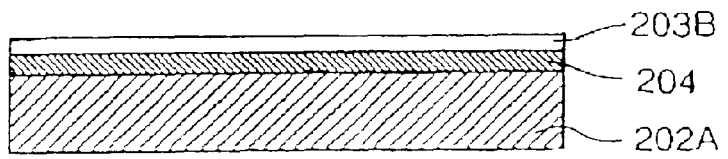
Figure 2:
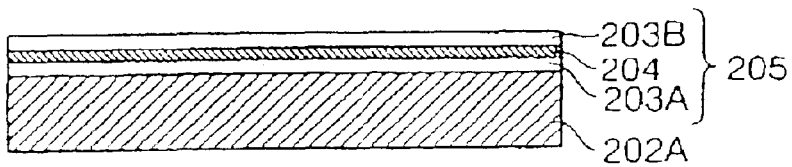
Figure 2:
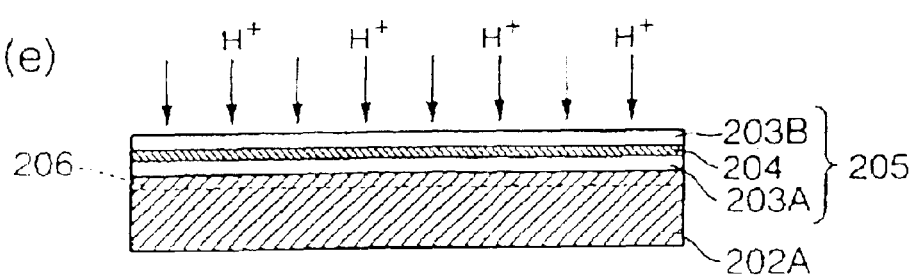

At first, FIG. 1 shows the sectional structure of the SOI substrate in this embodiment. This structure of an SOI substrate 200 is described.

As shown in FIG. 1, the SOI substrate 200 in this embodiment is provided with: a support substrate 201 made of silicon, quartz, glass or the like; and a single crystal silicon layer 202. An insulation portion 205 having a lamination structure including a plurality of insulation films is formed between the support substrate 201 and the single crystal silicon layer 202. In this embodiment, the insulation portion 205 is configured such that a first silicon oxide film 203B, a silicon nitride film or silicon nitride oxide film 204 and a second silicon oxide film 203A are laminated in this order from the side of the support substrate 201.

Next, as a method of manufacturing an SOI substrate in this embodiment, a method of manufacturing the SOI substrate 200 having the above-mentioned configuration will be described below with reference to FIG. 2(a) to FIG. 3(c). FIG. 2(a) to FIG. 2(e) and FIG. 3(a) to FIG. 3(c) show the sectional views in the respective steps in the manufacturing method. By the way, the following manufacturing method is only an example. The present invention is not limited to the following descriptions.

At first, as shown in FIG. 2(a), a single crystal silicon substrate 202A having a film thickness of, for example, about 300 to 900 μm is prepared. Then, as shown in FIG. 2(b), one surface of the single crystal silicon substrate 202A is thermally oxidized at a temperature between 700 and 1150° C. under $O_2$ or $H_2O$ atmosphere. Accordingly, a first silicon oxide film 203B having a film thickness of, for example, about 5 to 400 nm is formed on one surface of the single crystal silicon substrate 202A.

Next, as shown in FIG. 2(c), the surface of the single crystal silicon substrate 202A on which the first silicon oxide film 203B is formed is nitrided or oxynitrided at a temperature between 800 and 1150° C. under dinitrogen monoxide or nitric monoxide atmosphere. Accordingly, the silicon nitride film or silicon nitride oxide film 204 is formed on the side of the single crystal silicon substrate 202A of the first silicon oxide film 203B.

If the support substrate 201 is composed of the substrate having an optically transparent property such as a quartz substrate, a glass substrate or the like and if the SOI substrate 200 is applied to a device, such as a transparent liquid crystal device, through which a light is transmitted, a film thickness of the silicon nitride film or silicon nitride oxide film 204 is desired to be 100 nm or less, in order to avoid the reduction in the light transmission rate caused by the presence of the silicon nitride film or silicon nitride oxide film 204. Particularly, by reducing this film thickness of the silicon nitride film or silicon nitride oxide film 204, such a phenomenon that the display becomes yellowish can be restrained. In particular, it is desirable that the total thickness of the film thickness of the silicon nitride film or silicon nitride oxide film 204 is equal to or less than 10 nm, so that the reduction amount of the transmission rate can be restrained within a few %.

Next, as shown in FIG. 2(d), the surface of the single crystal silicon substrate 202A on which the silicon nitride film or silicon nitride oxide film 204 is formed is thermally oxidized at the temperature between 700 and 1150° C. under the $O_2$ or $H_2O$ atmosphere. Accordingly, a second silicon oxide film 203A having a film thickness of, for example, about 5 to 400 nm is formed on the side of the single crystal silicon substrate 202A of the silicon nitride film or silicon nitride oxide film 204. As mentioned above, the insulation portion 205 including the first silicon oxide film 203B, the silicon nitride film or silicon nitride oxide film 204 and the second silicon oxide film 203A is formed on the single crystal silicon substrate 202A.

Next, as shown in FIG. 2(e), hydrogen ions ($H^+$) are implanted onto the surface of the insulation portion 205 of the single crystal silicon substrate 202A on which the insulation portion 205 is formed, for example, at an acceleration voltage of 100 keV and a dose amount of $10 \times 10^{16}/cm^2$. This process enables a high concentration layer 206 of hydrogen ions to be formed in the single crystal silicon substrate 202A.

Next, as shown in FIG. 3(a), by using the surface of the insulation portion 205 (i.e., the surface of the first silicon oxide film 203B) as the lamination plane, the single crystal silicon substrate 202A and the support substrate 201 made of silicon, quartz, glass or the like are laminated to each other by virtue of the hydrogen coupling force or the like of the silicon oxide constituting this lamination plane. As the laminating process, for example, the method of carrying out the heat treatment for two hours at 300° C. and directly laminating two substrates to each other may be employed. Also, in order to further make the lamination strength stronger, the temperature of the heat treatment may be preferably raised to about 450° C. However, since there is a large difference between the coefficients of the thermal expansions of the support substrate 201 and the single crystal silicon substrate 202A, if it is further heated as it is, the defects such as a crack or the like may be induced in the single crystal silicon layer, resulting in that there may be the fear of the deterioration in the quality of the manufactured SOI substrate 200.

So, in order to suppress such an occurrence of the defects of the crack or the like, it is desirable that the thickness of the single crystal silicon substrate 202A with respect to which the heat treatment for the lamination has been once applied at 300° C. is reduced to be about 100 to 150 μm by using a wet etching or the CMP (Chemically Mechanically Polishing) method and then the heat treatment at a higher temperature is further applied. For example, it is desirable to use KOH aqueous solution at the temperature of 80° C., and etch the single crystal silicon substrate 202A so that its thickness becomes 150 μm, and then carry out the lamination to the support substrate 201, and again carry out the heat treatment at 450° C., and accordingly make the lamination strength stronger.

As shown in FIG. 3(b), the heat treatment is applied to the two laminated substrates. Thus, the single crystal silicon layer 202 as a thin film is left on the surface of the support substrate 201, and most of the single crystal silicon substrate 202A is stripped off. This strip phenomenon of the substrate is caused by the fact that the silicon coupling is cut away by the hydrogen ions implanted into the single crystal silicon substrate 202A. That is, the single crystal silicon substrate 202A can be cut away at the portion near the boundary between the high concentration layer 206 of the hydrogen ions and the other portion into which the hydrogen ions are hardly implanted, in the single crystal silicon substrate 202A.

The heat treatment for stripping off the single crystal silicon substrate 202A may be preformed, for example, by heating the two laminated substrates up to 600° C. at a temperature rise speed of 20° C. per minute. This heat treatment causes most of the laminated single crystal silicon substrate 202A to be separated from the support substrate 201. Accordingly, the single crystal silicon layer 202 having a film thickness of, for example, about 200 nm±5 nm is formed on the surface of the support substrate 201. By the way, the single crystal silicon layer 202 can be formed at any film thickness between 50 nm and 300 nm by changing the above-mentioned acceleration voltage when the hydrogen ions are implanted into the single crystal silicon substrate 202A.

As mentioned above, the SOI substrate 200 is manufactured as shown in FIG. 3(c).

By the way, the method of laminating the single crystal silicon substrate 202A and the support substrate 201 to each other and then reducing the film thickness of the single crystal silicon substrate 202A to thereby form the single crystal silicon layer 202 is not limited to the above-mentioned method of using the hydrogen ions. The single crystal silicon layer 202 of the thin film may be also obtained by using a method of laminating the single crystal silicon substrate and the support substrate to each other, then polishing the surface of the single crystal silicon substrate to thereby reduce its film thickness to 3 to 5 μm, and then etching its film thickness to about 0.05 to 0.8 μm by the PACE (Plasma Assisted Chemical Etching) method to thereby finishing it. Alternatively, the single crystal silicon layer 202 may be obtained by the ELTRAN (Epitaxial Layer Transfer) method of transcribing an epitaxial silicon layer formed on a cellular or porous silicon onto the lamination support substrate by carrying out a selective etching for the cellular or porous silicon layer.

According to the method of manufacturing the SOI substrate in this embodiment, by laminating the support substrate 201 and the single crystal silicon substrate 202A in which the silicon nitride film or silicon nitride oxide film 204 is formed on the surface thereof to each other, the silicon nitride film or silicon nitride oxide film 204 can be positioned on the side closer to the single crystal silicon layer 202 than the lamination plane between the support substrate 201 and the single crystal silicon substrate 202A. Hence, it is possible to almost perfectly prevent the impurities contained in the support substrate 201 and the impurities absorbed on the lamination plane between the support substrate 201 and the single crystal silicon substrate 202A from being diffused toward the single crystal silicon layer 202.

In particular, according to the method of manufacturing the SOI substrate in this embodiment, if the light shield film for covering at least a channel region of a pixel switching TFT from the side of the support substrate 201, as described later, and performing a light shield against a return light is formed on the support substrate 201, the insulation portion 205 including the silicon nitride film or silicon nitride oxide film 204 serving as a minute film of a low transmission rate against oxidizer, such as oxygen, water content or the like, and the impurity can effectively prevent the oxidizer from being diffused into the light shield film made of the high melting point metal and the like. At the same time, it can effectively prevent the impurity from being diffused into the single crystal silicon layer 202 from the light shield film.

Also, the CVD method or the like may be used to sequentially laminate the second silicon oxide film 203A, the silicon nitride film or silicon nitride oxide film 204 and the first silicon oxide film 203B in this order on the surface of the single crystal silicon substrate 202A. However, in this case, there may be a fear that not only the manufacturing process is complex, but also the second silicon oxide film 203A, the silicon nitride film or silicon nitride oxide film 204 and the first silicon oxide film 203B are irregular in film thickness.

However, this embodiment employs the flowing method That is, the surface of the single crystal silicon substrate 202A is thermally oxidized to accordingly form the first silicon oxide film 203B. Then, the surface of the single crystal silicon substrate 202A on which the first silicon oxide film 203B is formed is nitrided, or oxidized and nitrided to accordingly form the silicon nitride film or silicon nitride oxide film 204 on the side of the single crystal silicon substrate 202A of the first silicon oxide film 203B. Moreover the surface of the single crystal silicon substrate 202A on which the silicon nitride film or silicon nitride oxide film 204 is formed is thermally oxidized to accordingly form the second silicon oxide film 203A on the side of the single crystal silicon substrate 202A of the silicon nitride film or silicon nitride oxide film 204. Thus, it is possible to form the first silicon oxide film 203B, the silicon nitride film or silicon nitride oxide film 204 and the second silicon oxide film 203A which are flat and uniform in film thicknesses.

The formation of those films having such uniform film thicknesses can prevent voids from occurring on the lamination plane between the support substrate 201 and the single crystal silicon substrate 202A. Also, this enables the lamination strength to be improved. Moreover, when the SOI substrate 200 is used to form the transistor element or the like, the occurrence of the film separation, film detachment or the like can be prevented to thereby improve the yield of the product.

Also according to this method, the first silicon oxide film 203B, the silicon nitride film or silicon nitride oxide film 204 and the second silicon oxide film 203A can be formed integrally with the single crystal silicon substrate 202A. Thus, it is possible to manufacture the SOI substrate 200 having the high mutual adhesion between the first silicon oxide film 203B, the silicon nitride film or silicon nitride oxide film 204, the second silicon oxide film 203A and the single crystal silicon layer 202.

Also according to this embodiment, the first silicon oxide film 203B is formed on the surface of the silicon nitride film or silicon nitride oxide film 204, and the surface of the first silicon oxide film 203B is used as the lamination plane. Thus, the adhesion between the support substrate 201 and the single crystal silicon substrate 202A can be improved, and the lamination strength can be improved, as compared with the case when the surface of the silicon nitride film or silicon nitride oxide film 204 is used as the lamination plane, without any formation of the first silicon oxide film 203B on the surface of the silicon nitride film or silicon nitride oxide film 204.

By the way, even if the first silicon oxide film 203B, the silicon nitride film or silicon nitride oxide film 204 and the second silicon oxide film 203A are formed by using the CVD method or the like without any formation being integrated with the single crystal silicon substrate 202A, as long as the flat film can be formed, it is possible to exemplify the lamination pattern between the single crystal silicon substrate 202A and the support substrate 201 and the method of forming the first silicon oxide film 203B, the silicon nitride film or silicon nitride oxide film 204 and the second silicon oxide film 203A, besides the above-explained manufacturing method.

Also, in this embodiment, the second silicon oxide film 203A is formed after the silicon nitride film or silicon nitride oxide film 204. However, this is only the case that a lattice-defect is induced when the silicon nitride film or silicon nitride oxide film 204 is directly formed on the single crystal silicon substrate 202A. In particular, when the silicon nitride oxide film 204 is formed, the lattice defect is not easily induced. Thus, the second silicon oxide film 203A may not be formed.

Figure 4:
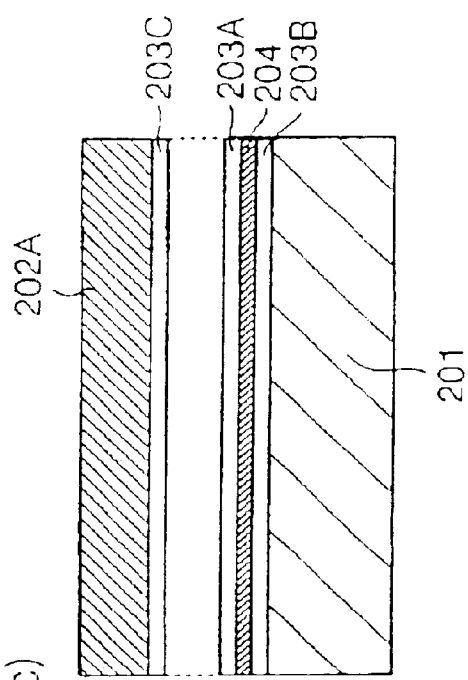
FIG. 4(a) to FIG. 4(d) are sectional views showing various patterns for a lamination between a support substrate and a single crystal silicon substrate, in a method of manufacturing the SOI substrate of the embodiment according to the present invention.
Figure 4:
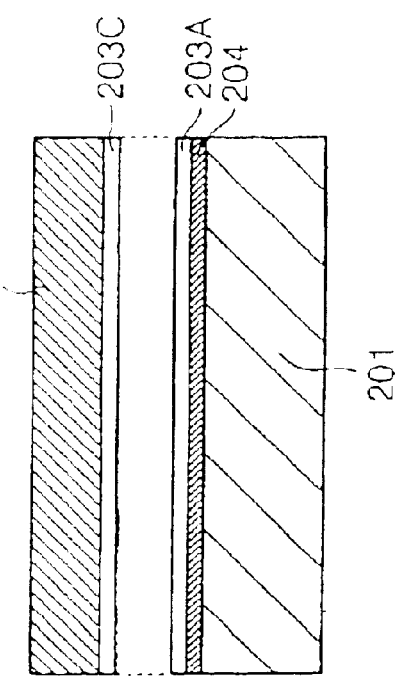
Figure 4:
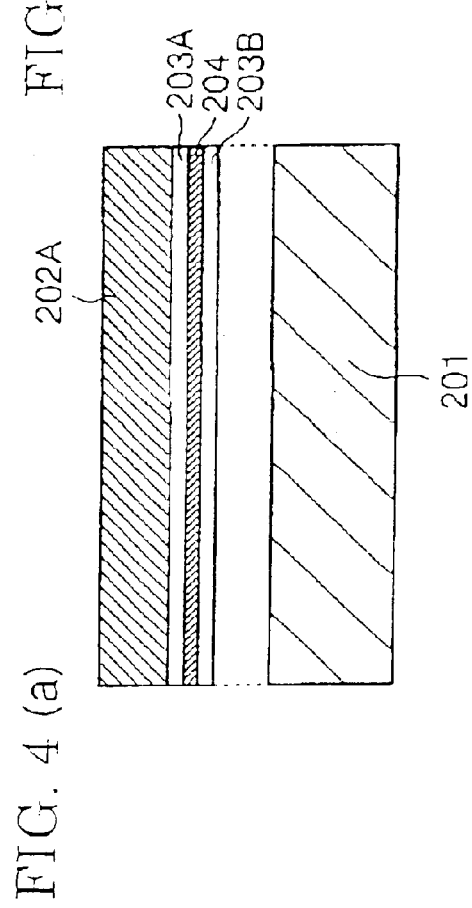
Figure 4:
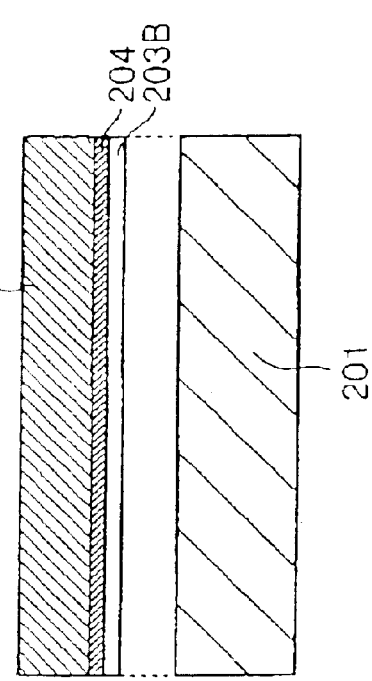

Next, the method of forming the first silicon oxide film 203B, the silicon nitride film or silicon nitride oxide film 204 and the second silicon oxide film 203A besides the above-mentioned explanation and the, lamination pattern will be simply described below with reference to FIG. 4(a) to FIG. 4(d). Each of FIG. 4(a) to FIG. 4(b) is a sectional view showing the combination by extracting the single crystal silicon substrate 202A and the support substrate 201 to be laminated.

As shown in FIG. 4(a), the second silicon oxide film 203A, the silicon nitride film or silicon nitride oxide film 204 and the first silicon oxide film 203B are sequentially formed on the surface of the single crystal silicon substrate 202A by the CVD method. Then, the single crystal silicon substrate 202A and the support substrate 201 may be laminated to each other.

Alternatively, the second silicon oxide film 203A may be firstly formed by thermally oxidizing the surface of the single crystal silicon substrate 202A., and then, tie silicon nitride film or silicon nitride oxide film 204 and the first silicon oxide film 203B may be sequentially formed by the CVD method. In this way, they may be formed by using the combination of the above-mentioned method and the CVD method.

Also, in case of using the CVD method to form the silicon oxide film and the silicon nitride film or silicon nitride oxide film on the surface of the single crystal silicon substrate 202A, the silicon nitride film or silicon nitride oxide film 204 may be directly formed without any formation of the second silicon oxide film 203A on the surface of the single crystal silicon substrate 202A, as shown in FIG. 4(b).

Even this configuration enables the silicon nitride film or silicon nitride oxide film 204 to be positioned at the side closer to the single crystal silicon layer 202 than the lamination plane between the support substrate 201 and the single crystal silicon substrate 202A. Thus, it is possible to almost perfectly prevent the impurities contained in the support substrate 201 and the impurities absorbed on the lamination plane between the support substrate 201 and the single crystal silicon substrate 202A from being diffused into the side of the single crystal silicon layer 202.

FIG. 4(a) and FIG. 4(b) illustrate such a case that the lamination is executed after the silicon oxide film and the silicon nitride film or silicon nitride oxide film are formed on the side of the single crystal silicon substrate 202A. However, the present invention is not limited to this case. The execution of the lamination after the formation of the silicon oxide film and the silicon nitride film or silicon nitride oxide film on the side of the support substrate 201 will be described below with reference to FIG. 4(c) and FIG. 4(d).

As shown in FIG. 4(c), the first silicon oxide film 203B, the silicon nitride film or silicon nitride oxide film 204 and the second silicon oxide film 203A are sequentially formed on the surface of the support substrate 201 by using the CVD method. Then, the lamination between this support substrate 201 and the single crystal silicon substrate 202A may be executed.

In this case, it is desired that an silicon oxide film 203C is formed in advance on the surface of the single crystal silicon substrate 202A by using the thermal oxidation or the CVD method. The adhesion between those two substrates after the lamination can be improved by forming the uppermost surfaces at the lamination plane from the silicon oxide films respectively, with regard to both of the support substrate 201 and the single crystal silicon substrate 202A, as mentioned above.

Also, if the support substrate 201 is made of quartz substrate or glass substrate, since the main component of the support substrate 201 is silicon oxide, it is not necessary to form the first silicon oxide film 203B on the surface of the support substrate 201, as shown in FIG. 4(d). So, the silicon nitride film or silicon nitride oxide film 204 and the second silicon oxide film 203A are sequentially formed on the side of the support substrate 201 by using the CVD method. After that, this support substrate 201 may be laminated onto the single crystal silicon substrate 202A, in which the silicon oxide film 203C is formed on the surface.

By the way, in the lamination patterns shown in FIG. 4(c) and FIG. 4(d), the silicon nitride film or silicon nitride oxide film 204 is formed at a side closer to the support substrate 201 than the lamination plane. Thus, although it is possible to prevent the impurities contained in the support substrate 201 from being diffused into the side of the single crystal silicon layer 202, it is difficult or impossible to prevent the impurities absorbed on the lamination plane from being diffused into the side of the single crystal silicon layer 202. That is, the lamination patterns shown in FIG. 4(c) and FIG. 4(d) are effective for the case when the substrate including the impurities, such as the quartz substrate or the glass substrate, or the like, is used as the support substrate 201.

In particular, according to the method of manufacturing the SOI substrate shown in FIG. 4(c) and FIG. 4(d), similarly to the case of the manufacturing method shown in FIG. 2(a) to FIG. 3(c), if the light shield film for covering the channel region of the pixel switching TFT from the side of the support substrate 201 is formed on the support substrate 201 as described later, the insulation portion including the silicon nitride film or silicon nitride oxide film 204 can effectively prevent the oxidizer from being diffused into the light shield film. At the same time, it can effectively prevent the impurities from being diffused into the single crystal silicon layer 202 from the light shield film.

(Element Substrate)

Next, an embodiment of an element substrate according to the present invention made by using the SOI substrate 200 as mentioned above will be described below with reference to FIG. 5.

Figure 5:
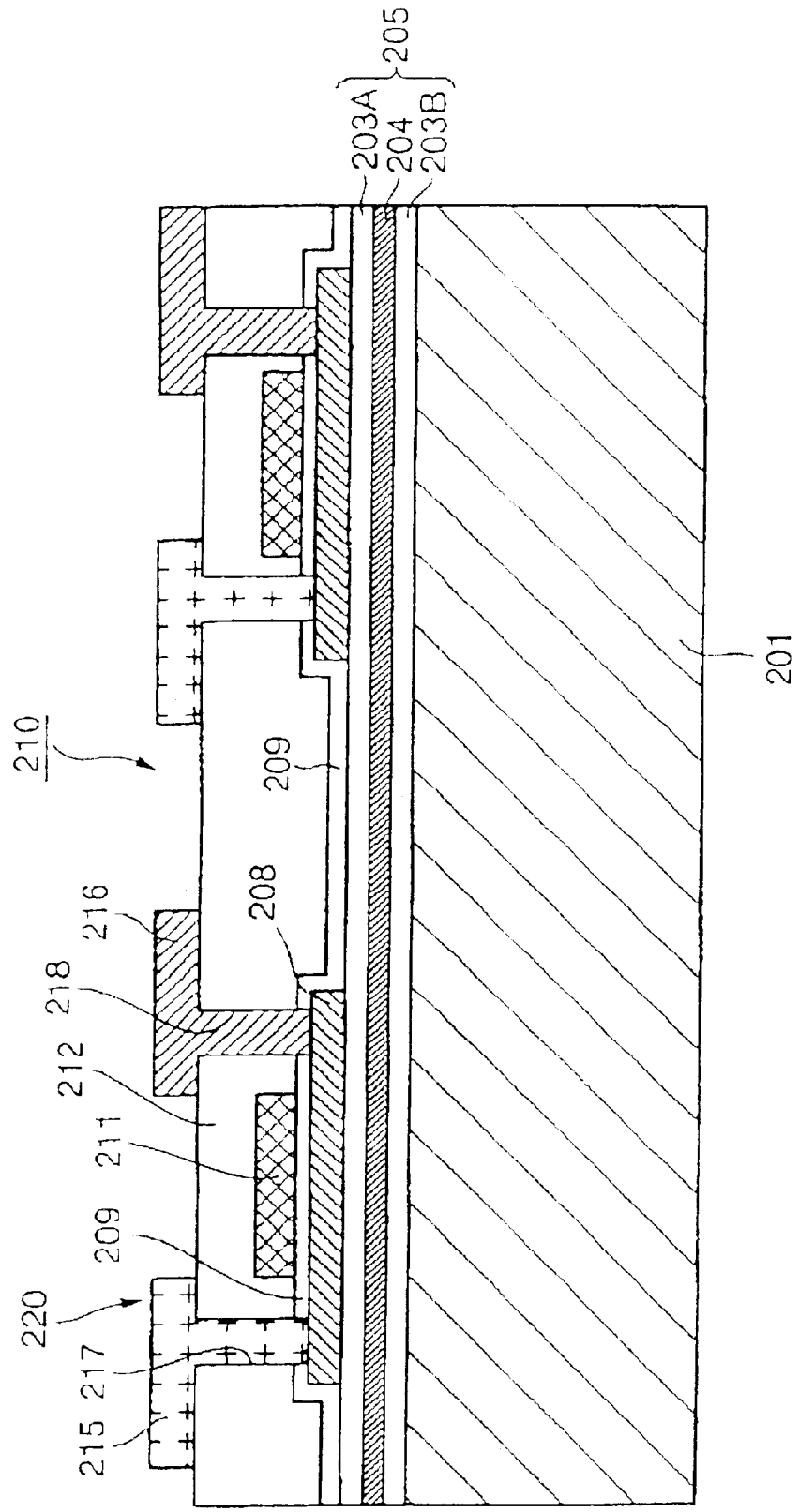
FIG. 5 is a sectional view showing a structure of an element substrate of the embodiment according to the present invention.

In FIG. 5, after the single crystal silicon layer 202 of the SOI substrate 200 (shown in FIG. 1) is formed at a predetermined pattern, an element substrate 210 is manufactured by forming the TFT (transistor element) by using this single crystal silicon layer. In FIG. 5, the same constitutional elements as those in FIG. 1 carry the same reference numerals, and their explanations are omitted.

In FIG. 5, a TFT 220 as an example of the transistor element is configured such that the single crystal silicon layer 202 manufactured on the SOI substrate 200 as mentioned above (shown in FIG. 1) is used as a semiconductor layer 208. Also, in FIG. 5, the support substrate 201, the insulation portion 205 including the first silicon oxide film 203B, the silicon nitride film or silicon nitride oxide film 204 and the second silicon oxide film 203A, and the semiconductor layer 208 composed of the single crystal silicon layer 202 (shown in FIG. 1) constitute the SOI substrate.

As shown in FIG. 5, the TFT 220 having the semiconductor layer 208, a gate insulation film 209, a gate electrode 211, a source electrode 215, a drain electrode 216 and an inter-layer insulation film 212 is formed on the surface of the insulation portion 205.

In detail, the gate insulation film 209 is formed on the surface of the support substrate 201 on which the semiconductor layer 208 is formed, and the gate electrode 211 is formed on the surface of the gate insulation film 209. Moreover, the inter-layer insulation film 212 is formed on the surface of the support substrate 201 on which the gate electrode 211 is formed.

Contact holes 217 and 218, which are respectively linked to a source region and a drain region (both are not shown) formed in the semiconductor layer 208, are formed in the inter-layer insulation film 212 and the gate insulation film 209. The source electrode 215 and the drain electrode 216 are formed so as to be electrically connected to the source region and the drain region of the semiconductor layer 208 through the contact holes 217 and 218, respectively.

The element substrate 210 in this embodiment is formed by using the SOI substrate 200. Thus, it is possible to almost perfectly prevent the impurities contained in the support substrate 201 and the impurities absorbed on the lamination plane between the support substrate 201 and the single crystal silicon substrate 202A (refer to FIG. 2(a) to FIG. 2(e)) from being diffused into the side of the semiconductor layer 208 (of the TFT 220). Hence, it is possible to prevent the deterioration in the property of the TFT 220.

In particular, according to the element substrate 210 in this embodiment, if the TFT 220 is formed in an image display region to which an input light or a return light is inputted, as the pixel switching TFT as described later, and if the light shield film for covering at least a channel region of the semiconductor layer 208 constituting this TFT 220 to perform the light shield against the return light from the side of the support substrate 201 is formed on the support substrate 201, the insulation portion 205 including the silicon nitride film or silicon nitride oxide film 204 can effectively prevent the oxidizer from being into the light shield film. At the same time, this insulation portion 205 can effectively prevent the impurities from being diffused into the semiconductor layer 208 from the light shield film.

(Electro-Optical Apparatus)

As an embodiment of an electro-optical apparatus according to the present invention, an active matrix type of an liquid crystal device employing the TFT (transistor element) as a switching element is taken up here, which is preferably used in a projection type display apparatus such as a projector and the like. Then, this will be described below with reference to FIG. 18(a) to FIG. 18(c), FIG. 19(a) to FIG. 19(c), FIG. 20(a) to FIG. 20(b) FIG. 21(a) to FIG. 21(b), and FIG. 6 to FIG. 8.

By the way, the liquid crystal device in this embodiment basically has the element substrate (refer to FIG. 5) manufactured by using the above-mentioned SOI substrate (refer to FIG. 1 to FIG. 4(d)). That is, in the basic structure of the element substrate constituting the electro-optical apparatus in this embodiment, as mentioned above, the insulation portion including the silicon nitride film or silicon nitride oxide film is formed on the surface of the substrate main body corresponding to the support substrate, and the TFT having the semiconductor layer composed of the single crystal silicon layer is formed above it.

Also, in the projection type display apparatus, a light is typically inputted from the substrate side (i.e., the surface of the liquid crystal device) on the side opposite to the element substrate, among two substrates constituting the liquid crystal device. In order to prevent the occurrence of a light leak current when this light is inputted to the channel region of the TFT formed on the surface of the element substrate, it is typically designed to form the light shield layer on the side to which the light from the TFT is inputted.

However, even if the light shield layer is disposed on the side to which the light from the TFT is inputted, there may be a case that the light inputted to the liquid crystal device is reflected on the boundary on the rear of the element substrate, and is inputted as a return light to the channel section of the TFT. This return light can sufficiently lead to the light leak current in an apparatus using a very strong light source such as a projector and the like, although it is small as a rate with respect to the light amount inputted from the surface of the liquid crystal device. That is, the return light from the rear of the element substrate has a bad influence on the switching property of the TFT, and causes the property of the device to be deteriorated.

So, in this embodiment, in order to prevent the above-mentioned deterioration in the TFT property caused by the return light, the light shield film is disposed immediately on the substrate main body corresponding to the support substrate, correspondingly to each TFT (transistor element). Moreover, in order to electrically insulate between the light shield film made of metal and the like and the semiconductor layer constituting the TFT, the insulation portion is formed which includes the first silicon oxide film, the silicon nitride film or silicon nitride oxide film and the second silicon oxide film.

At first, the various actual examples of the structure in each of which the light shield film is formed at the lower side of the TFT in the electro-optical apparatus of this embodiment are described with reference to FIG. 18(*a*) to FIG. 18(*c*), FIG. 19(*a*) to FIG. 19(*c*), FIG. 20(*a*) to FIG. 20(*b*) and FIG. 21(*a*) to FIG. 21(*b*). By the way, in those FIG. 18(*a*) to FIG. 18(*c*), FIG. 19(*a*) to FIG. 19(*c*), FIG. 20(*a*) to FIG. 20(*b*), FIG. 21(*a*) and FIG. 21(*b*), the same constitutional elements as those in FIG. 5 carry the same reference numerals and their explanations are omitted.

Figure 18:
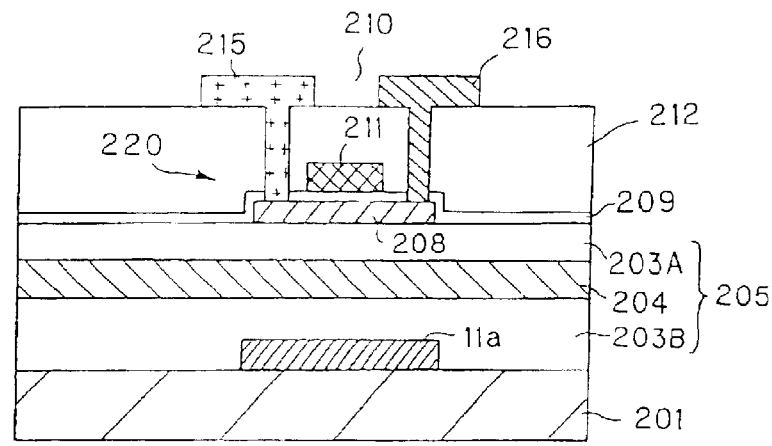
FIG. 18(a) to FIG. 18(c) are sectional views showing various actual examples of a structure in which a light shield film is formed at a lower side of TFT in the electro-optical apparatus of the embodiment.
Figure 18:
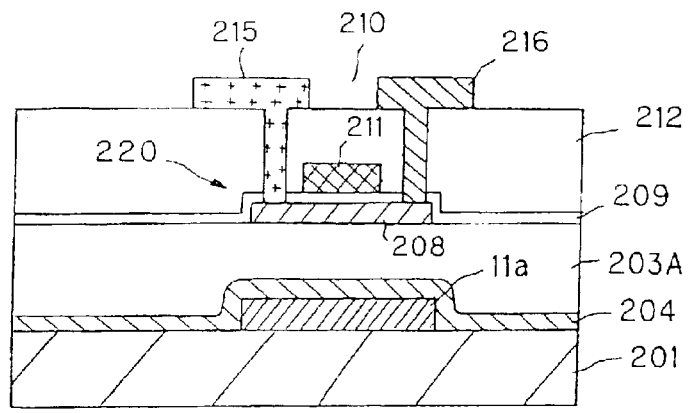
Figure 18:
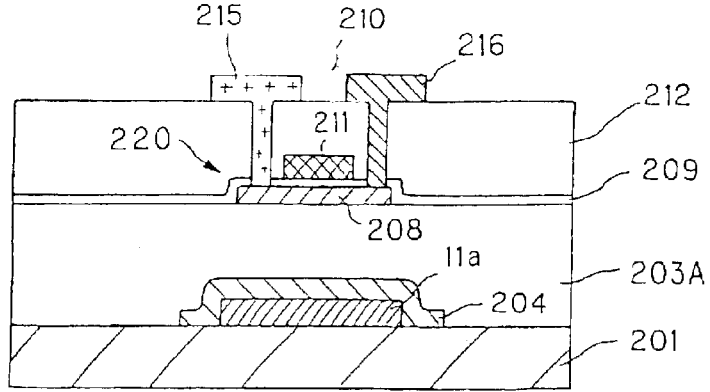
Figure 19:
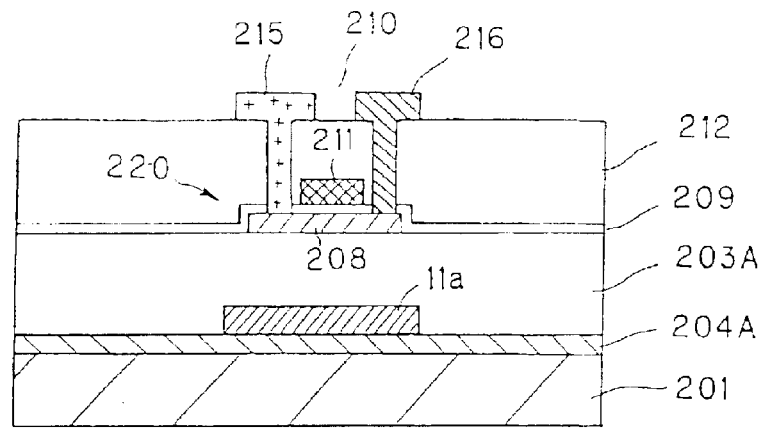
FIG. 19(a) to FIG. 19(c) are sectional views showing various actual examples of a structure in which a light shield film is formed at a lower side of TFT in the electro-optical apparatus of the embodiment.
Figure 19:
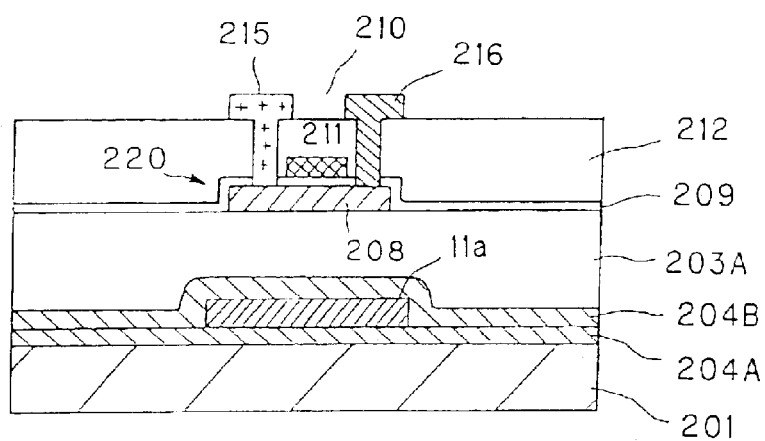
Figure 19:
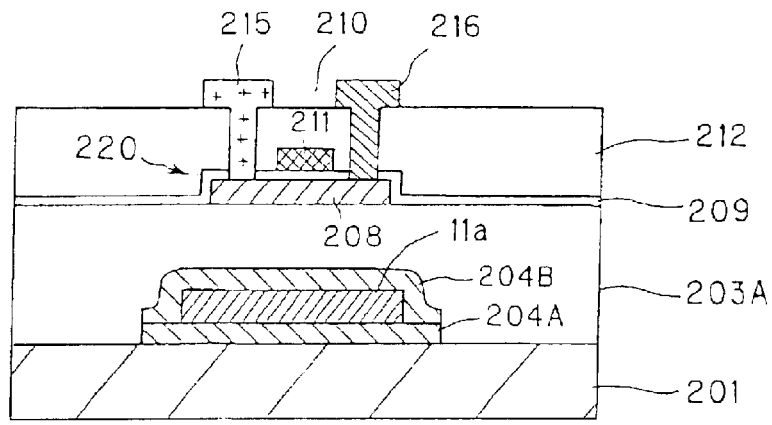

In the actual example shown in FIG. 18(*a*), a first light shield film 11*a* is formed immediately on the support substrate 201, correspondingly to each TFT (transistor element) 220. Such a first light shield film 11*a* may be formed of a film including a metallic unity having at least one of high melting point metals, for example, such as Ti, Cr, W, Ta, Mo, Pd and the like, as an alloy, a metallic silicide, a poly-silicide, and a member in which they are laminated, and so forth. Or, the first light shield film 11*a* may be formed of the light absorption film, such as a silicon film or the like, for partially absorbing the light and accordingly carrying out the light shield, or may be formed of the Al film of a high reflection rate or the like. Also, the flat pattern of the first light shield film 11*a* may have a predetermined shape such as a grid, a stripe, an island or the like, and may be formed so as to cover at least the channel region of the semiconductor layer 208 from the side of the support substrate 201 (the lower side of FIG. 18(*a*)). Then, the insulation portion 205 including the first silicon oxide film 203B, the silicon nitride film or silicon nitride oxide film 204 and the second silicon oxide film 203A is formed between the first light shield film 11*a* having the above-mentioned configuration and the TFT 220. Thus, it is possible to perfectly prevent the impurities contained in the support substrate 201 and the impurities absorbed on the lamination plane between the support substrate 201 and the single crystal silicon substrate 202A from being diffused into the side of the semiconductor layer 208 (TFT 220). Hence, it is possible to prevent the deterioration in the property of the TFT 220.

Moreover, in this actual example, if a process of performing an element separation of the semiconductor layer 208 through the LOCOS or the like is employed, or if a process of reducing a film thickness of the semiconductor layer 208 is employed in order to make the semiconductor layer 208 thinner, or if a process of forming the gate insulation film 209 is employed, it is possible to prevent the oxidizer from being diffused, by virtue of the silicon nitride film or silicon nitride oxide film 204 above the first light shield film 11*a* at the oxidizing process, and it is possible to prevent the first light shield film 11*a* composed of, for example, the high melting point metal film and the like from being oxidized.

Thus, it is possible to prevent the increase in the light transmission rate of the first light shield film 11*a* caused by the oxidization of the first light shield film 11*a*, namely, it is possible to effectively prevent the drop in the light shield function of the first light shield film 11*a*. In addition, the diffusion of the impurities into the semiconductor layer 208 from the first light shield film 11*a* composed of, for example, the high melting point metal film and the like can be effectively prevented by the silicon nitride film or silicon nitride oxide film 204. Also, it is possible to prevent the deterioration in the transistor property of the TFT 220 caused by the diffusion of the impurities as mentioned above.

Next, in the actual example shown in FIG. 18(*b*), the first light shield film 11*a* is formed immediately on the support substrate 201, correspondingly to each TFT 220. The silicon nitride film or silicon nitride oxide film 204 and the second silicon oxide film 203A are formed between the first light shield film 11*a* and the TFT 220. Thus, it is possible, to prevent the impurities contained in the support substrate 201 and the impurities absorbed on the lamination plane between the support substrate 201 and the single crystal silicon substrate 202A (shown in FIG. 2(*a*) to FIG. 2(*e*)) from being diffused into the side of the semiconductor layer 208 (TFT 220). Hence, it is possible to prevent the deterioration in the property of the TFT 220.

Moreover, in this actual example, if the process of performing the element separation of the semiconductor layer 208 through the LOCOS or the like is employed, or if the process of oxidizing the semiconductor layer 208 is employed in order to make the semiconductor layer 208 thinner, or if the process of forming the gate insulation film 209 is employed, it is possible to prevent the oxidizer from being diffused by the silicon nitride film or silicon nitride oxide film 204 immediately on the first light shield film 11*a* at the oxidizing process, for example, it is possible to prevent the first light shield film 11*a* composed of, for example, the high melting point metal film and the like from being oxidized. Thus, it is possible to prevent the increase in the light transmission rate of the first light shield film 11*a* caused by the oxidization of the first light shield film 11*a*, namely, it is possible to effectively prevent the drop in the light shield function of the first light shield film 11*a*. In addition, even the diffusion of the impurities into the semiconductor layer 208 from the first light shield film 11*a* composed of, for example, the high melting point metal film and the like can be effectively prevented by the silicon nitride film or silicon nitride oxide film 204. Also, it is possible to prevent the deterioration in the transistor property of the TFT 220 caused by the diffusion of the impurities as mentioned above.

Next, in the actual example shown in FIG. 18(*c*), as compared with the actual example of FIG. 18(*b*), the silicon nitride film or silicon nitride oxide film 204 is not the substantial whole plane of the support substrate 201, but is formed to have the flat pattern that is slightly larger than the first light shield film 11*a* having the flat pattern of the predetermined shape. The other configuration is similar to that of the actual example of FIG. 18(*b*). Thus, it is possible to prevent the impurities contained in the support substrate 201 and the impurities absorbed on the lamination plane between the support substrate 201 and the single crystal silicon substrate 202A from being diffused into the side of the semiconductor layer 208 (TFT 220). Moreover, it is possible to prevent the oxidizer from being diffused, in the silicon nitride film or silicon nitride oxide film 204 immediately on the first light shield film 11*a*. In addition, it is possible to prevent the impurities from being diffused into the semiconductor layer 208 from the first light shield film 11a.

In particular, in this actual example, the silicon nitride film or silicon nitride oxide film 204 is not disposed substantially or at all in an open region of each pixel that actually contributes to the display by virtue of the transmission of the display light. Thus, it is possible to prevent the light transmission rate from being dropped in the open region, due to the silicon nitride film or silicon nitride oxide film 204. Especially, there is a wave length dependency in the light transmission rate of the silicon nitride film or silicon nitride oxide film 204. Hence, it is possible to prevent that the existence of the silicon nitride film or silicon nitride oxide film 204 gives a certain color to the display light (for example, the entire screen becomes yellowish), which is advantageous. In the present example, it is possible to increase the film thickness of the insulation portion as compared with the case of FIG. 18(b) by making the use of the above-mentioned advantage, so that it is possible to prevent the diffusion as for the oxidizer.

In this example, in the light transparent portion, it is preferable that the etching edge of the silicon nitride film or silicon nitride oxide film 204 is located substantially within 2 μm from the etching edge of the light shield film 11a. By this, it is possible to restrict the drop of the light transmission rate within a few % at the insulation portion in the open region.

Next, in the example shown in FIG. 20(a), as compared with the example shown in FIG. 18(c), in the light transparent portion, the etching edge of the silicon nitride film or silicon nitride oxide film 204 is substantially self-aligned with the etching edge of the light insulation layer 11a. By this, in the light transparent portion of the open area, it is possible to restrict the etching edge of the insulation portion within 1 μm from the edging edge of the light shield film 11a. Thus, it is possible to further restrain the drop of the light transmission rate in the open area due to the insulation portion. Especially, in the present example, it is possible to easily perform a light-exposure by performing the light-exposure and the removal of the resist 221 while a hatching portion thereof is remained as shown in FIG. 20(b) by using a rear exposure or the like, so that it is possible to drastically decrease the cost as compared with the example shown in FIG. 18(c).

Next, in the actual example shown in FIG. 19(a), as compared with the actual example of FIG. 18(b), a silicon nitride film or silicon nitride oxide film 204A is not formed on the upper side of the first light shield film 11a, but is formed on the lower side of the first light shield film 11a (i.e., immediately on the support substrate 201). The other configuration is similar to that of the actual example of FIG. 18(b). Thus, it is possible to prevent the impurities contained in the support substrate 201 and the like from being diffused into the side of the semiconductor layer 208 (TFT 220). Moreover, it is possible to prevent the oxidizer from being diffused, in the silicon nitride film or silicon nitride oxide film 204A immediately under the first light shield film 11a.

Next, in the actual example shown in FIG. 19(b), as compared with the actual example of FIG. 18(b) or FIG. 19(a), the silicon nitride films or silicon nitride oxide films 204A and 204B are not formed only on the upper or lower side of the first light shield film 11a, but are formed on both of the upper and lower sides. The other configuration is similar to that of the actual example of FIG. 18(b) or FIG. 19(a). Thus, it is possible to prevent the oxidizer from being diffused, in the silicon nitride film or silicon nitride oxide film 204B immediately on the first light shield film 11a and the silicon nitride film or silicon nitride oxide film 204A immediately under the first light shield film 11a. In addition, the diffusion of the impurities from the first light shield film 11a into the semiconductor layer 208 can be effectively prevented by the silicon nitride film or silicon nitride oxide film 204B.

Next, in the actual example shown in FIG. 19(c), as compared with the actual example of FIG. 19(b), the silicon nitride films or silicon nitride oxide films 204A and 204B are not the substantial whole plane of the support substrate 201, but are formed to have the flat patterns that are slightly larger than the first light shield film 11a having the flat pattern of the predetermined shape. The other configuration is similar to that of the actual example of FIG. 19(b). Thus, it is possible to prevent the impurities contained in the support substrate 201 and the impurities absorbed on the lamination plane between the support substrate 201 and the single crystal silicon substrate 202A from being diffused into the side of the semiconductor layer 208 (TFT 220). Moreover, it is possible to prevent the oxidizer from being diffused, in the silicon nitride film or silicon nitride oxide film 204B immediately on the first light shield film 11a and the silicon nitride film or silicon nitride oxide film 204A immediately under the first light shield film 11a. In addition, it is possible to effectively prevent the impurities from being diffused into the semiconductor layer 208 from the first light shield film 11a, by virtue of to the silicon nitride film or silicon nitride oxide film 204B.

In particular, in this actual example, similarly to the case of the actual example shown in FIG. 18(c), the silicon nitride films or silicon nitride oxide films 204A and 204B are not disposed substantially or at all in the open region of each pixel. So, it is possible to avoid the light transmission rate to be dropped in the open region, due to the silicon nitride films or silicon nitride oxide films 204A and 204B. Especially, there is a frequency dependency in the light transmission rates of the silicon nitride films or silicon nitride oxide films 204A and 204B. Thus, it is possible to prevent that the existences of the silicon nitride films or silicon nitride oxide films 204A and 204B give color to the display light (for example, the entire screen becomes yellowish), which is advantageous.

By the way, in this actual example, the silicon nitride film or silicon nitride oxide film 204A is etched at the same time when the silicon nitride film or silicon nitride oxide film 204B is etched. However, there is not a large difference even if the silicon nitride film or silicon nitride oxide film 204A is left without etching it.

In the present embodiment, the total film thickness of the silicon nitride film or silicon nitride oxide film is especially desired to be 100 nm or less if the configuration of forming the silicon nitride film or silicon nitride oxide film 204, 204A or 204B is employed even within the open region of each pixel, such as the actual examples shown in FIG. 18(a), FIG. 18(b), FIG. 19(a) or FIG. 19(b). Such a configuration can reduce the drop in the light transmission rate in the open region of each pixel due to the existence of the silicon nitride film or silicon nitride oxide film, and also restrict the coloration of the display light to such a degree that it cannot be viewed on the display picture. Particularly, by reducing this film thickness of the silicon nitride film or silicon nitride oxide film, such a phenomenon that the display becomes yellowish can be restrained. In particular, it is desirable that the total thickness of the film thickness of the silicon nitride film or silicon nitride oxide film is equal to or less than 10 nm, so that the reduction amount of the transmission rate can be restrained within a few %.

In particular, such as the actual examples shown in FIG. 18(c) and FIG. 19(c), it is desired that the silicon nitride film or silicon nitride oxide film constituting the insulation portion is larger than the first light shield film 11a by a round as a flat plane and that the edge of the former is separated by a proper distance from the edge of the latter. Such a configuration enables the light shield film having the flat pattern of the predetermined shape, for example, such as a grid, a stripe, an island or the like, to be cubically covered from the upward, downward, right and left directions on the support substrate 201 with the silicon nitride film or silicon nitride oxide film constituting the insulation portion. Thus, it is possible to reduce the possibility that the oxidizer reaches the first light shield film 11a, and also possible to suppress the diffusion of the impurities from the first light shield film 11a.

In this example, in the light transparent portion, it is preferable that the etching edge of the silicon nitride film or silicon nitride oxide film 204 is located substantially within 2 µm from the etching edge of the light shield film 11a. By this, it is possible to restrict the drop of the light transmission rate within a few % at the insulation portion in the open region.

Figure 21A:
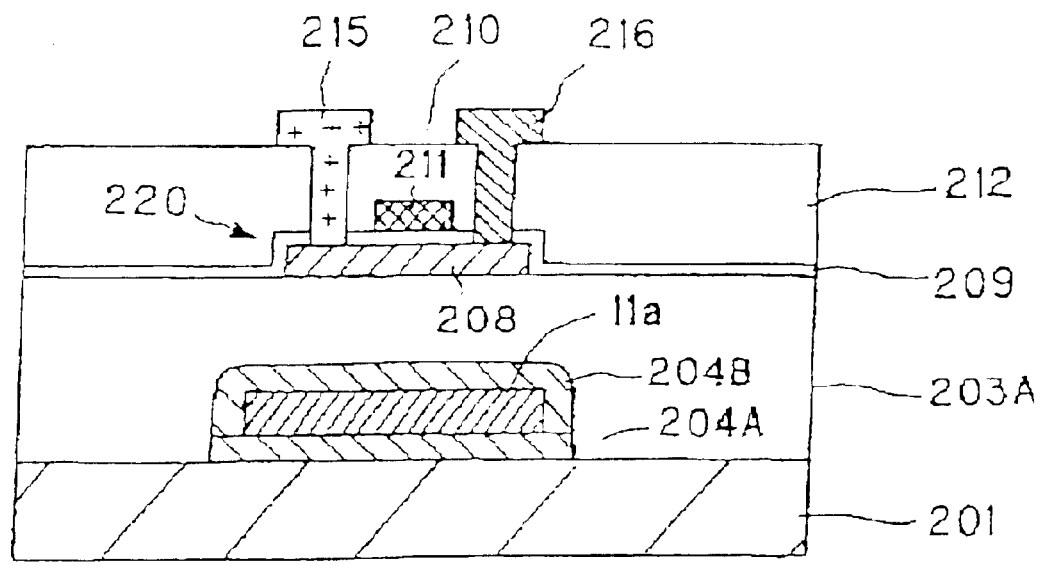
FIG. 21(a) to FIG. 21(b) are sectional views showing various actual examples of a structure in which a light shield film is formed at a lower side of TFT in the electro-optical apparatus of the embodiment.
Figure 21B:
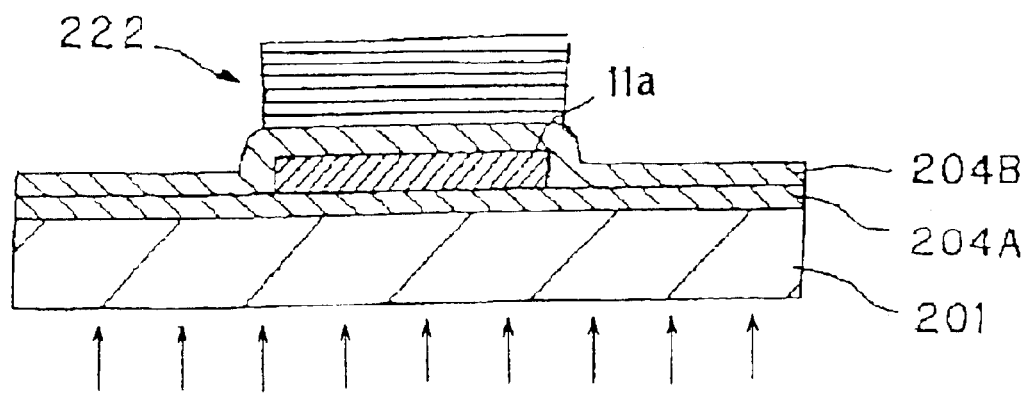

Next, in the example shown in FIG. 21(a), as compared with the example shown in FIG. 19(c), in the light transparent portion, the etching edge of the silicon nitride film or silicon nitride oxide film 204 is substantially self-aligned with the etching edge of the light insulation layer 11a. By this, in the light transparent portion of the open area, it is possible to restrict the etching edge of the insulation portion within 1 µm from the edging edge of the light shield film 11a. Thus, it is possible to further restrain the drop of the light transmission rate in the open area due to the insulation portion. Especially, in the present example, it is possible to easily perform a light-exposure by performing the light-exposure and the removal of the resist 222 while a hatching portion thereof is remained as shown in FIG. 21(b) by using a rear exposure or the like, so that it is possible to drastically decrease the cost as compared with the example shown in FIG. 19(c).

By the way, in the above-mentioned embodiments, the semiconductor layer 208 comprises the single crystal silicon layer by using the SOI technique. However, the semiconductor layer 208 may comprise, for example, a poly-silicon film or an amorphous silicon film or the like. That is, even if the semiconductor layer 208 comprises the poly-silicon film or the amorphous silicon film or the like, it is possible to substantially similarly attain the action and effect of preventing the oxidization of the light shield film by virtue of the insulation portion composed of the silicon nitride film or silicon nitride oxide film 204 and the action and effect of preventing the impurities from being diffused into the semiconductor layer from the light shield film by virtue of the silicon nitride film or silicon nitride oxide film 204, as mentioned above. Then, if the semiconductor layer 208 comprises the poly-silicon film or the amorphous silicon film or the like, the TFT can be produced at a relatively low cost although the transistor property is relatively poor. For this reason, in view of the specification of the apparatus, if it is possible to attain the sufficient transistor property by forming the semiconductor layer 208 of the poly-silicon film or the amorphous silicon film or the like, such a configuration is advantageous since its uselessness is slight.

The structure in the pictured display region of the electro-optical apparatus according to the present invention provided with the light shield film, the TFT, the insulation portion and the like which are configured as mentioned above will be described below with reference to FIG. 6 to FIG. 8. Here, the structure of the electro-optical apparatus is described with a liquid crystal device as an example.

Figure 6:
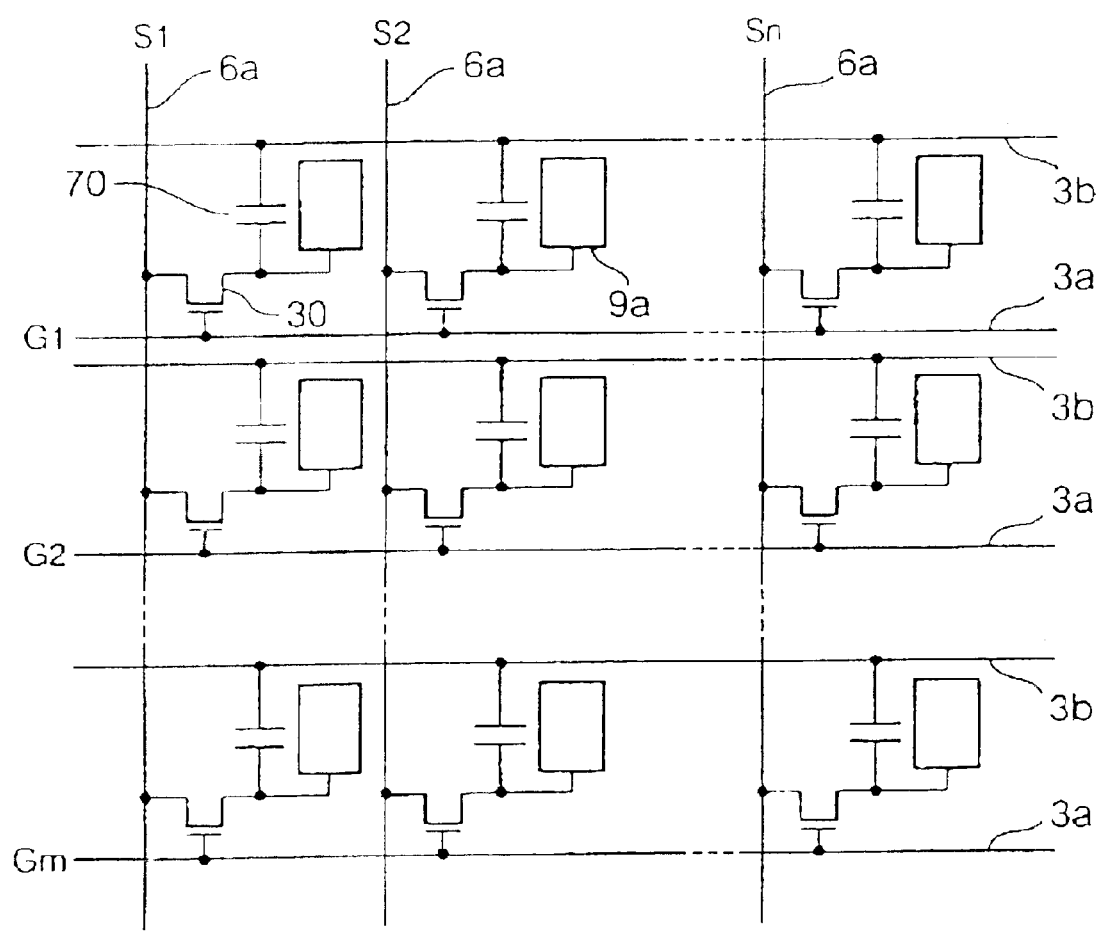
FIG. 6 is an equivalent circuit diagram of various elements, wiring and the like constituting a pixel portion, in an electro-optical apparatus of the embodiment according to the present invention.

FIG. 6 is an equivalent circuit diagram of various elements, wiring and the like in a plurality of pixels configured in a form of matrix, which constitute a pixel portion (in an image display region) of the liquid crystal device. FIG. 7 is a plan view that enlarges and shows a plurality of pixel groups adjacent to each other in the element substrate, in which a data line, a scanning line, a pixel electrode, a light shield film and the like are formed. FIG. 8 is a sectional view taking on the line A–A' of FIG. 7.

Figure 7:
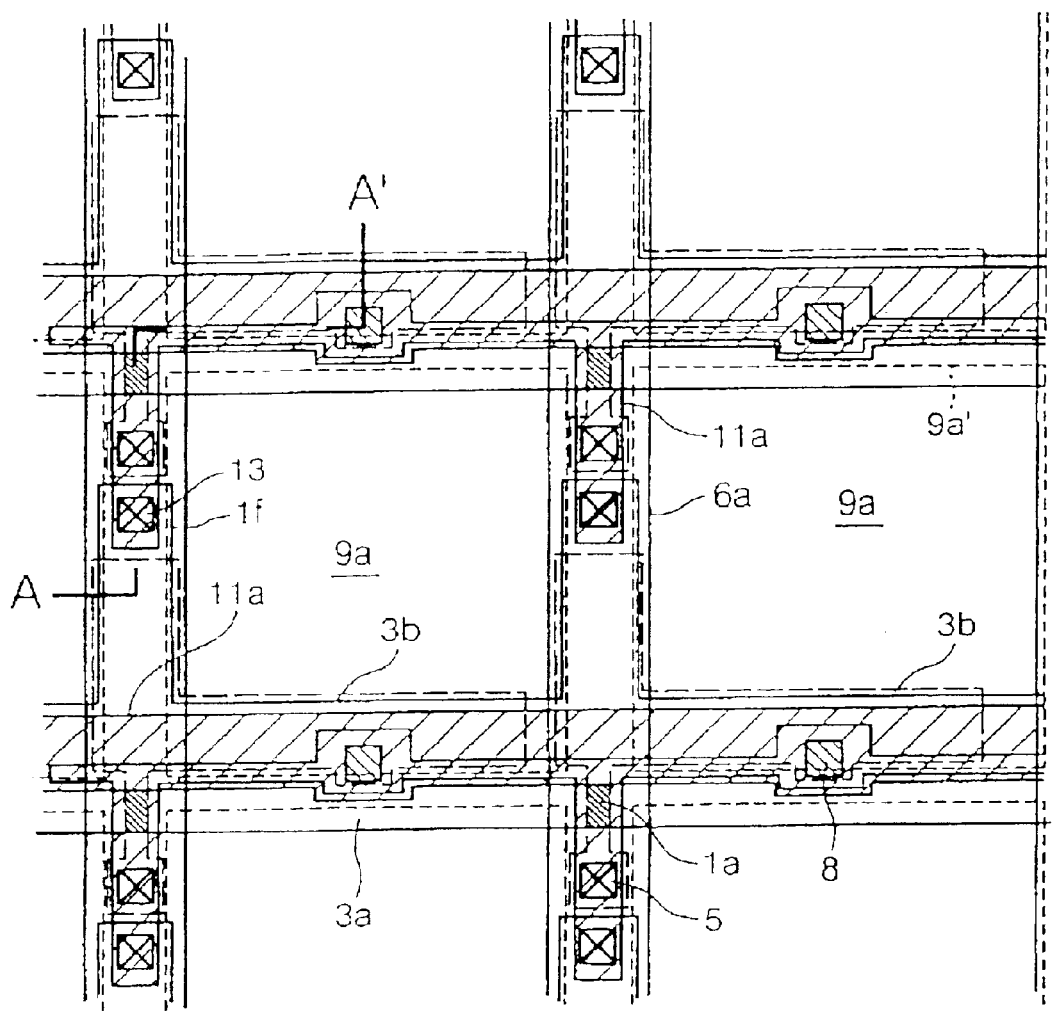
FIG. 7 is a plan view showing a plurality of pixel groups adjacent to each other in the element substrate, in the electro-optical apparatus of the embodiment according to the present invention.
Figure 8:
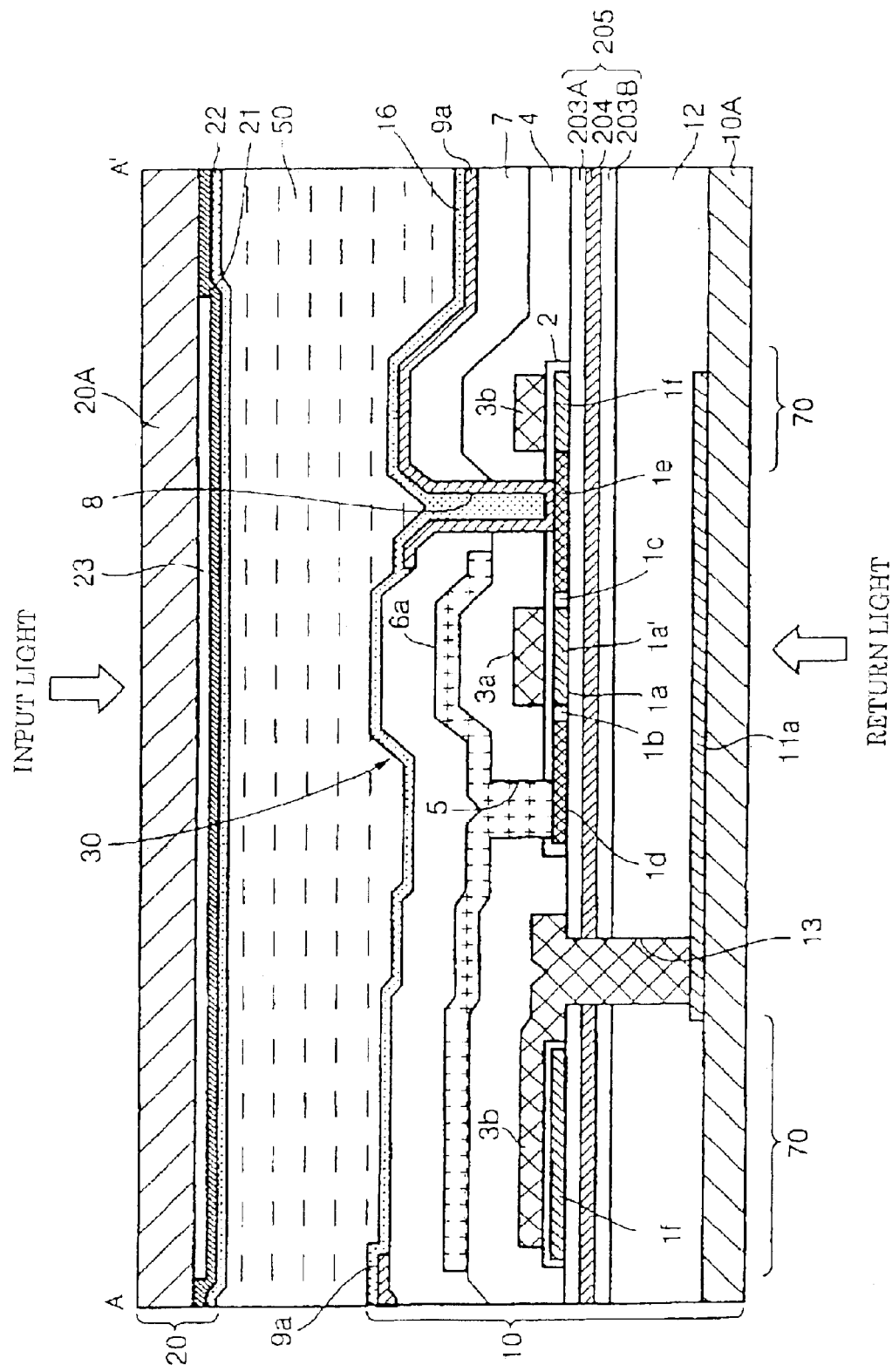
FIG. 8 is a sectional view taking on the line A–A' of FIG. 7.
Figure 9:
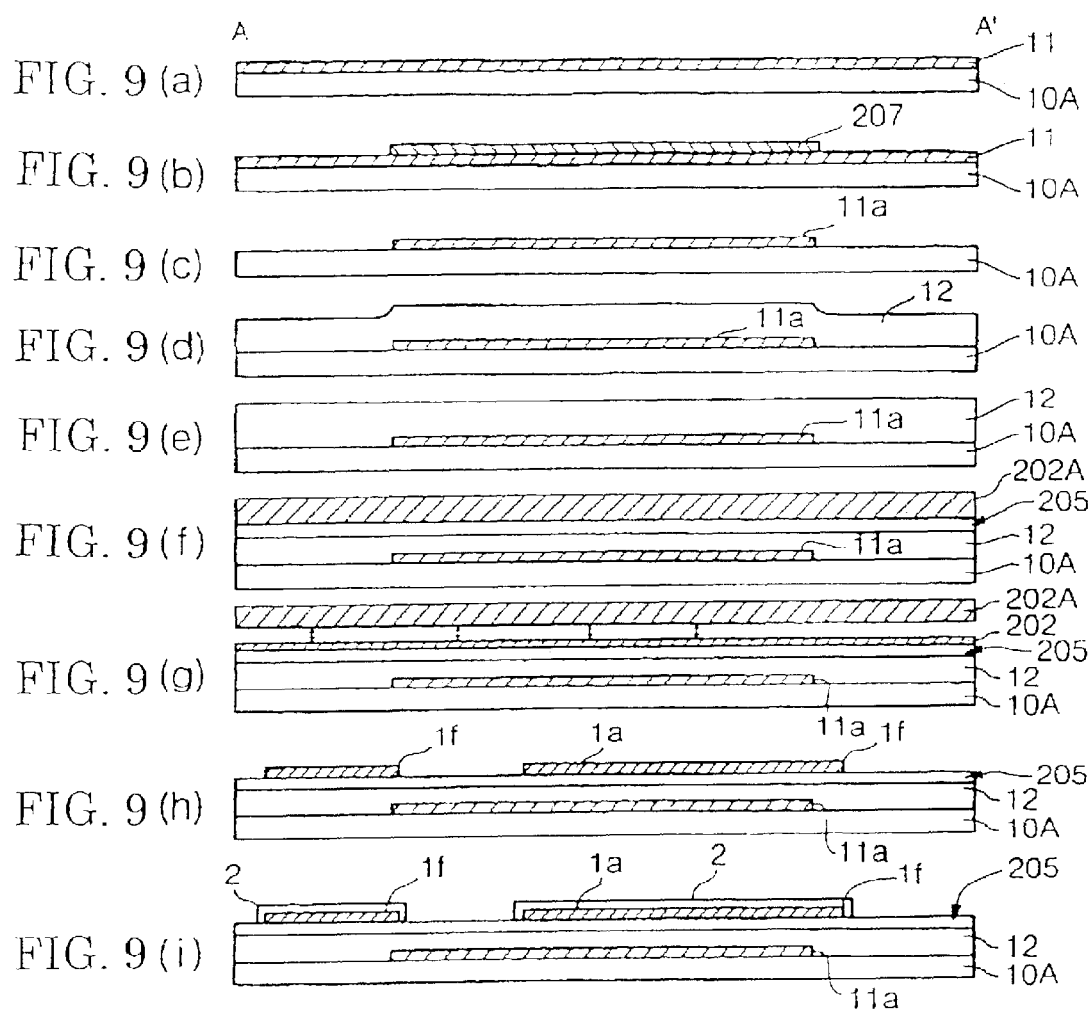
FIG. 9(a) to FIG. 9(i) are process views showing a method of manufacturing the element substrate of the embodiment according to the present invention.
Figure 10:
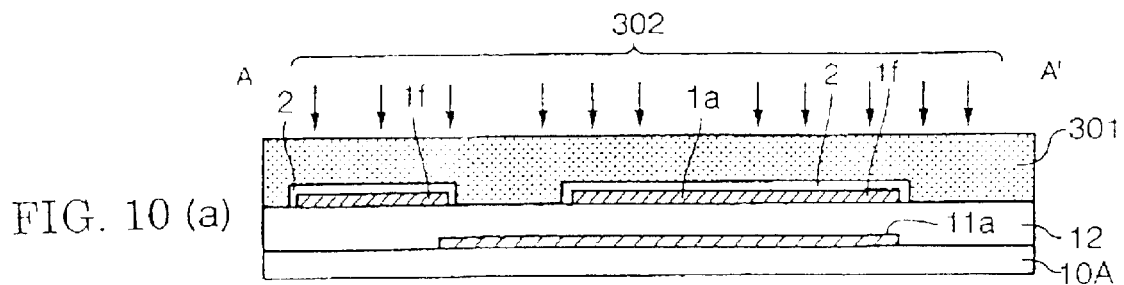
FIG. 10(a) to FIG. 10(d) are process views showing a method of manufacturing the element substrate of the embodiment according to the present invention.
Figure 10:
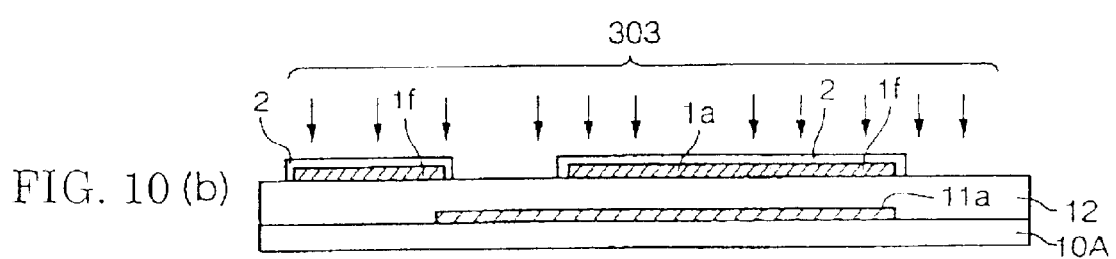
Figure 10:
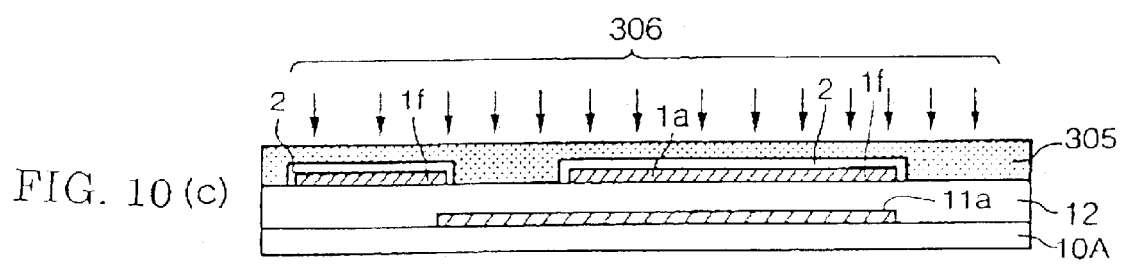
Figure 10:
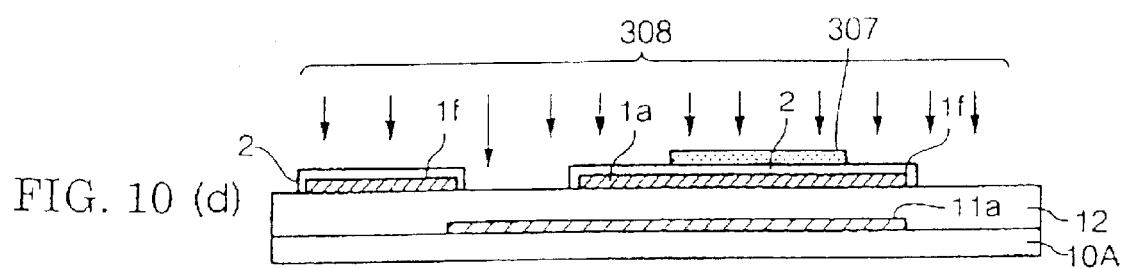
Figure 11:
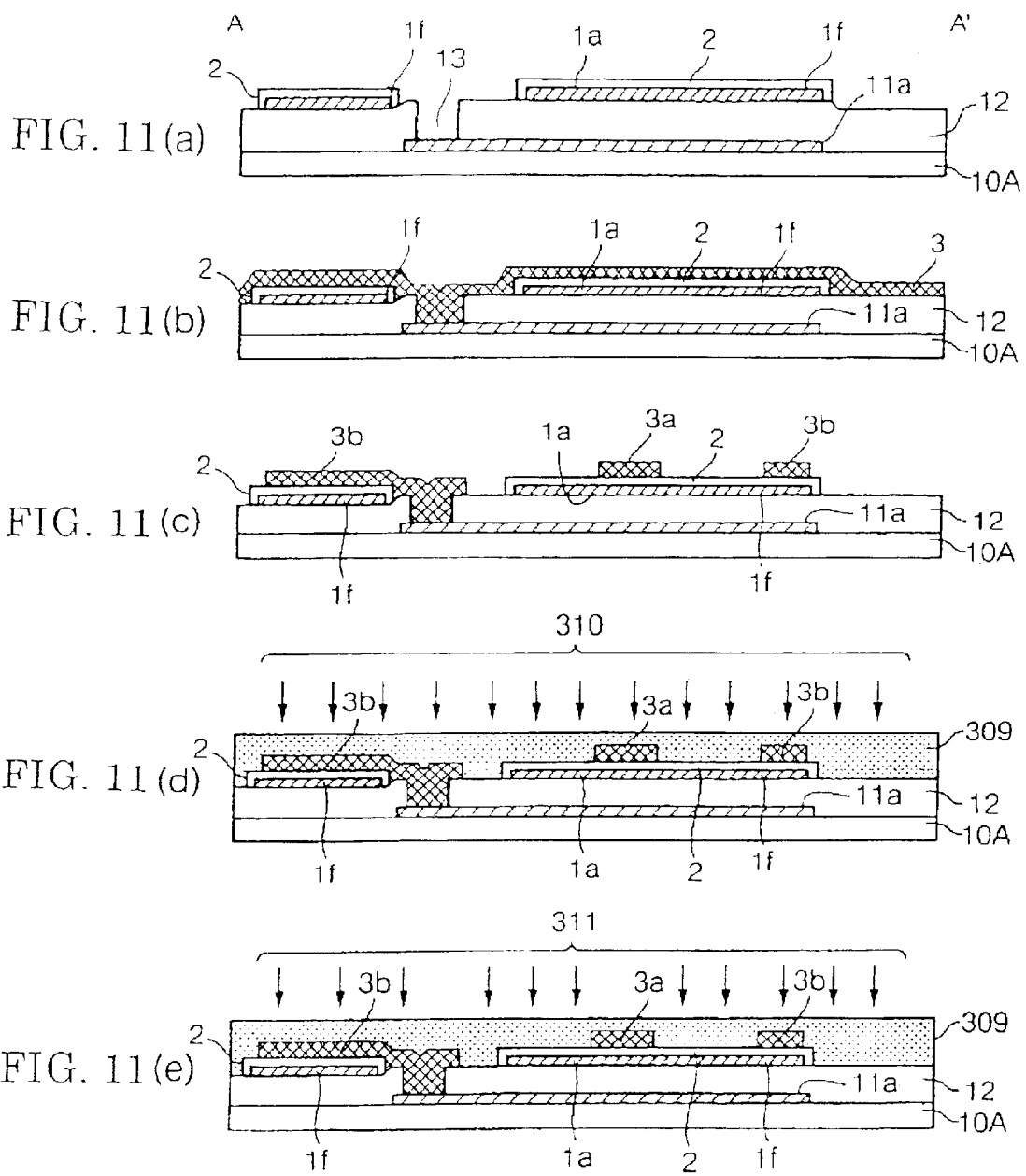
FIG. 11(a) to FIG. 11(e) are process views showing a method of manufacturing the element substrate of the embodiment according to the present invention.
Figure 12:
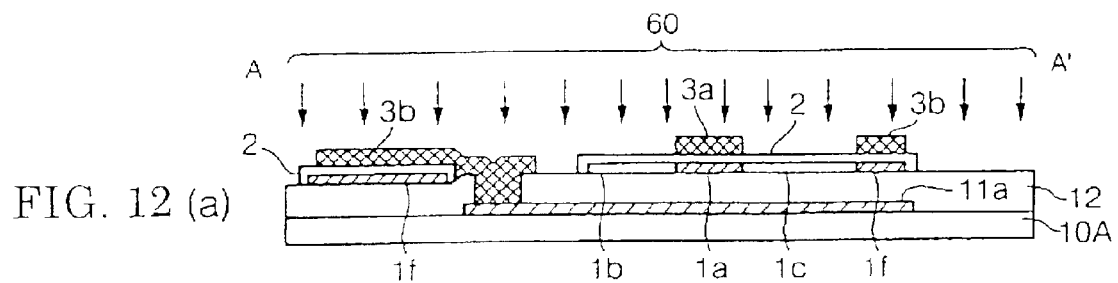
FIG. 12(a) to FIG. 12(d) are process views showing a method of manufacturing the element substrate of the embodiment according to the present invention.
Figure 12:
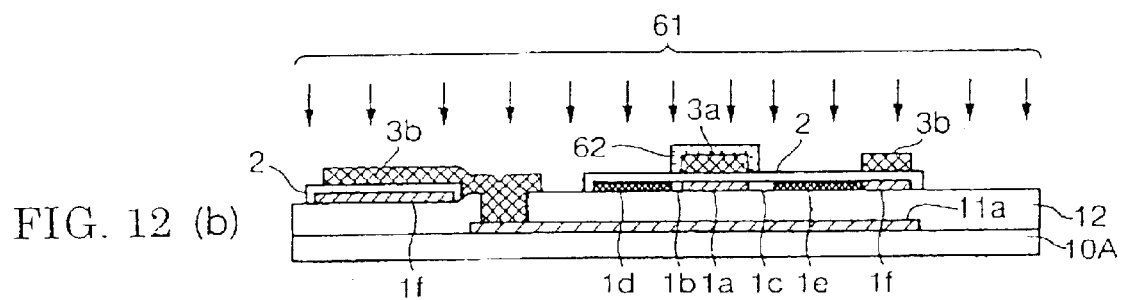
Figure 12:
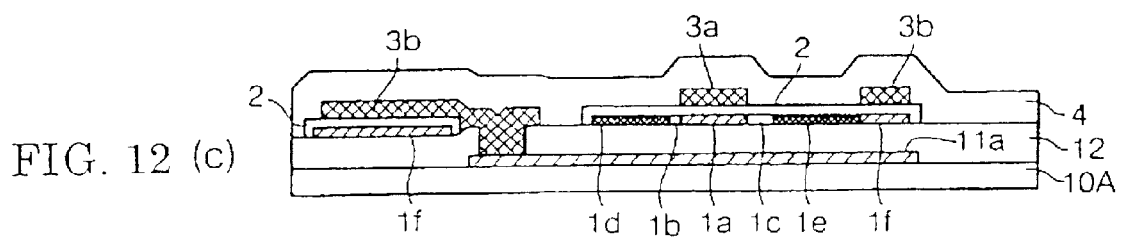
Figure 12:
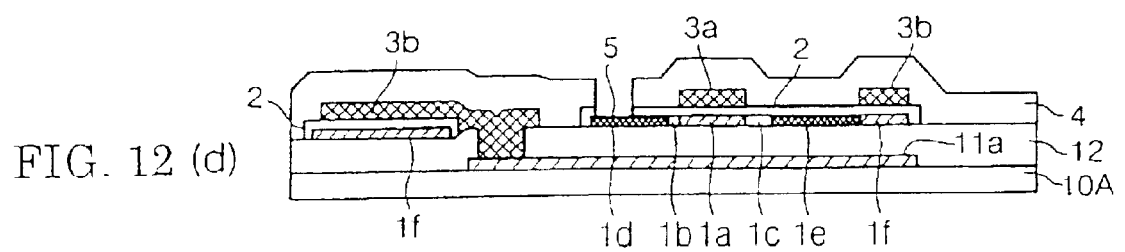
Figure 13:
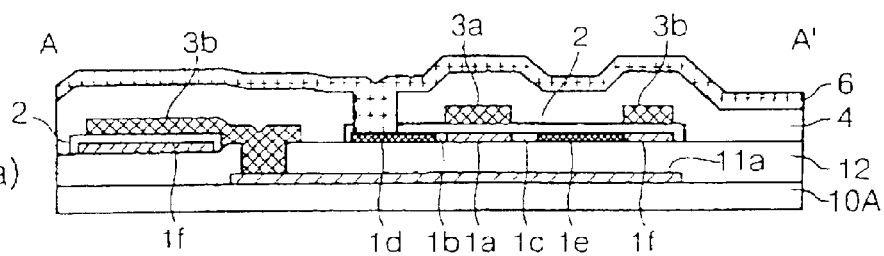
FIG. 13(a) to FIG. 13(c) are process viewers showing a method of manufacturing the element substrate of the embodiment according to the present invention.
Figure 13:
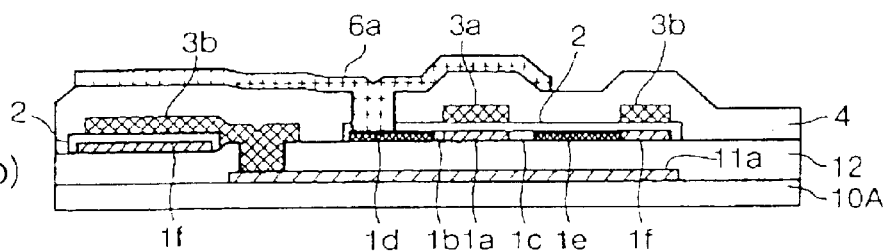
Figure 13:
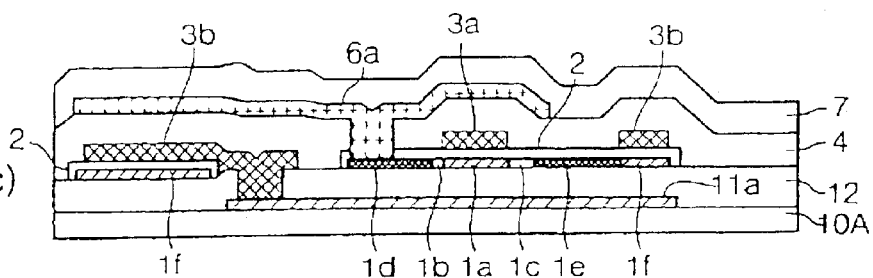
Figure 14:
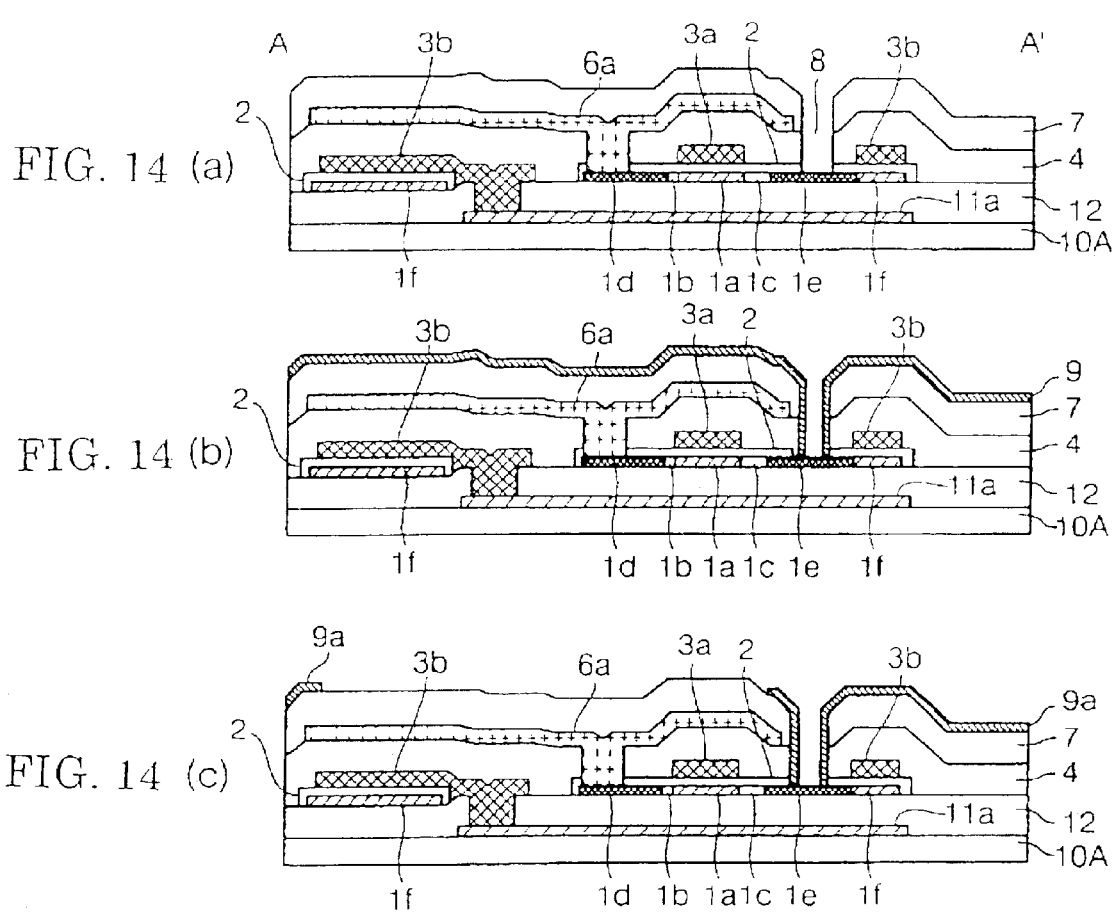
FIG. 14(a) to FIG. 14(c) are process views showing a method of manufacturing the element substrate of the embodiment according to the present invention.

In FIG. 6 to FIG. 8, a TFT 30 (transistor element) is provided with a semiconductor layer 1a comprising, for example, the single crystal silicon layer. Also, in FIG. 6 to FIG. 8, the same constitutional elements as those in FIG. 1 or FIG. 5 carry the same reference numerals, and their explanations are omitted. By the way, in FIG. 6 to FIG. 8, a scale is different for each layer and each member so that each layer and each member have the size at which they can be recognized on the drawing.

In FIG. 6, the plurality of pixels configured in the form of matrix, which constitute the pixel portion of the liquid crystal device, are provided with: a plurality of pixel electrodes 9a configured in a form of matrix; and a plurality of TFTs 30 for controlling the pixel electrodes 9a respectively. A data line 6a to which a image signal is sent is electrically connected to a source of the TFT 30. Video signals S1, S2 to Sn written on the data lines 6a may be sequentially sent in this order, or may be sent to the plurality of data lines 6a adjacent to each other, for each group. Also, a scanning line 3a is electrically connected to a gate of the TFT 30. At a predetermined timing, scanning signals G1, G2 to Gm are applied to the scanning lines 3a as pulses at a predetermined timing in this order.

The pixel electrode 9a is electrically connected to a drain of the TFT 30. By closing the switch of the TFT 30 serving as one example of a switching element only for a certain time period, the image signals S1, S2 to Sn sent from the data lines 6a are written at a predetermined timing. The image signals S1, S2 to Sn of a predetermined level written through the pixel electrodes 9a to the liquid crystal are held for a certain time period between a later-described opposite electrode formed on a later-described opposite substrate and the pixel electrodes 9a.

In the liquid crystal, since an order and an orientation of a molecular set are changed on the basis of an applied voltage level, a light can be modulated to thereby attain a gradation display. A normally white mode disables an input light to be passed through this liquid crystal portion, depending on an applied voltage. A normally black mode enables the input light to be passed through this liquid crystal portion, depending on the applied voltage. A light having a contrast based on a image signal is outputted from the liquid crystal device, as a whole.

Here, in order to prevent the kept image signal from being leaked, an storage capacitor 70 is added in parallel to a liquid crystal capacitance generated between the pixel electrode 9a and the opposite electrode. For example, a volt-age of the pixel electrode 9a is kept by the storage capacitor 70 for a period longer by three digits than a period while a voltage is applied to the data line 6. Thus, it is possible to attain the liquid crystal device in which the kept property is further improved and a contrast ratio is high. In this embodiment, especially, a capacitance line 3b in which a resistance is dropped by using a conductive light shield film or by using the same layer as the scanning line 3a as described later, is disposed in order to form such an storage capacitor 70.

The flat plane structure within the pixel portion (in the image display region) of the element substrate will be described below in detail with reference to FIG. 7. As shown in FIG. 7, a plurality of transparent pixel electrodes 9a (each outline is denoted by a dashed line portion 9a') in a form of matrix are disposed within the pixel portion on the element substrate of the liquid crystal device. A data line 6a, a scanning line 3a and a capacitance line 3b are disposed along the vertical and horizontal boundaries of the pixel electrode 9a, respectively. The data line 6a is electrically connected through a contact hole 5 to a later-described source region of a semiconductor layer 1a of the single crystal silicon layer. The pixel electrode 9a is electrically connected through a contact hole 8 to a later-described drain region of the semiconductor layer 1a. Also, the scanning line 3a is placed so as to be opposite to a channel region (which is indicated as a right downward slant line region of FIG. 7) of the semiconductor layer 1a, and the scanning line 3a functions as a gate electrode.

The capacitance line 3b is provided with: a main line portion substantially straightly extending along the scanning line 3a (namely, a first region formed along the scanning line 3a, when viewed as a flat plane); and a protrusion portion protruding to a former stage (i.e., an upward direction of FIG. 7) along the data line 6a from a portion crossing the data line 6a (namely, a second region extendedly disposed along the data line 6a, when viewed as a flat plane).

Then, a plurality of first light shield films 11a are disposed in a region represented by a right upward slant line portion of FIG. 7. Actually, each of the first light shield film 11a is disposed at an area covering the TFT including the channel region of the semiconductor layer 1a in the pixel portion when it is viewed from the substrate main body side of the element substrate. Moreover, the first light shield film 11a is provided with: a main line portion straightly extending along the scanning line 3a, oppositely to the main line portion of the capacitance line 3b; and a protrusion portion protruding to an adjacent stage (i.e., a downward direction of FIG. 7) along the data line 6a from a portion crossing the data line 6a. The tip of the downward protrusion portion in each stage (pixel line) of the first light shield film 11a overlaps with the tip of the upward protrusion portion of the capacitance line 3b in the next stage under the data line 6a.

In this overlap portion, a contact hole 13 is made where the first light shield film 11a and the capacitance line 3b are electrically connected to each other. That is, in this embodiment, the first light shield film 11a is electrically connected through the contact hole 13 to the capacitance line 3b at the former stage or the latter stage.

Next, the sectional structure within the pixel portion of the liquid crystal device will be described below with reference to FIG. 8 As shown in FIG. 8, a liquid crystal layer (i.e., an electro-optical material layer) 50 is sandwiched between an element substrate 10 and an opposite substrate 20 placed opposite to the element substrate 10, in the liquid crystal device.

The element substrate 10 is mainly provided with: a substrate main body (i.e., the support substrate) 10A made of optically transparent substrate, such as silicon, quartz, glass or the like; a pixel electrode 9a formed at the surface of the liquid crystal layer 50; a pixel switching TFT (transistor element) 30; and an alignment film 16. The opposite substrate 20 is mainly provided with: a substrate main body 20A made of an optically transparent substrate, such as transparent glass, quartz or the like; an opposite electrode (common electrode) 21 formed at the surface of the liquid crystal layer 50; and an alignment film 22.

The pixel electrode 9a is disposed at the surface of the liquid crystal layer 50 of the substrate main body 10A of the element substrate 10. The alignment film 16 onto which a predetermined alignment process, such as a rubbing process and the like, is applied is formed at the side of the liquid crystal layer 50. The pixel switching TFT 30 for performing the switching control for each pixel electrode 9a is formed at a position adjacent to each pixel electrode 9a. The pixel electrode 9a comprises a transparent conductive thin film, for example, such as ITO (Indium Tin Oxide) or the like, and the alignment film 16 comprises an organic thin film, for example, such as polyimide.

Immediately on the substrate main body 10A of the element substrate 10 (on the surface at the side of the liquid crystal layer 50), the first light shield film 11a is formed at the position corresponding to each pixel switching TFT 30.

In this embodiment, the first light shield film 11a is formed on the element substrate 10, as mentioned above. Thus, it is possible to prevent the return light from the side of the element substrate 10 and the like from being inputted to LDD regions 1b and 1c and a channel region 1a' of the pixel switching TFT 30, and thereby possible to prevent the deterioration in the property of the pixel switching TFT 30 as the transistor element caused by the generation of the optical current.

Over the entire surface of the substrate main body 10A, on the surface of the first light shield film 11a, in order to electrically insulate the semiconductor layer 1a constituting the pixel switching TFT 30 from the first light shield film 11a and also flatten the surface of the substrate main body 10A on which the first light shield film 11a is formed, the first inter-layer insulation film 12 is formed which is composed of a silicate glass film, such as NSG (Non-doped Silicate Glass), PSG (Phosphorus Silicate Glass), BSG (Boron Silicate Glass) and BPSG (Boron Phosphorus Silicate Glass) etc., a silicon nitride film, a silicon oxide film or the like. The insulation portion 205 comprising the first silicon oxide film 203B, the silicon nitride film or silicon nitride oxide film 204 and the second silicon oxide film 203A is further formed on the surface of the first inter-layer insulation film 12. The pixel switching TFT 30 is formed on the surface of the insulation portion 205. The TFT 30 is formed on the surface of the insulation portion 205, and it has the semiconductor layer 1a composed of the single crystal silicon layer.

By the way, the structure of the insulation portion 205 is equal to that of the insulation portion 205 of the above-mentioned SOI substrate 200 and the element substrate 210 except the structure that the contact hole 13 is open. So, the explanation thereof is omitted.

On the other hand, the opposite electrode (common electrode) 21 is disposed over the entire surface, at the side of the liquid crystal layer 50 of the substrate main body 20A of the opposite substrate 20. The alignment film 22 on which the predetermined alignment process, such as the rubbing process and the like, is applied is formed at the side of the liquid crystal layer 50. The opposite electrode 21 comprises a transparent conductive thin film, for example, such as ITO and the like. The alignment film 22 comprises an organic thin film, for example, such as polyimide.

Also, on the surface of the liquid crystal layer 50 of the substrate main body 20A, a second light shield film 23 is further formed in a region except the open region of each pixel portion, as shown in FIG. 8. Such formation of the second light shield film 23 on the side of the opposite substrate 20 can prevent the input light from the side of the opposite substrate 20 from inputting into the LDD (Lightly Doped Drain) regions 1b and 1c and the channel region 1a' of the semiconductor layer 1a of the pixel switching TFT 30, to thereby improve the contrast.

Between the opposite substrate 20 and the element substrate 10 which are configured as mentioned above in such a manner that the pixel electrode 9a and the opposite electrode 21 are opposite to each other, the liquid crystal (i.e., the electro-optical material) is sealed in the space, surrounded by a seal member (not shown) formed between the circumference portion of both the substrates, so that a liquid crystal layer 50 (i.e., an electro-optical material layer) is formed therebetween.

The liquid crystal layer 50 is constituted by, for example, the liquid crystal in which one or several kinds of nematic liquid crystals are mixed. A predetermined alignment condition is defined by the alignment films 16 and 22 at a state that an electric field is not applied from the pixel electrode 9a.

The seal member is made of adhesive, for example, such as photo-curing adhesive, thermosetting adhesive or the like, for laminating the element substrate 10 and the opposite substrate 20 to each other around their circumference portions. Spacers comprising glass fibers, glass beads and the like may be mixed within the seal member, in order to set a distance between both the substrates at a predetermined value.

Also, in this embodiment, the gate insulation film 2 is extendedly formed from a position opposite to the scanning line 3a, and it is used as a dielectric film for the storage capacitor 70. The semiconductor layer 1a is extendedly formed, and it is used as a first storage capacitance electrode 1f for the storage capacitor 70. Moreover, a part of the capacitance line 3b opposite to the first capacitance electrode if is used as a second storage capacitance electrode. Accordingly, the storage capacitor 70 is configured.

In detail, a high concentration drain region le of the semiconductor layer 1a is extendedly formed under the data line 6a and the scanning line 3a, and it is oppositely formed through the insulation film 2 in the portion of the capacitance line 3b similarly extending along the data line 6a and the scanning line 3a. Thus, the first storage capacitance electrode (made of the semiconductor layer) if is provided. Especially, since the insulation film 2 serving as the dielectric film of the storage capacitor 70 is the gate insulation film 2 itself of the TFT 30 formed on the single crystal silicon layer by the high temperature oxidization, it can be formed as a thin insulation film having a high-voltage-proof property so that the storage capacitor 70 can be configured as having a relatively small area and a large capacitance.

Moreover, in the storage capacitor 70, as can be evident from FIG. 7 and FIG. 8, the first light shield film 11a is oppositely disposed as a third storage capacitance electrode to the first storage capacitance electrode if through the first inter-layer insulation film 12, on the side opposite to the capacitance line 3b as the second storage capacitance electrode (refer to a portion of the storage capacitor 70 at the right, side of FIG. 8), to thereby further provide the storage capacitance. That is, in this embodiment, a double storage capacitance structure is realized in which the storage capacitances are formed at both the sides facing each other with the first storage capacitance electrode if therebetween, to thereby further increase the storage capacitance. Such a structure can improve the function of preventing the flicker and the burning in the display picture of the liquid crystal device in this embodiment.

As a result, the space departing from the open region, such as the region in which the discrimination of the liquid crystal is induced along the scanning line 3a and the region under the data line 6a (namely, the region in which the capacitance line 3b is formed) can be effectively used to increase the storage capacitance for the pixel electrode 9a.

In this embodiment, the first light shield film 11a (and the capacitance line 3b electrically connected thereto) is electrically connected to a constant potential source, and the first light shield film 11a and the capacitance line 3b are designed so as to be at a constant potential. Thus, it is possible to prevent the potential variation in the first light shield film 11a from giving a bad influence onto the pixel switching TFT 30 disposed opposite to the first light shield film 11a. Also, the capacitance line 3b can excellently function as the second storage capacitance electrode of the storage capacitor 70.

As shown in FIG. 7 and FIG. 8, this embodiment is designed such that the first light shield film 11a is electrically connected through the contact hole 13 to the capacitance line 3b at the former stage or the latter stage, in addition to the formation of the first light shield film 11a on the element substrate 10. In the case of such a configuration, as compared with the case in which each first light shield film 11a is electrically connected to the capacitance line of the self-stage, the stage difference is slight between another region and the region in which the capacitance line 3b and the first light shield film 11a are formed while overlapping with the data line 6a, along the edge of the open region of the pixel portion. If the stage difference along the edge of the open region of the pixel portion is slight as mentioned above, the discrination (i.e., the orientation defect) in the liquid crystal caused due to the stage difference can be suppressed, so that it becomes possible to widen the open region of the pixel portion.

In the first light shield film 11a, the contact hole 13 is made in the protrusion portion thereof protruding from the main line portion straightly extending as mentioned above. Here, as the open position for the contact hole 13 is the closer to the edge, a crack is the harder to be induced due to the easier dispersion of stress from the edge, and other reasons. Thus, the stress applied to the first light shield film 11a during the manufacturing process is relaxed depending on how close the contact hole 13 is made to the tip of the protrusion portion (preferably, depending on how close to the tip almost to the margin). The crack can be further effectively prevented to thereby improve the yield.

Also, the capacitance line 3b and the scanning line 3a are composed of the same poly-silicon film. The dielectric film of the storage capacitor 70 and the gate insulation film 2 of the TFT 30 are composed of the same high temperature oxidization film. The first storage capacitance electrode 1f, the channel formation region 1a and the source region 1d and the drain region 1e of the TFT 30 and the like are composed of the same semiconductor layer 1a. Thus, it is possible to simplify the lamination structure formed on the surface of the substrate main body 10A of the element substrate 10. Moreover, in a later-described method of manufacturing a liquid crystal device, it is possible to simultaneously form the capacitance line 3b and the scanning line 3a at the same thin film forming process, and also possible to simultaneously form the gate insulation film 2 and the dielectric film of the storage capacitor 70.

The capacitance line 3b and the first light shield film 11a are electrically connected to each other through the contact hole 13 made in the first inter-layer insulation film 12 under the sure and high reliability. Such a contact hole 13 may be made for each pixel, or may be made for each pixel group composed of a plurality of pixels.

Such a contact hole 13 made for each pixel or each pixel group is made below the data line 6a when it is viewed from the side of the opposite substrate 20. Thus, the contact hole 13 is away from the open region of each pixel portion. Moreover, it is made in the portion of the first inter-layer insulation film 12 where the TFT 30 or the first storage capacitance electrode If is not formed Hence, it is possible to effectively use the pixel portion and also prevent the deterioration in the TFT 30, another wiring or the like, due to the contact hole 13.

Figure 3:
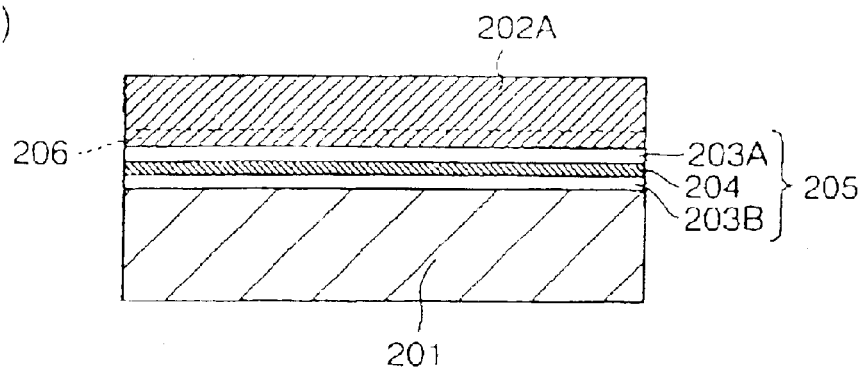
FIG. 3(a) to FIG. 3(c) are process views showing the method of manufacturing the SOI substrate of the embodiment according to the present invention.
Figure 3:
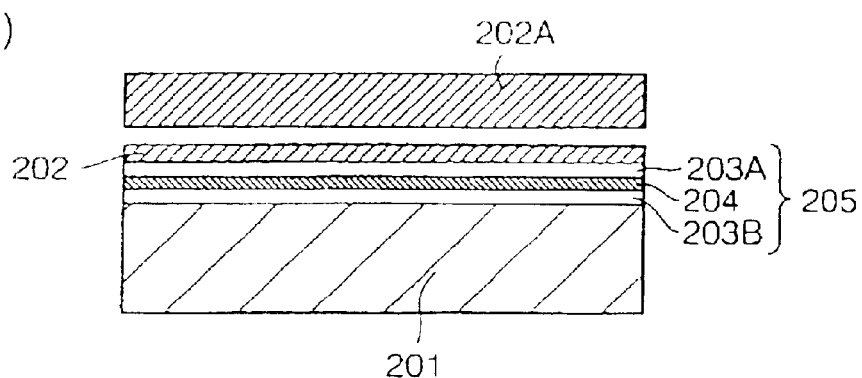
Figure 3:
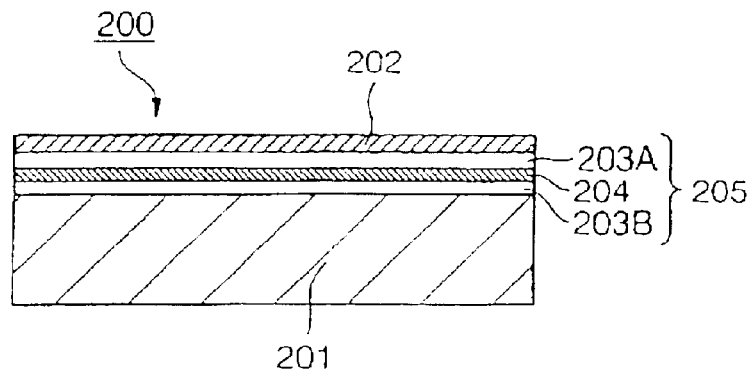

Also, in FIG. 3, the pixel switching TFT 30 has the LDD (Lightly Doped Drain) structure, and it is provided with: the scanning line 3a; the channel region 1a' of the semiconductor layer 1a in which the channel is formed by the electric field from the scanning line 3a; the gate insulation film 2 for insulating the scanning line 3a and the semiconductor layer 1a; the data line 6a; a low concentration source region (source side LDD region) 1b and a low concentration drain region (drain side LDD region) 1c of the semiconductor layer 1a; and a high concentration source region 1d and a high concentration drain region le of the semiconductor layer 1a.

The high concentration drain region le is connected to a corresponding pixel electrode 9a among a plurality of pixel electrodes 9a. The source regions 1b and 1d and the drain regions 1c and 1e are formed by doping an N-type or P-type dopant of a predetermined concentration, depending on whether an N-type or P-type channel is formed, on the semiconductor layer 1a, as described later. The N-type channel TFT has a merit of a fast operation speed, so that it is often used as the pixel switching TFT 30 serving as the switching element of the pixel.

The data line 6a is composed of the thin film having a light shield property, such as a metallic film of Al and the like, an alloy film of a metallic silicide or the like. Also, a second inter-layer insulation film 4 in which a contact hole 5 linked to the high concentration source region 1d and a contact hole 8 linked to the high concentration drain region 1e are formed, respectively, is formed on the scanning line 3a, the gate insulation film 2 and the first inter-layer insulation film 12. Through the contact hole 5 to this source region 1b, the data line 6a is electrically connected to the high concentration source region 1d.

Moreover, a third inter-layer insulation film 7 in which the contact hole 8 to the high concentration drain region 1e is made is formed on the data line 6a and the second inter-layer insulation film 4. Through the contact hole 8 to this high concentration drain region 1e, the pixel electrode 9a is electrically connected to the high concentration drain region 1e. The above-mentioned pixel electrode 9a is disposed on the surface of the third inter-layer insulation film 7 having such a configuration. By the way, the pixel electrode 9a and the high concentration drain region 1e may be electrically connected to each other via the same poly-silicon film as the capacitance line 3b or the same Al film as the data line 6a as an intermediate layer.

The pixel switching TFT 30 may preferably have the above LDD structure. However, it may have an offset structure in which impurity ions are not implanted into the low concentration source region 1b or the low concentration drain region 1c. Alternatively, it may have a self-alignment type TFT in which the impurities ions are implanted at a high concentration with the gate electrode (scanning line 3a) as a mask, and the high concentration source and drain regions are formed in the self-aligned manner.

The present embodiment is configured as having the single gate structure in which only one gate electrode (scanning line 3a) of the pixel switching TFT 30 is disposed between the source region 1b and the drain region 1e. However, two or more gate electrodes may be disposed between them. At this time, the same signal is designed to be applied to the respective gate electrodes in series. The above-mentioned configuration of the TFT composed of the double, triple or more gates can prevent the leak current in the source drain region junction and the channel. Thus, it is possible to drop the current at an off time. If at least one of those gate electrodes is configured as the LDD structure or the offset structure, the off current can be further dropped to thereby obtain the stable switching element.

Here, typically, in the single crystal silicon layer constituting the channel region 1a', the low concentration source region 1b and the low concentration drain region 1c of the semiconductor layer 1a and the like, a light current is generally generated by the photo-electric effect of the silicon when the input light is inputted, which results in the deterioration in the transistor property of the pixel switching TFT 30. However, in this embodiment, the data line 6a is composed of the metallic thin film having the light shield property, such as Al or the like, so as to cover the scanning line 3a from above. Hence, it is possible to prevent the input light from being inputted to at least the channel region 1a' and the LDD regions 1b and 1c of the semiconductor layer 1a.

Also, as mentioned above, the first light shield film 11a is formed at the lower side (at the side of the substrate main body 10A) of the pixel switching TFT 30. Thus, it is possible to prevent the return light from being inputted to at least the channel region 1a' and the LDD regions 1b and 1c of the semiconductor layer 1a.

By the way, in this embodiment, since the first light shield film 11a and the capacitance line 3b disposed for the pixel at the former stage or the latter stage of the first light shield film 11a, which are adjacent to each other, are connected to each other, the capacitance line 3b to supply a constant potential to the first light shield film 11a for the pixel at the top stage or the bottom stage is required. So, the number of capacitance lines 3b is set to be one more than the number of vertical pixels.

(Method of Manufacturing Electro-Optical Apparatus)

The method of manufacturing the liquid crystal device having the above-mentioned structure will be described below.

At first, as the method of manufacturing the element substrate of the embodiment according to the present invention, the method of manufacturing the element substrate 10 will be described below with reference to FIG. 9(a) to FIG. 14(c). By the way, FIG. 9(a) to FIG. 14(c) are the process views each showing a part of the element substrate in respective one of the processes, correspondingly to the section taken on the line A–A' of FIG. 7, similarly to FIG. 8. Also, in FIGS. 10(a) to 14(c), the illustration of the insulation portion 205 is omitted in order to simplify the drawing.

At first, the substrate main body (corresponding to the support substrate) 10A, such as a silicon substrate, a quartz substrate, a glass substrate or the like, is prepared. Here, an annealing process is applied preferably at a temperature of about 850 to 1300° C. under an inactive gas atmosphere of $N_2$ (nitrogen) or the like, further preferably at a high temperature of 1000° C. Namely, a preliminary process is carried out so as to suppress the distortion occurring in the substrate main body 10A in a high temperature process to be performed later. In other words, correspondingly to the maximum temperature at which it is treated in the manufacturing process, a heat treatment is performed with respect the substrate main body 10A at the same or higher temperature.

As shown in FIG. 9(a), a light shield layer 11 having a film thickness of about 100 to 500 nm, preferably, a film thickness of about 200 nm is formed on the entire surface of the thus heat treated substrate main body 10A by a sputtering method, to include the metal, the metallic silicide, the metallic alloy film comprising Ti, Cr, W, Ta, Mo, Pd or the like.

Next, as shown in FIG. 9(b), a photo resist 207 corresponding to the pattern (refer to FIG. 7) of the first light shield film 11a is formed by a photo-lithography.

Next, as shown in FIG. 9(c), the light shield layer 11 is etched through the photo resist 207 to thereby form the first light shield film 11a having the pattern shown in FIG. 7.

Next, as shown in FIG. 9(d), the first inter-layer insulation film 12 made of a silicate glass film such as NSG, PSG, BSG, BPSG or the like, a silicon nitride film, a silicon oxide film or the like is formed on the first light shield film 11a, for example, by using TEOS (tetra ethyl ortho silicate) gas, TEB (tetra ethyl boatrate) gas, TMOP (tetra methyl oxy fosrate) gas and the like, by means of a normal pressure or decompression CVD method. The film thickness of the first inter-layer insulation film 12 is set at, for example, about 400 to 1000 nm, preferably, about 800 nm.

Next, as shown in FIG. 9(e), the entire surface of the first inter-layer insulation film 12 is polished and flattened by using a CMP (chemically mechanically polishing) method or the like.

Next, as shown in FIG. 9(f), the laminating operation is carried out between (i) the substrate main body 10A shown in FIG. 9(e) on which the first inter-layer insulation film 12 having the flattened surface is formed and (ii) the single crystal silicon substrate 202A in which the insulation portion 205 comprising the first silicon oxide film 203B, the silicon nitride film or silicon nitride oxide film 204 and the second silicon oxide film 203A are formed on the surface.

Then, as shown in FIG. 9(g), the single crystal silicon layer 202 of a thin film is left on the surface of the substrate main body 10A, and most of the single crystal silicon substrate 202A is stripped off.

By the way, the method of forming the insulation portion 205 on the surface of the single crystal silicon substrate 202A, the method of laminating the substrate main body 10A and the single crystal silicon substrate 202A in which the insulation portion 205 is formed on the surface, and the method of stripping off the single crystal silicon substrate 202A were described in detail in the above-mentioned method of manufacturing the SOI substrate 200. Thus, their explanations are omitted.

Next, as shown in FIG. 9(h), the single crystal silicon layer 202 is formed at a predetermined pattern by using a photo-lithography process, an etching process and the like. Accordingly, the semiconductor layer 1a having the predetermined pattern is formed as shown in FIG. 7. That is, the first storage capacitance electrode if extendedly disposed from the semiconductor layer 1a constituting the pixel switching TFT 30 is especially formed in the region in which the capacitance line 3b is formed under the data line 6a and the region in which the capacitance line 3b is formed along the scanning line 3a.

Next, as shown in FIG. 9(i), the first storage capacitance electrode if together with the semiconductor layer 1a constituting the pixel switching TFT 30 is thermally oxidized at a temperature of about 850 to 1300° C., preferably, at a temperature of about 1000° C. for about 72 minutes.

Accordingly, a thermally oxidized silicon film is formed which has a relatively thin thickness of about 60 nm, and a gate insulation film 2 to constitute the capacitance is formed together with the gate insulation film 2 of the pixel switching TFT 30. As a result, the thicknesses of the semiconductor layer 1a and the first storage capacitance electrode if are about 30 to 170 nm, and a thickness of the gate insulation film 2 is about 60 nm.

Next, as shown in FIG. 10(a), a resist film 301 is formed in an area corresponding to an N-channel semiconductor layer 1a, and the dopant 302 of a V-family element such as P or the like is doped at a low concentration (for example, P ions at an acceleration voltage of 70 keV and a dose amount of $2 \times 10^{11}/cm^2$).

Next, as shown in FIG. 10(b), the resist film is formed in an area corresponding to a P-channel semiconductor layer 1a (not shown), and the dopant 303 of a III-family element such as B and or like is doped at a low concentration (for example, B ions at an acceleration voltage of 35 keV and a dose amount of $1 \times 10^{12}/cm^2$).

Next, as shown in FIG. 10(c), a resist film 305 is formed on the surface of the substrate 10 except the end of the channel region 1a' of each semiconductor layer 1a for each P-channel and each N-channel. Then, for the P-channel, the dopant 306 of the V-family element such as P or the like is doped at a dose amount equal to about one to ten times that of the process shown in FIG. 10(a). For the N-channel, the dopant 306 of the III-family element such as B or the like is doped at a dose amount equal to about one to ten times that of the process shown in FIG. 10(b).

Next, as shown in FIG. 10(d), in order to drop the resistance of the first storage capacitance electrode if extendedly constituted by the semiconductor layer 1a, a resist film 307 (which is wider than the scanning line 3a) is formed in an area corresponding to the scanning line 3a (gate electrode) on the surface of the substrate main body 10A. This is used as a mask, and the dopant 308 of the V-family element such as P or the like is doped at a low concentration (for example, the P ions at an acceleration voltage of 70 keV and a dose amount of $3 \times 10^{14}/cm^2$).

Next, as shown in FIG. 11(a), the contact hole 13 linked to the first light shield film 11a is formed in the first inter-layer insulation film 12 and the insulation portion 205 (not shown) by a dry etching, such as a reactive etching, a reactive ion beam etching or the like, or a wet etching. At this time, the method of making the contact hole 13 or the like by using the anisotropic etching such as the reactive etching or the reactive ion beam etching provides a merit that an open shape can be substantially equal to a mask shape. However, if the contact hole 13 is formed by the combination of the dry etching and the wet etching, the contact hole 13 can be tapered. Hence, this provides a merit that a disconnection when a wiring is connected can be prevented.

Next, as shown in FIG. 11(b), after a poly-silicon layer 3 is deposited at a thickness of about 350 nm by using the decompression CVD method or the like, phosphorous (P) is thermally diffused to thereby make the poly-silicon film 3 electrically conductive. Or, it is allowable to use the doped silicon film in which the P ion is implanted simultaneously with the film formation of the poly-silicon film 3. Hence, it is possible to make the conductive property of the poly-silicon layer 3 higher.

Next, as shown in FIG. 11(c), the capacitance line 3b together with the scanning line 3a having the predetermined pattern shown in FIG. 7 is formed by the photo-lithography process using the resist mask, the etching process and the like. After that, the poly-silicon remaining on the rear of the substrate main body 10A is removed by the etching after the surface of the substrate main body 10A is covered by the resist film.

Next, as shown in FIG. 11(d), in order to form a P-channel LDD region in the semiconductor layer 1a, an area corresponding to an N-channel semiconductor layer 1a is covered by a resist film 309. The scanning line 3a (gate electrode) is used as a diffusion mask. Then, the dopant 310 of the III-family element such as B or the like is firstly doped at a low concentration (for example, $BF_2$ ions at an acceleration voltage of 90 keV and a dose amount of $3\times10^{13}/cm^2$), and the low concentration source region 1b of the P-channel and the low concentration drain region 1c are formed.

In succession, as shown in FIG. 11(e), in order to form the high concentration source region 1d of the P-channel and the high concentration drain region 1e in the semiconductor layer 1a, in the condition that the position corresponding to the N-channel semiconductor layer 1a is covered by the resist film 309 and that a resist layer is formed on the scanning line 3a corresponding to the P-channel with a mask that is wider than the scanning line 3a (not shown), the dopant 311 of the III-family element such as B or the like is similarly doped at a high concentration (for example, $BF_2$ ions at an acceleration voltage of 90 keV and a dose amount of $2\times10^{15}/cm^2$).

Next, as shown in FIG. 12(a), in order to form an N-channel LDD region in the semiconductor layer 1a, an area corresponding to a P-channel semiconductor layer 1a is covered by a resist film (not shown). The scanning line 3a (gate electrode) is used as a diffusion mask. Then, the dopant 60 of the V-family element such as P or the like is doped at a low concentration (for example, P ions at an acceleration voltage of 70 keV and a dose amount of $6\times10^{12}/cm^2$), and the low concentration source region 1b of the N-channel and the low concentration drain region 1c are formed.

In succession, as shown in FIG. 12(b), in order to form the high concentration source region 1d of an N-channel and the high concentration drain region 1e in the semiconductor layer 1a, a resist layer 62 is formed on the scanning line 3a corresponding to the N-channel with a mask that is wider than the scanning line 3a. Then, the dopant 61 of the V-family element such as P or the like is similarly doped at a high concentration (for example, P ions at an acceleration voltage of 70 keV and a dose amount of $4\times10^{15}/cm^2$).

Next, as shown in FIG. 12(c), so as to cover the scanning line 3a and the capacitance line 3b together with the scanning line 3a in the pixel switching TFT 30, for example, the normal pressure or decompression CVD method, TEOS gas or the like is used to form the second inter-layer insulation film 4 comprising a silicate glass film such as NSG, PSG, BSG, BPSG and the like, a silicon nitride film, a silicon oxide film or the like. A film thickness of the second inter-layer insulation film 4 is desired to be about 500 to 1500 nm, and it is further desired to be about 800 nm.

After that, an annealing process of about 850° C. is carried out for about 20 minutes, in order to activate the high concentration source region 1d and the high concentration drain region 1e.

Next, as shown in FIG. 12(d), the contact hole 5 to a data line 31 is formed by the dry etching, such as the reactive etching, the reactive ion beam etching or the like, or the wet etching. Also, contact holes to connect the scanning line 3a and the capacitance line 3b to wiring (not shown) are formed in the second inter-layer insulation film 4 by the same process as the contact hole 5.

Next, as shown in FIG. 13(a), a low resistance metal of Al, a metallic suicide or the like having a light shield property is deposited to be a metallic film 6 at a thickness of about 100 to 700 nm, preferably, about 350 nm on the second inter-layer insulation film 4 by the sputtering method or the like Moreover, as shown in FIG. 13(b), the data line 6a is formed by the photo-lithography process, the etching process and the like.

Next, as shown in FIG. 13(c), so as to cover the data line 6a, for example, the normal pressure or decompression CVD method, the TEOS gas or the like is used to form the third inter-layer insulation film 7 comprising the silicate glass film such as NSG, PSG, BSG, BPSG, the silicon nitride film, the silicon oxide film or the like. A film thickness of the third inter-layer insulation film 7 is desired to be about 500 to 1500 nm, and it is further desired to be about 800 nm.

Next, as shown in FIG. 14(a), in the pixel switching TFT 30, the contact hole 8 for electrically connecting the pixel electrode 9a and the high concentration drain region 1e is formed by the dry etching, such as the reactive etching, the reactive ion beam etching or the like.

Next, as shown FIG. 14(b), a transparent conductive thin film 9, such as ITO or the like, is deposited at a thickness of about 50 to 200 nm on the third inter-layer insulation film 7 by the sputtering process or the like. Moreover, as shown in FIG. 14(c), the pixel electrode 9a is formed by the photo-lithography process, the etching process and the like. By the way, if the liquid crystal device in this embodiment is a reflection type liquid crystal device, the pixel electrode 9a may be made of an opaque material having a high reflectance, such as Al and the like.

In succession, after the coating solution for the alignment film of polyimide system is coated on the pixel electrode 9a, the alignment film 16 (refer to FIG. 8) is formed by carrying out the rubbing process in a predetermined direction so that it has a predetermined pre-tilt angle.

The element substrate 10 is manufactured as mentioned above.

According to the method of manufacturing the element substrate in this embodiment, the substrate main body 10A and the single crystal silicon substrate 202A in which the silicon nitride film or silicon nitride oxide film 204 is formed on the surface thereof are laminated to each other. Thus, the silicon nitride film or silicon nitride oxide film 204 can be positioned at the side closer to the semiconductor layer 1a (TFT 30) than the lamination plane between the substrate main body 10A and the single crystal silicon substrate 202A. Thus, it is possible to almost perfectly prevent the impurities contained in the substrate main body 10A and the impurities absorbed on the lamination plane between the substrate main body 10A and the single crystal silicon substrate 202A from being diffused into the side of the semiconductor layer 1a (TFT 30).

In the element substrate 10 manufactured by the method of manufacturing the element substrate in this embodiment, it is possible to almost perfectly prevent the impurities contained in the substrate main body 10A and the impurities absorbed on the lamination plane between the substrate main body 10A and the single crystal silicon substrate 202A from being diffused into the side of the semiconductor layer 1a (TFT 30). Hence, it is possible to prevent the deterioration in the property of the TFT 30.

Also, in the element substrate 10 manufactured by the method of manufacturing the element substrate in this embodiment, the silicon nitride film or silicon nitride oxide film 204 serving as the minute film of a low transmission rate to the impurity or the oxidizer such as oxygen, water and the like can effectively prevent the oxidizer from being into the first light shield film 11a made of the high melting point metal and the like. At the same time, it can effectively prevent the impurity from being diffused into the semiconductor layer 1a from the first light shield film 11a.

Next, the method of manufacturing the opposite substrate 20 and the method of manufacturing the liquid crystal device from the element substrate 10 and the opposite substrate 20 will be described below.

As for the opposite substrate 20 shown in FIG. 8, the optically transparent substrate such as glass substrate or the like is prepared as the substrate main body 20A. Then, the second light shield film 23 and a second light shield film serving as a later-described peripheral division is formed on the surface of the substrate main body 20A. The second light shield film 23 and the second light shield film serving as the later-described peripheral division are formed via the photolithography process and the etching process after a metallic material, for example, such as Cr, Ni, Al or the like is sputtered. By the way, those second light shield films may be made of materials, such as resin black or the like, in which carbon, Ti or the like is dispersed to a photo resist, in addition to the above-mentioned metallic materials.

After that, a transparent conductive thin film, such as ITO or the like, is deposited at a thickness of about 50 to 200 nm on the entire surface of the substrate main body 20A by the sputtering process or the like. Accordingly, the opposite electrode 21 is formed. Moreover, after the coating solution for alignment film of poly-imide or the like is coated on the entire surface of the opposite electrode 21, the alignment film 22 (refer to FIG. 8) is formed by carrying out the rubbing process in a predetermined direction so that it has a predetermined pre-tilt angle. The opposite substrate 20 is manufactured as mentioned above.

Finally, the opposite substrate 20 and the element substrate 10 manufactured as mentioned above are laminated to each other through the seal member in such a manner that the alignment films 16 and 22 are opposite to each other. Then, a liquid crystal in which, for example, a plurality of kinds of nematic liquid crystals are mixed is sucked into the space between both the substrates by using a vacuum suck method or the like. Then, the liquid crystal layer 50 having a predetermined thickness is formed to accordingly manufacture the liquid crystal device having the above-mentioned structure.

(Whole Configuration of Liquid Crystal Apparatus)

Figure 15:
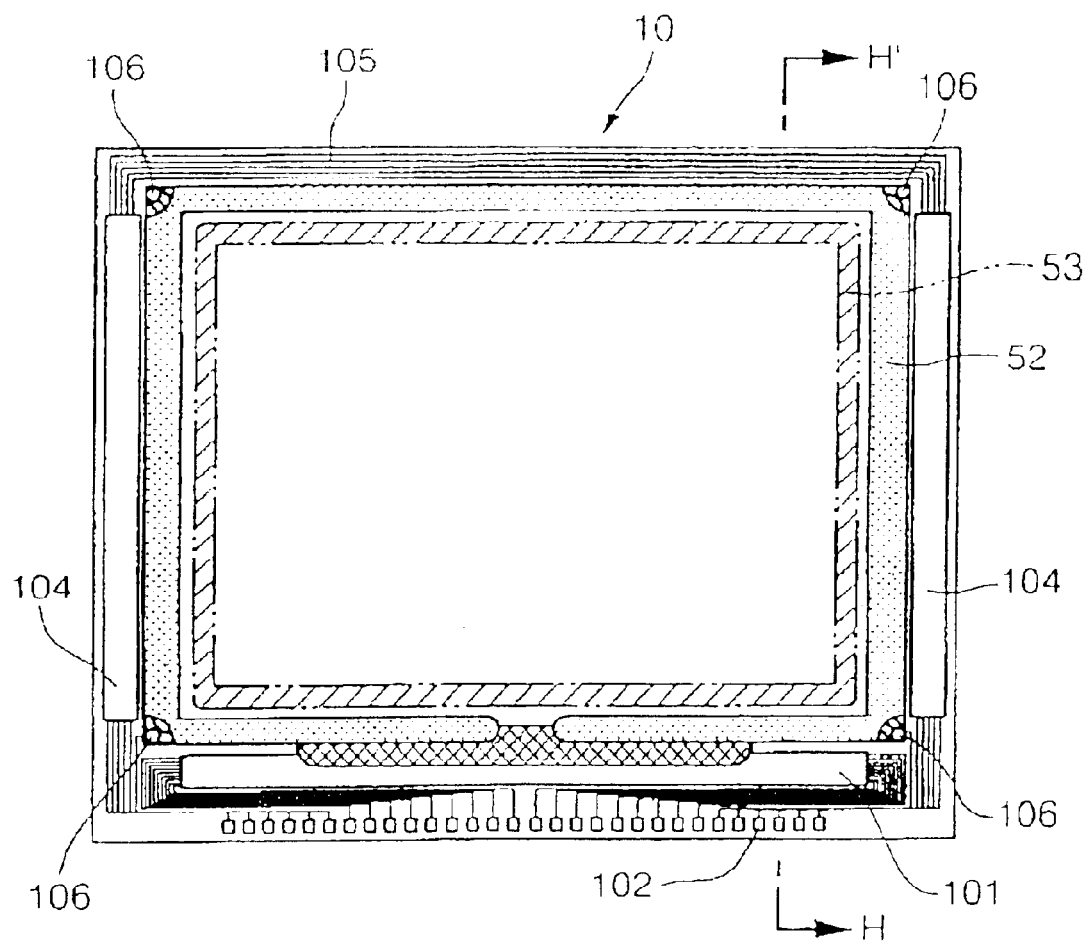
FIG. 15 is a plan view when the element substrate of the electro-optical apparatus of the embodiment according to the present invention is viewed together with various members formed thereon from a side of an opposite substrate.
Figure 16:
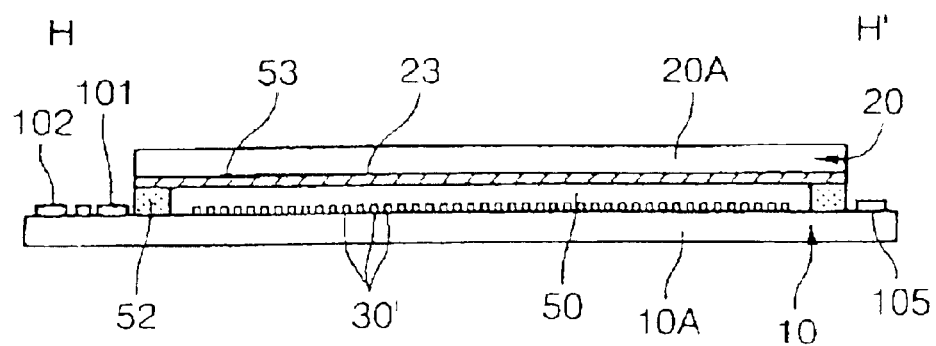
FIG. 16 is a sectional view taken on the line H–H' of FIG. 15.

The whole configuration of the liquid crystal device in this embodiment having the above-mentioned configuration will be described below with reference to FIG. 15 to FIG. 16. FIG. 15 is a plan view when the element substrate 10 is viewed from the side of the opposite substrate 20. FIG. 16 is a sectional view taken on the line H–H' of FIG. 15, including the opposite substrate 20.

In FIG. 15, on the surface of the element substrate 10, a seal member 52 is disposed along the edge of the element substrate 10. As shown in FIG. 16, the opposite substrate 20 having the outline substantially equal to that of the seal member 52 shown in FIG. 15 is fixed to the element substrate 10 by the seal member 52.

As shown in FIG. 15, a second light shield film 53 serving as a peripheral division or a frame, for example, made of the material equal to or different from that of the second light shield film 23 is formed on the surface of the opposite substrate 20, in parallel to the inside of the seal member 52.

In the element substrate 10, a data line drive circuit 101 and a mount terminal 102 are disposed along one side of the element substrate 10, in a region outside the seal member 52. Scanning line drive circuits 104 are disposed along two sides adjacent to this one side. If the delay of the scanning signal sent to the scanning line 3a does not lead to any trouble, it is naturally allowable that the scanning line drive circuit 14 is disposed only on one side.

Also, the data line drive circuits 101 may be arranged on both the sides along the side of the image display region (the pixel portion) For example, it maybe designed such that the data lines 6a of odd-numbered columns send the image signals from the data line drive circuits disposed along one side of the image display region, and the data lines 6a of even-numbered columns send the image signals from the data line drive circuits disposed along the side opposite to the image display region. If the data lines 6a are driven in a comb-teeth manner as mentioned above, an occupation area for the data line drive circuit can be expanded to thereby design a complex circuit.

Moreover, a plurality of wirings 105 for the linkage between the scanning line drive circuits disposed on both the sides of the image display region are laid on the remaining one side of the element substrate 10. Moreover, a pre-charge circuit may be disposed secretly under the second light shield film 53 serving as the peripheral division. Also, a conductive material 106 for establishing an electrical conduction between the element substrate 10 and the opposite substrate 20 is disposed in at least one corner between the element substrate 10 and the opposite substrate 20.

An inspection circuit for inspecting a quality, a defect and the like of the liquid crystal device during the manufacturing process or at a time of a shipment may be formed on the surface of the element substrate 10. Instead of the formation of the data line drive circuits 101 and the scanning line drive circuits 104 on the surface of the element substrate 10, for example, a drive LSI mounted on TAB (Tape Automated Bonding substrate) may be electrically mechanically connected through anisotropic conductive film formed in the peripheral region of the element substrate 10.

Also, a polarization film, a retardation film, a polarizing unit and the like are arranged in predetermined directions on a side to which a light from the opposite substrate 20 is inputted and a side from which a light from the element substrate 10 is outputted, respectively, for example, on the basis of the operational modes, such as a TN (Twisted Nematic) mode, an STN (Super Twisted Nematic) mode, a D-STN (Dual Scan—STN) mode, a VA (Vertically Aligned) mode, a PDLC (Polymer Dispersed Liquid Crystal) mode and the like, and a normally white mode/normally black mode.

If the liquid crystal device in this embodiment is applied to a color liquid crystal projector (the projection type display device), three liquid crystal devices are used as light valves for R, G and B, respectively. So, the respective color lights decomposed through the dichroic mirrors for the respective R, B and G colors are inputted as the projection lights to the respective panels, respectively. Thus, in this case, a color filter is not mounted on the opposite substrate 20, as shown in the above-mentioned embodiment.

However, on the surface of the side of the liquid crystal layer 50 of the substrate main body 20A of the opposite substrate 20, the RGB color filters may be formed together with their protection films in the predetermined region opposite to the pixel electrode 9a on which the second light shield film 23 is not formed. Such configuration enables the liquid crystal device of the above-mentioned embodiment to be applied to a color liquid crystal device of a direct view type or reflection type of a color liquid crystal television or the like, besides the liquid crystal projector.

Moreover, micro lenses may be formed on the surface of the opposite substrate 20 such that one micro lens corresponds to one pixel. Such a configuration can improve the light collection efficiency of the input light to thereby attain a bright liquid crystal device. Furthermore, an interference layer composed of several layers whose refractive indexes are different from each other may be disposed on the surface of the opposite substrate 20. Then, the dichroic filters are formed which produce the RGB colors by virtue of the interference between the lights. This opposite substrate with the dichroic filter can attain the brighter color liquid crystal device.

By the way, the liquid crystal device in this embodiment is designed such that the input light is inputted from the side of the opposite substrate 20. However, since it is configured to have the first light shield film 11*a* on the element substrate 10, it is allowable to input the input light from the side of the element substrate 10 and then output from the side of the opposite substrate 20. That is, even if the liquid crystal device is attached to the liquid crystal projector as mentioned above, it is possible to prevent the lights from being inputted to the channel region 1*a*' and the LDD regions 1*b* and 1*c* of the semiconductor layer 1*a*. Thus, it is possible to display the picture of the high picture quality.

Also, the liquid crystal device in this embodiment has the element substrate 10 manufactured by the method of manufacturing the element substrate in the embodiment. Thus, it is possible to almost perfectly prevent the impurities contained in the substrate main body 10A and the impurities absorbed on the lamination plane between the substrate main body 10A and the single crystal silicon substrate 202A from being diffused into the side of the semiconductor layer 1*a* (TFT 30). Hence, the deterioration in the property of the TFT (transistor element) 30 can be prevented to accordingly provide the excellent performance.

In particular, in the liquid crystal device in this embodiment, the silicon nitride film or silicon nitride oxide film 204 can effectively prevent the oxidizer from being diffused into the first light shield film 11*a*. At the same time, it can effectively prevent the impurities from being diffused into the semiconductor layer 1*a* from the first light shield film 11*a*. Thus, the light shield performance against the return light can be kept at a high level for a long time. Hence, it is possible to maintain the property of the TFT 30.

(Electronic Equipment)

As an example of an electronic equipment using the liquid crystal device (the electro-optical apparatus) in the above-mentioned embodiment, the configuration of the projection type display device will be described below with reference to FIG. 17.

Figure 17:
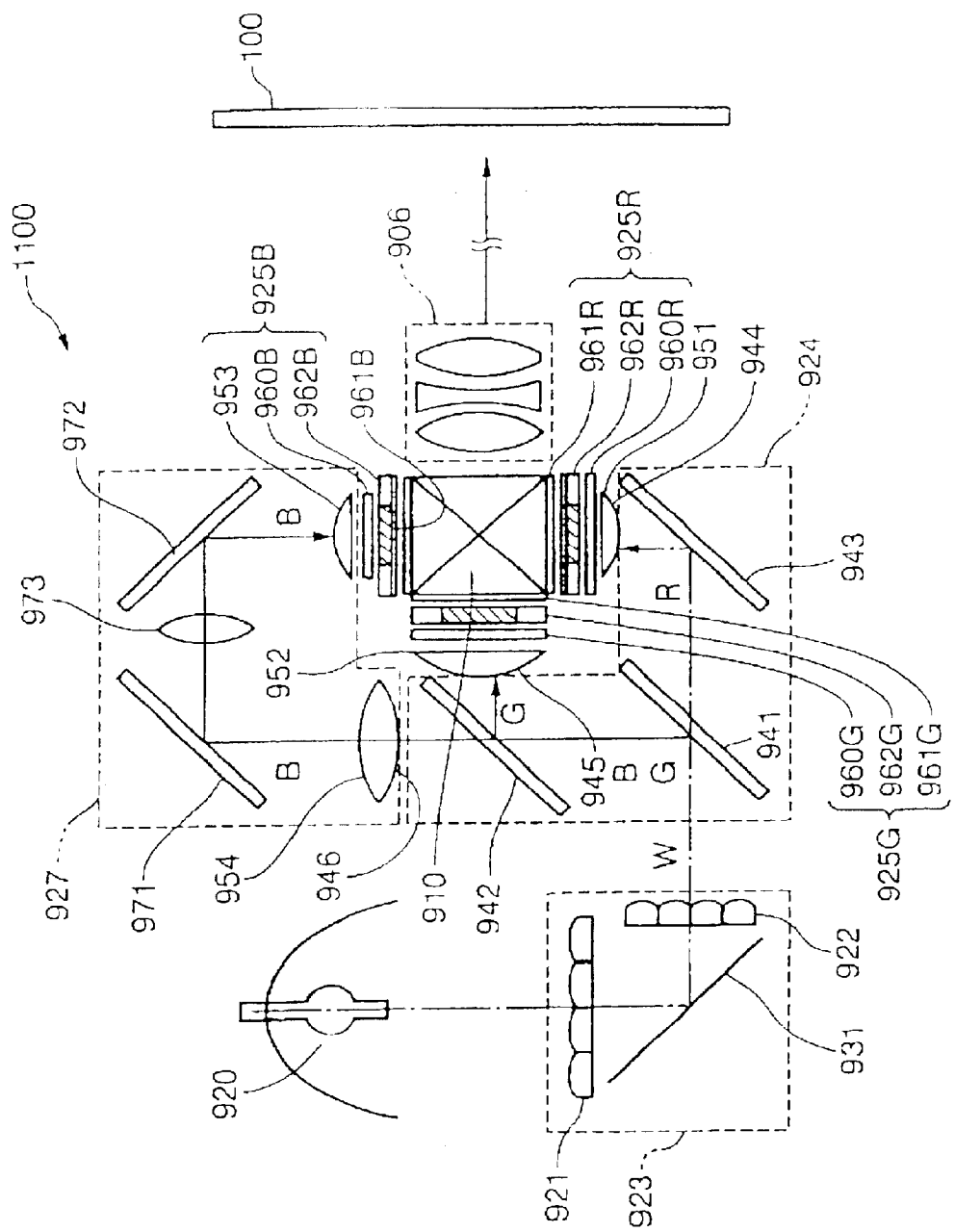
FIG. 17 is a configuration view of a projection type display that is an example of an electronic equipment using the electro-optical apparatus of the embodiment according to the present invention.

FIG. 17 shows a schematic configuration view of an optical system of a projection type liquid crystal device in which a projection type display device 1100 has three liquid crystal devices of the above-mentioned embodiment, and they are used as liquid crystal devices 962R, 962G and 962B for R, G and B, respectively.

The optical system of the projection type display in this example employs a light source device 920 and a regularly illuminating optical system 923. Then, the projection type display is provided with: a color separating optical system 924 as one example of a color separating device for separating a light flux W outputted from the regularly illuminating optical system 923 into red (R), green (G) and blue (B); three light valves 925R, 925G and 925B as examples of light modulating devices for modulating the respective color fluxes R, G and B; a color synthesizing prism 910 as one example of a color synthesizing device for again synthesizing the color flux after the modulation; and a projection lens unit 906 as one example of a projecting deviceu for enlarging and projecting the synthesized light flux onto a surface of a projection plane 100. Also, it is provided with a light guiding system 927 for guiding the blue light flux B to the corresponding light valve 925B.

The regularly illuminating optical system 923 contains two lens plates 921 and 922 and a reflection mirror 931. The two lens plates 921 and 922 are orthogonal to each other while facing each other with the reflection mirror 931 therebetween. Each of the two lens plates 921 and 922 in the regularly illuminating optical system 923 has a plurality of rectangular lenses arranged in a form of matrix. The light flux outputted from the light source device 920 is divided into a plurality of partial light fluxes by the rectangular lenses of the first lens plate 921. Then, those partial light fluxes are superimposed on each other near the three light valves 925R, 925G and 925B by the rectangular lenses of the second lens plate 922. Thus, the usage of the regularly illuminating optical system 923 enables the three light valves 925R, 925G and 925B to be illuminated at the regular illumination lights, even if the light source device 920 has an irregular illuminance distribution within the section of the output light flux.

The color separating optical system 924 has a blue green reflection dichroic mirror 941, a green reflection dichroic mirror 942 and a reflection mirror 943. At first, the blue light flux B and the green light flux G which are included in the light flux W are reflected at a right angle by the blue green reflection dichroic mirror 941, and they are directed to the side of the green reflection dichroic mirror 942. The red light flux R is passed through this mirror 941, reflected at a right angle by the rear reflection mirror 943, and outputted to the side of a prism unit 910 from an output portion 944 of the red light flux R.

Next, only the green light flux G among the blue and green light fluxes B and G reflected by the blue green reflection dichroic mirror 941 is reflected at a right angle by the green reflection dichroic mirror 942, and it is outputted to the side of the color synthesizing optical system from an output portion 945 of the green light flux G.

The blue light flux B passed through the green reflection dichroic mirror 942 is outputted to the side of the light guiding system 927 from an output portion 946 of the blue light flux B. This example is designed such that the distances from the output unit of the light flux W of regularly illuminating optical elements to the output units 944, 945 and 946 of the respective color light fluxes in the color separating optical system 924 are substantially equal to each other.

Collection lenses 951 and 952 are mounted on the output sides of the output units 944 and 945 of the red and green light fluxes R and G in the color separating optical system 924, respectively. Thus, the red and green light fluxes R and G outputted from the respective output portions 944 and 945 are inputted into those collection lenses 951 and 952, and paralleled through them respectively.

The thus-paralleled red and green light fluxes R and G are inputted into the light valves 925R and 925G, and modulated through them respectively. Then, the image information corresponding to the respective color lights are added thereto. That is, the switching controls based on the image information are performed on those liquid crystal devices by drivers (not shown). Accordingly, the respective color lights passed through them are modulated. On the other hand, the blue light flux B is guided through the light guiding system 927 into the corresponding light valve 925B. Here, the modulation based on the picture information is similarly done. By the way, the light valves 925R, 925G and 925B in this example are the liquid crystal light valves, which are respectively further composed of input side polarizing units 960R, 960G and 960B, output side polarizing units 961R, 961G and 961B, and liquid crystal devices 962R, 962G and 962B that are put between them.

The light guiding system 927 has a collection lens 954 placed on the output side of the output unit 946 for the blue light flux B., an input side reflection mirror 971, an output side reflection mirror 972, a middle lens 973 placed between those reflection mirrors, and a collection lens placed in front of the light valve 925B. The blue light flux B outputted from the collection lens 946 is guided through the light guiding system 927 into the liquid crystal device 962B, and modulated through it. As for the light path lengths of the respective color light fluxes, namely, the distances from the output portions of the light flux W to the respective liquid crystal devices 962R, 962G and 962B, the blue light flux B has the longest distance. Thus, the blue light flux has the maximum light amount loss. However, the existence of the light guiding system 927 enables the light amount loss to be reduced.

The respective color light fluxes R, G and. B modulated through the respective light valves 925R, 925G and 925B are inputted to the color synthesizing prism 910, and synthesized by it. Then, the light synthesized by this color synthesizing prism 910 is enlarged and projected onto the surface of the projection plane 100 located at a predetermined position through the projection lens unit 906.

The projection type display 100 having the above-mentioned structure has the liquid crystal device in the above-mentioned embodiment. Thus, this can prevent the deterioration in the property of the TFT (transistor element) and have the excellent performance.

(Semiconductor Device)

Next, embodiments of the semiconductor device of the present invention will be explained below with reference to FIG. 22 to FIG. 27. Here, FIG. 22 and FIG. 24 to FIG. 27 are plan views respectively showing various examples of the semiconductor device of the present invention. FIG. 23 is a sectional view showing the double gate structure sandwiching the channel region in the upper and lower direction of the inverter circuit shown in FIG. 22.

The semiconductor device of the present embodiment is constructed such that the transistor element is formed on the SOI substrate. Similarly to the case of the SOI substrate shown in FIG. 1, the semiconductor device of the present embodiment is provided with the support substrate and the single crystal silicon layer, and is constructed such that the insulation portion having the single layered or multiple-layered structure is formed between the support substrate and the single crystal silicon layer. In particular, in addition to such a structure, the present embodiment is provided with an electrically conductive member, which functions as a gate electrode or a gate line, at one side of the insulation portion facing to the support substrate (i.e., the opposite side of the single crystal silicon layer). This insulation portion functions as a gate insulation film.

Figure 22:
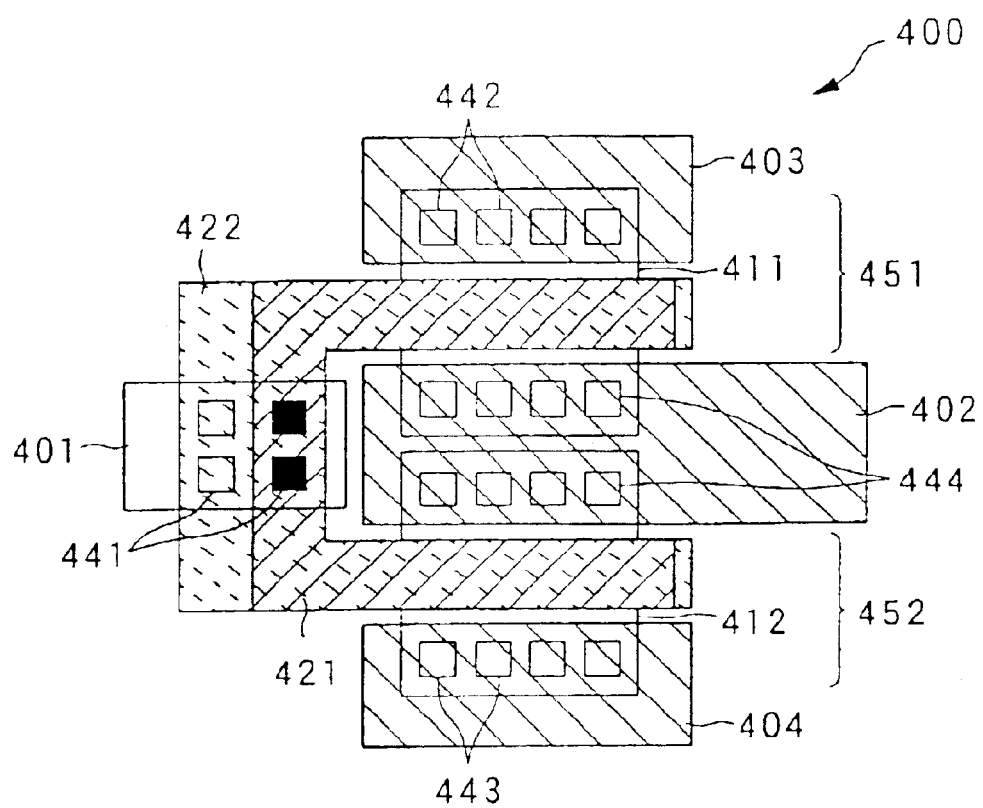
FIG. 22 is a plan view showing an inverter circuit having a double gate structure as one example of a semiconductor device of the embodiment.
Figure 23:
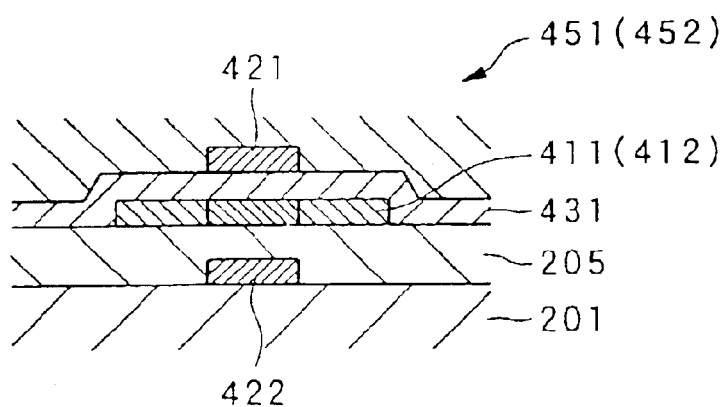
FIG. 23 is a sectional view showing the double gate structure sandwiching a channel region of a semiconductor layer in the upper and lower direction of the inverter circuit of FIG. 22.

In FIG. 22, an inverter circuit 400 has a three-dimensionally double gate structure. The inverter circuit 400 is provided with an input line 401, an output line 402, a VDD electric potential line (i.e., a high potential line) 403 and a VSS electric potential line (i.e., a low potential line) 404, which are all formed of a same electrically conductive layer (e.g., an Al layer). Further, as a semiconductor layer, the inverter circuit 400 is provided with a P channel region 411 and an N channel region 412 formed of a single crystal silicon layer in the SOI structure. An upper side gate electrode 421 is formed through a gate insulation film above the P channel region 411 and the N channel region 412. A lower side gate electrode 422 is formed through a gate insulation film below the P channel region 411 and the N channel region 412.

Namely, as shown in FIG. 23, the lower side gate electrode 422 is formed of a film including metal of high melting point, such as a single substance of WSi (Tungsten Silicide) or a ploy-silicon etc., or a lamination structure thereof for example, on the support substrate 201. Above the lower side gate electrode 422, the P channel region 411 and the N channel region 412 are layered through the insulation portion 205, so that one portion of the insulation portion 205 functions as the gate insulation film. On the other hand, above the P channel region 411 and the N channel region 412, the upper side gate electrode 421 is formed of WSi for example, through the gate insulation film 431. The upper side gate electrode 421 and the lower side gate electrode 422 are connected to the common input line 401 through the contact holes 441. To the source of the P channel type TFT 451, the VDD electric potential line 403 is connected through the contact holes 442. To the source of the N channel type TFT 452, the VSS electric potential line 404 is connected through the contact holes 443. The drains of the P channel type TFT 451 and the N channel type TFT 452 are respectively connected to the common output line 402 through the contact holes 444. In this manner, the inverter circuit 400, in which the P channel type TFT 451 and the N channel type TFT 452 are combined, is constructed. According to the inverter circuit 400 of the present embodiment, it is possible to almost perfectly prevent the impurities contained in the support substrate 201 and the impurities absorbed on the lamination plane of the support substrate 201 from being diffused toward the TFT, by virtue of the insulation portion 205. Thus, it is possible to effectively prevent the performance of the TFT from being deteriorated. Further, the diffusion of the impurities toward the semiconductor layer from the lower side gate electrode 422 as one example of the electrically conductive member can be also effectively prevented, by virtue of the insulation portion 205. In addition, the lower side gate electrode 422 functions as the light shielding film, so that the generation of the light leak current in the TFT can be effectively prevented.

Figure 24:
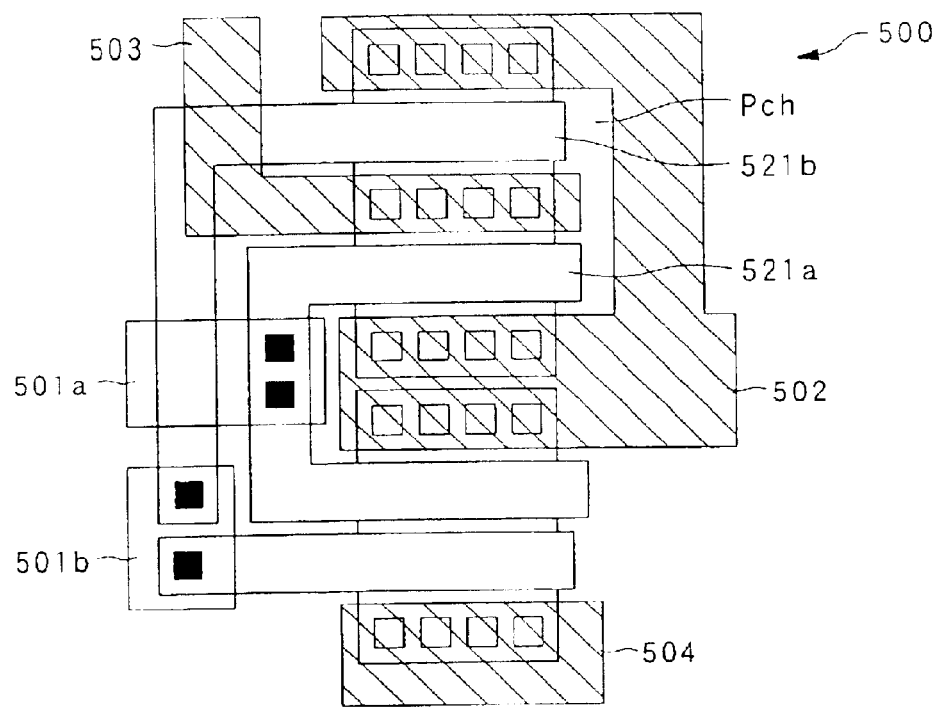
FIG. 24 is a plan view showing a NAND circuit as another example of the semiconductor device of the embodiment.

In FIG. 24, a NAND circuit 500 is provided with input lines 501a and 501b, an output line 502, a VDD electric potential line 503 and a VSS electric potential line 504, which are all formed of a same Al layer for example. Similarly to the case of the inverter circuit 400 shown in FIG. 23, the lamination structure of the NAND circuit 500 is such that the semiconductor layer is laminated above the support substrate through the insulation portion, and that upper side gate electrodes 521a and 521b are formed of WSi for example, though the gate insulation film on the semiconductor layer. According to the NAND circuit 500 of the present embodiment, it is possible to almost perfectly prevent the impurities contained in the support substrate and the impurities absorbed on the lamination plane of the support substrate from being diffused toward the TFT, by virtue of the insulation portion. Thus, it is possible to effectively prevent the performance of the TFT from being deteriorated.

Figure 25:
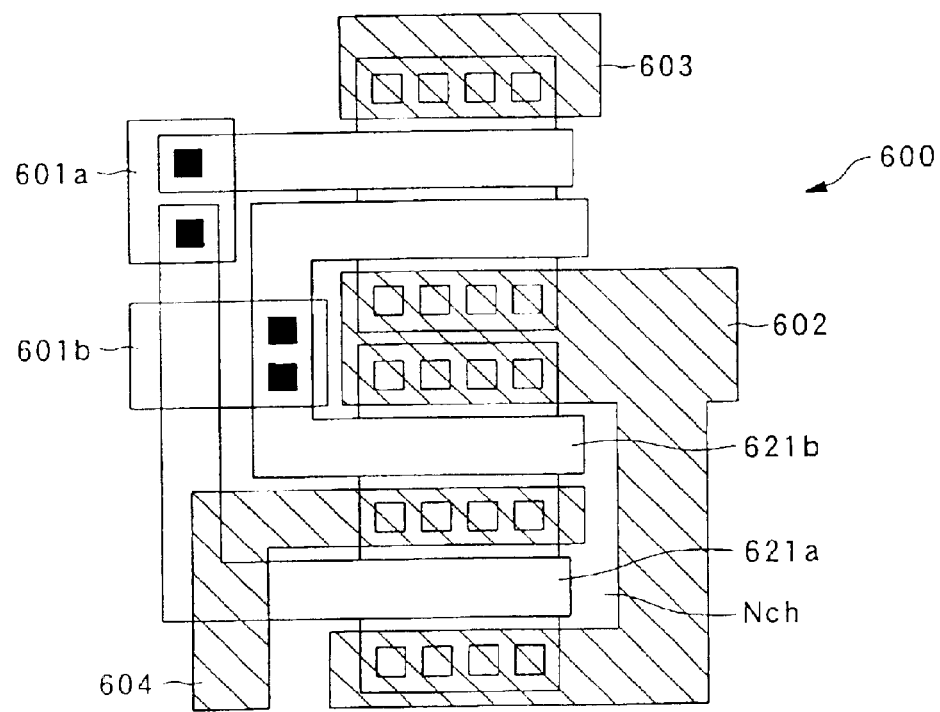
FIG. 25 is a plan view showing a NOR circuit as another example of the semiconductor device of the embodiment.

In FIG. 25, a NOR circuit 600 is provided with input lines 601a and 601b, an output line 602, a VDD electric potential line 603 and a VSS electric potential line 604, which are all formed of a same Al layer for example. Similarly to the case of the inverter circuit 400 shown in FIG. 23, the lamination structure of the NOR circuit 600 is such that the semiconductor layer is laminated above the support substrate through the insulation portion, and that upper side gate electrodes 621a and 621b are formed of WSi for example, though the gate insulation film on the semiconductor layer. According to the NOR circuit 600 of the present embodiment, it is possible to almost perfectly prevent the impurities contained in the support substrate and the impurities absorbed on the lamination plane of the support substrate from being diffused toward the TFT, by virtue of the insulation portion. Thus, it is possible to effectively prevent the performance of the TFT from being deteriorated.

Figure 26:
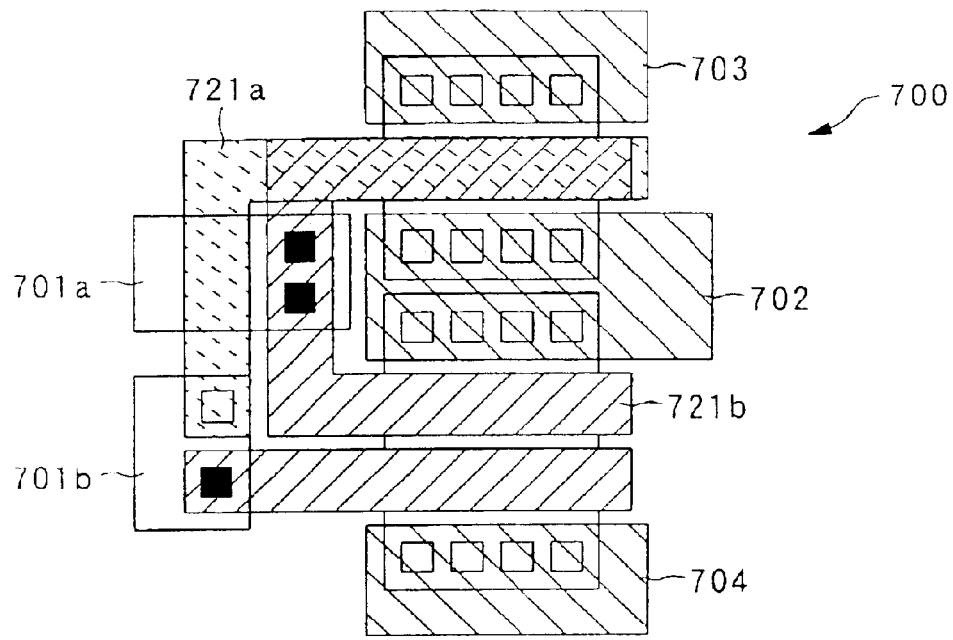
FIG. 26 is a plan view showing a NAND circuit having a double gate structure as another example of the semiconductor device of the embodiment.

In FIG. 26, a NAND circuit 700 has a three-dimensionally double gate structure. The NAND circuit 700 is provided with input lines 701a and 701b, an output line 702, a VDD electric potential line 703 and a VSS electric potential line 704, which are all formed of a same Al layer for example. Similarly to the case of the inverter circuit 400 shown in FIG. 23, the lamination structure of the NAND circuit 700 is such that the lower side gate electrode 721a is formed on the support substrate. Above the lower side gate electrode 721a, the semiconductor layer is laminated through the insulation portion, one portion of which functions as the gate insulation film. On the other hand, above the semiconductor layer, the upper side gate electrode 721b is formed through the gate insulation film. According to the NAND circuit 700 of the present embodiment having the double gate structure, it is possible to almost perfectly prevent the impurities contained in the support substrate and the impurities absorbed on the lamination plane of the support substrate from being diffused toward the TFT, by virtue of the insulation portion. Thus, it is possible to effectively prevent the performance of the TFT from being deteriorated. Further, the diffusion of the impurities toward the semiconductor layer from the lower side gate electrode 721a as one example of the electrically conductive member can be also effectively prevented, by virtue of the insulation portion. In addition, the lower side gate electrode 721a functions as the light shielding film, so that the generation of the light leak current in the TFT can be effectively prevented. In particular, the NAND circuit 700 has such a merit that, as compared with the NAND circuit 500 of FIG. 24, the area occupied by the circuit can be reduced.

Figure 27:
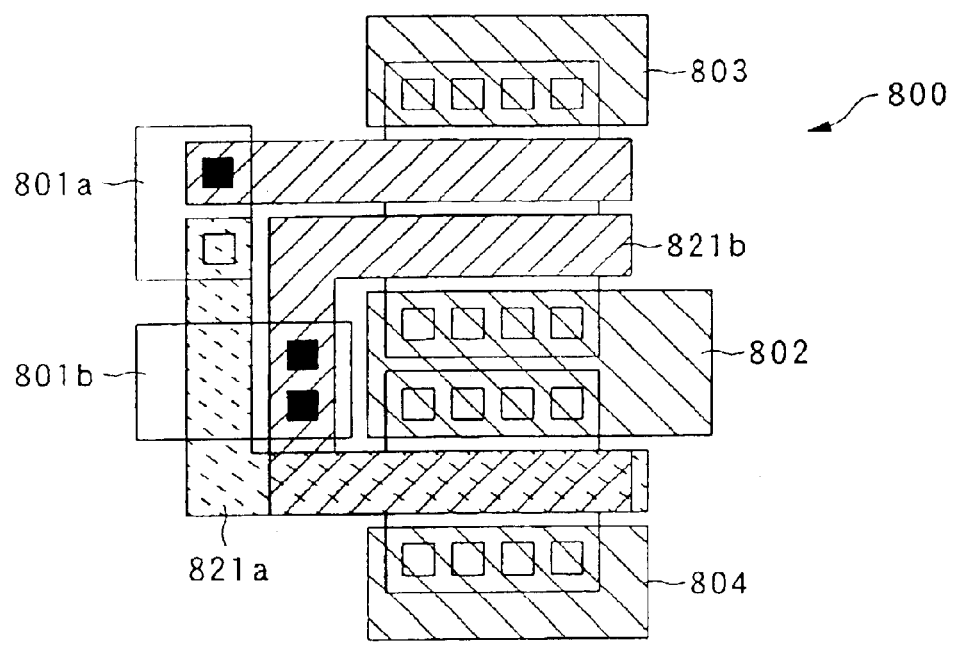
FIG. 27 is a plan view showing a NOR circuit having a double gate structure as another example of the semiconductor device of the embodiment.

In FIG. 27, a NOR circuit 800 has a three-dimensionally double gate structure. The NOR circuit 800 is provided with input lines 801a and 801b, an output line 802, a VDD electric potential line 803 and a VSS electric potential line 804, which are all formed of a same Al layer for example. Similarly to the case of the inverter circuit 400 shown in FIG. 23, the lamination structure of the NOR circuit 800 is such that the lower side gate electrode 821a is formed on the support substrate. Above the lower side gate electrode 821a, the semiconductor layer is laminated through the insulation portion, one portion of which functions as the gate insulation film. On the other hand, above the semiconductor layer, the upper side gate electrode 821b is formed through the gate insulation film. According to the NOR circuit 800 of the present embodiment having the double gate structure, it is possible to almost perfectly prevent the impurities contained in the support substrate and the impurities absorbed on the lamination plane of the support substrate from being diffused toward the TFT, by virtue of the insulation portion. Thus, it is possible to effectively prevent the performance of the TFT from being deteriorated. Further, the diffusion of the impurities toward the semiconductor layer from the lower side gate electrode 821a as one example of the electrically conductive member can be also effectively prevented, by virtue of the insulation portion. In addition, the lower side gate electrode 821a functions as the light shielding film, so that the generation of the light leak current in the TFT can be effectively prevented. In particular, the NOR circuit 800 has such a merit that, as compared with the NOR circuit 600 of FIG. 25, the area occupied by the circuit can be reduced.

As mentioned above, this embodiment is configured such that the insulation portion containing at least the silicon nitride film or silicon nitride oxide film is formed between the support substrate and the single crystal silicon layer. Thus, the SOI substrate can be provided in which it is possible to almost perfectly prevent the impurities contained in the support substrate from being diffused into the side of the single crystal silicon layer.

Also, it is possible to provide the method of manufacturing the SOI substrate, in which after the silicon nitride film or silicon nitride oxide film is formed on the side of the single crystal silicon layer, the single crystal silicon layer and the support substrate are laminated to each other, and it is accordingly possible to almost perfectly prevent the impurities contained in the support substrate and the impurities absorbed on the lamination plane between the support substrate and the single crystal silicon substrate from being diffused into the side of the single crystal silicon layer.

Also, the SOI substrate in this embodiment can be used to manufacture the element substrate, so that, in the element substrate in this embodiment, it is possible to prevent the impurities contained in the support substrate and the impurities absorbed on the lamination plane between the support substrate and the single crystal silicon substrate from giving the harmful influence onto the transistor element, and accordingly possible to prevent the deterioration in the property of the transistor element.

Moreover, the formation of the element substrate in this embodiment can prevent the deterioration in the property of the transistor element, so that it is possible to provide the electro-optical apparatus and the electronic equipment, which have the excellent performance.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosures of Japanese Patent Applications No.2000-365714 filed on Nov. 30, 2000, No.2001-190521 filed on Jun. 22, 2001 and No.2001-292645 filed on Sep. 25, 2001 including the specification, claims, drawings and summary are incorporated herein by reference in its entirety.

What is claimed is:

1. An electro-optical apparatus comprising:

a support substrate;

a pixel electrode disposed above said support substrate;

a transistor element disposed above said support substrate, electrically connected to said pixel electrode and comprising a semiconductor layer including a channel region;

a wiring disposed above said support substrate and connected to said transistor element;

a light shield film disposed above said support substrate for covering at least the channel region, said light shield film being located on a side of said support substrate; and an insulation portion disposed at an interlayer space between said light shield film and said semiconductor layer, and including a silicon nitride film or silicon nitride oxide film, wherein another insulation portion including the silicon nitride film or silicon nitride oxide film is disposed at an interlayer space between said support substrate and said light shield film.

2. An electro-optical apparatus according to claim 1, wherein said insulation portion has a multiple-layered structure.

3. An electro-optical apparatus according to claim 2, wherein said multiple-layered structure includes: the silicon nitride film or silicon nitride oxide film; and a silicon oxide film formed on an upper surface or bottom surface of the silicon nitride film or silicon nitride oxide film.

4. An electro-optical apparatus according to claim 1, wherein said semiconductor layer has an SOI structure comprising a single crystal silicon film.

5. An electro-optical apparatus according to claim 1, wherein a total layer thickness of the silicon nitride film or silicon nitride oxide film of said insulation portion is not greater than 100 nm.

6. An electro-optical apparatus according to claim 1, further comprising:

an opposite substrate opposed to said support substrate; and an electro-optical material layer interposed between said support substrate and said opposite substrate.

7. An electro-optical apparatus comprising:

a support substrate;

a pixel electrode disposed above said support substrate;

a transistor element disposed above said support substrate, electrically connected to said pixel electrode and comprising a semiconductor layer including a channel region;

a wiring disposed above said support substrate and connected to said transistor element;

a light shield film disposed above said support substrate for covering at least the channel region, said light shield film being located on a side of said support substrate; and an insulation portion disposed at an interlayer space between said light shield film and said semiconductor layer, and including a silicon nitride film or silicon nitride oxide film, wherein an edge of said insulation portion includes an area within 2 µm from an edge of said light shield film.

8. An electro-optical apparatus comprising:

a support substrate;

a pixel electrode disposed above said support substrate;

a transistor element disposed above said support substrate, electrically connected to said pixel electrode and comprising a semiconductor layer including a channel region;

a wiring disposed above said support substrate and connected to said transistor element;

a light shield film disposed above said support substrate for covering at least the channel region, said light shield film being located on a side of said support substrate; and an insulation portion disposed at an interlayer space between said light shield film and said semiconductor layer, and including a silicon nitride film or silicon nitride oxide film, wherein an edge of said insulation portion is self-aligned with an edge of said light shield film.

9. An electronic equipment comprising an electro-optical apparatus, said electro-optical apparatus comprising:

a support substrate;

a pixel electrode disposed above said support substrate;

a transistor element disposed above said support substrate, electrically connected to said pixel electrode and comprising a semiconductor layer including a channel region;

a wiring disposed above said support substrate and connected to said transistor element;

a light shield film disposed above said support substrate for covering at least the channel region, said light shield film being located on a side of said support substrate; and an insulation portion disposed at an interlayer space between said light shield film and said semiconductor layer, and including a silicon nitride film or silicon nitride oxide film, wherein another insulation portion including the silicon nitride film or silicon nitride oxide film is disposed at an interlayer space between said support substrate and said light shield film.

10. An electro-optical apparatus comprising:

a support substrate;

a pixel electrode disposed above said support substrate;

a transistor element disposed above said support substrate, electrically connected to said pixel electrode and comprising a semiconductor layer including a channel region;

a wiring disposed above said support substrate and connected to said transistor element;

a light shield film disposed above said support substrate for covering at least the channel region, said light shield film being located on a side of said support substrate; and an insulation portion disposed at an interlayer space between said light shield film and said semiconductor layer, and including a silicon nitride film or silicon nitride oxide film, wherein said semiconductor layer has an SOI structure comprising a single crystal silicon film, and said SOI structure is obtained by laminating the support substrate and a single crystal silicon substrate thicker than said single crystal silicon film, via a silicon oxide film that is formed on at least one of (i) a surface of the support substrate and (ii) a surface of the single crystal silicon substrate.

* * * * *